(12) United States Patent
Hattori et al.

(10) Patent No.: US 6,894,347 B2
(45) Date of Patent: May 17, 2005

(54) POWER SEMICONDUCTOR ELEMENT CAPABLE OF IMPROVING SHORT CIRCUIT WITHSTAND CAPABILITY WHILE MAINTAINING LOW ON-VOLTAGE AND METHOD OF FABRICATING THE SAME

(75) Inventors: Hidetaka Hattori, Yokohama (JP); Masakazu Yamaguchi, Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 10/696,040

(22) Filed: Oct. 30, 2003

(65) Prior Publication Data

US 2004/0089886 A1 May 13, 2004

Related U.S. Application Data

(62) Division of application No. 10/294,583, filed on Nov. 15, 2002, now Pat. No. 6,670,658, which is a division of application No. 09/799,026, filed on Mar. 6, 2001, now Pat. No. 6,495,871.

(30) Foreign Application Priority Data

Mar. 6, 2000 (JP) ........................................ 2000-060480

(51) Int. Cl.$^7$ ............................................. H01L 21/08
(52) U.S. Cl. ....................... 257/330; 257/139; 257/332; 257/335
(58) Field of Search ................................ 257/139, 330, 257/332, 335; 438/238

(56) References Cited

U.S. PATENT DOCUMENTS

| 5,895,939 | A | | 4/1999 | Ueno | |
|---|---|---|---|---|---|
| 6,001,678 | A | * | 12/1999 | Takahashi | 438/238 |
| 6,060,731 | A | * | 5/2000 | Murata et al. | 257/139 |
| 6,380,586 | B1 | * | 4/2002 | Yoshikawa | 257/330 |
| 6,501,128 | B1 | * | 12/2002 | Otsuki | 257/330 |

FOREIGN PATENT DOCUMENTS

JP 9-36359 2/1997

* cited by examiner

*Primary Examiner*—David Nelms
*Assistant Examiner*—Dao H. Nguyen
(74) *Attorney, Agent, or Firm*—Oblon, Spivak, McClelland, Maier & Neustadt, P.C.

(57) ABSTRACT

A semiconductor element including a first base layer of a first conductivity type; a second base layer of a second conductivity type formed selectively in one surface region of the first base layer; an emitter layer or a source layer of the first conductivity type formed selectively in a surface region of the second base layer; and a gate electrode formed on that portion of the second base layer which is positioned between the emitter layer or source layer and the first base layer with a gate insulating film interposed between the gate electrode and the second base layer. A channel region is formed in contact with the gate insulating film to permit a carrier to migrate between the emitter layer or source layer and the first base layer. The channel region has an impurity concentration profile such that the impurity concentration is substantially constant along the gate insulating film and in the direction in which the emitter layer or source layer, the second base layer and the first base layer are formed.

12 Claims, 40 Drawing Sheets

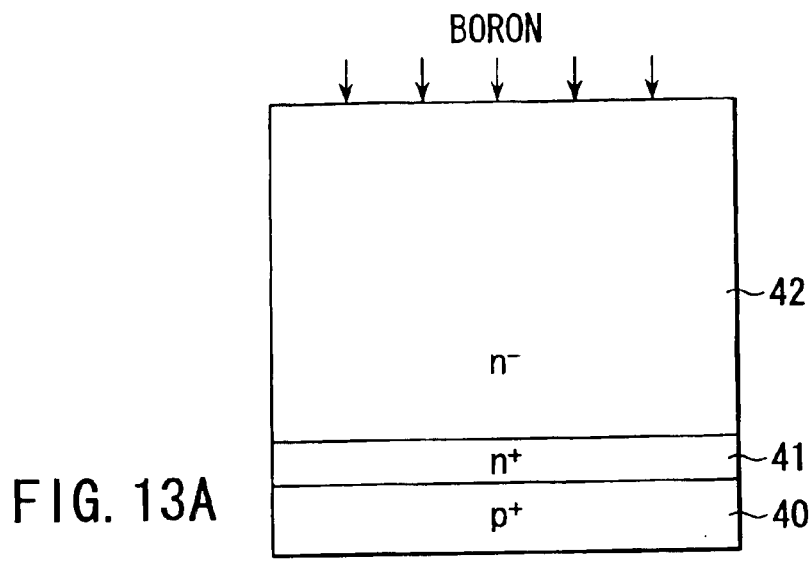
FIG. 13A
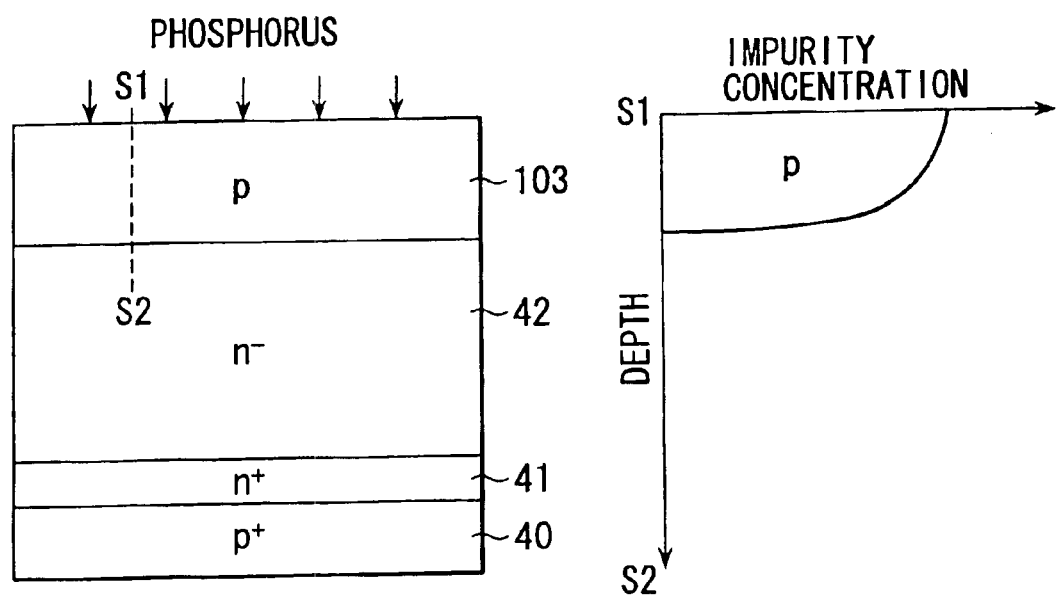
FIG. 13B
FIG. 13C

POWER SEMICONDUCTOR ELEMENT CAPABLE OF IMPROVING SHORT CIRCUIT WITHSTAND CAPABILITY WHILE MAINTAINING LOW ON-VOLTAGE AND METHOD OF FABRICATING THE SAME

CROSS-REFERENCE TO RELATED APPLICATIONS

This application is a divisional of application Ser. No. 10/294,583 filed Nov. 15, 2002, now U.S. Pat. No. 6,670,658, which is a divisional of application Ser. No. 09/799,026, filed Mar. 6, 2001, now U.S. Pat. No. 6,495,871.

This application is based upon and claims the benefit of priority from the prior Japanese Patent Application No. 2000-060480, filed Mar. 6, 2000, the entire contents of which are incorporated herein by reference.

BACKGROUND OF THE INVENTION

The present invention relates to a power semiconductor element including a MOSFET (Metal Oxide Semiconductor Field Effect Transistor) used in a power inverter and a method of fabricating the same, particularly, to an element structure capable of improving the short circuit withstand capability and a method of fabricating the same. The present invention is applied to, for example, an IGBT (Insulated Gate Bipolar Transistor) a power MOSFET, a MCT (MOS Controlled Thyristor), and an IEGT (Injection Enhanced Gate Transistor).

In recent years, the power source apparatus used in the field of the power electronics is required to be miniaturized and to exhibit a high performance. Therefore, in the power semiconductor element (switching element), vigorous efforts are being made in an attempt to improve the performance of the power source apparatus in respect of the improvements in the breakdown voltage, in the adaptability for the large current, in the reduction of the loss, in the withstand capability to the breakdown, and in the operating speed. Particularly, a power IBGT excellent in the breakdown voltage and in the adaptability for the large current and capable of obtaining an ON-voltage lower than that of the power MOSFET is widely used as a power semiconductor element having a breakdown voltage not lower than about 300 V.

The power IGBT is an element that is driven by a MOS gate. Widely known to the art are two kinds of the power IGBT, i.e., a power IGBT of a planar structure, in which a MOS gate is formed in the shape of a flat plate, and a power IGBT of a trench structure, in which the MOS gate is buried inside a trench.

The trench IGBT has a trench-gate structure in which a large number of trench IGBT cells each including a channel region formed of the trench side wall are arranged on a semiconductor substrate. In general, the trench IGBT is said to be advantageous over the planar IGBT in that the trench IGBT permits easily improving the performance (or permits decreasing the loss) by the reduction of the channel resistance. The construction of the trench IGBT will now be described with reference to FIG. 1A, which is a cross sectional view schematically showing the construction of a conventional trench IGBT.

As shown in FIG. 1A, an $n^+$-type buffer layer 11, an n-type base layer 12, and a p-type base layer 13 are formed in the order mentioned on a $p^+$-type collector layer 10. Also, an $n^+$-type emitter layer 14 is in a part of the surface region of the p-type base layer 13. Also formed is a trench 15 extending downward from the surface of the emitter layer 14 to reach the n-type base layer 12 through the emitter layer 14 and the p-type base layer 13. A gate electrode 17 (trench-gate electrode), which is covered with a gate insulating film 16, is buried in the trench 15. The trench-gate electrode 17 is withdrawn to reach, for example, a pad (not shown) for the gate electrode for contact with the outside.

An emitter electrode 18 is formed to cover the emitter layer 14 and the p-type base layer 13. The emitter layer 14 and the p-type base layer 13 are electrically short-circuited by the emitter electrode 18. Also, an insulating film 19 is formed on the trench-gate electrode 17. The trench-gate electrode 17 and the emitter electrode 18, are electrically isolated from each other by the insulating film 19. Also, a collector electrode 20 is formed on the back surface of the collector region 10.

A MOSFET is formed of the $n^-$-type base layer 12, the p-type base layer 13, the emitter layer 14, the gate insulating film 16 and the trench-gate electrode 17. It should be noted that electrons are injected from the emitter layer 14 into the $n^-$-type base layer 12 through a channel region CH formed in that region of the p-type base layer 13 which is in contact with the trench 15.

FIG. 1B is a graph relating to an impurity concentration profile along the line X1–X2 shown in FIG. 1A and shows the impurity concentration distribution in the active area including the channel region CH. As shown in the drawing, the profile includes the n-type impurity concentration distribution 30 in the emitter layer 14, the p-type impurity concentration distribution 31 in the p-type base layer 13, and the n-type impurity concentration distribution 32 in the $n^-$-type base layer 12. The p-type impurity concentration in the p-type base layer 13 is increased to reach the highest concentration Cp0 in the position close to the junction between the emitter layer 14 and the p-type base layer 13, and the p-type impurity concentration is gradually lowered toward the $n^-$-type base layer 12.

The fabricating process of the trench IGBT shown in FIG. 1A will now be described briefly. In the first step, the p-type base layer 13 is formed by diffusion in a surface region of the $n^-$-type base layer 12 formed on the collector region 10 with an n-type buffer layer 11 formed therebetween. Then, a large number of n-type emitter layers 14 having a stripe pattern when viewed from above are formed in a surface region of the p-type base layer 13. As a result, the exposed portion of the p-type base layer 13 is allowed to have a large number of stripe pattern as viewed from above.

Then, the trench 15 having a stripe pattern as viewed from above are formed in each of the emitter layers 14 in a manner to extend to reach the $n^-$-type base layer 12. In other words, the trench 15 is formed to extend through the emitter layer 14 and the p-type base layer 13. After formation of the trench 15, the gate insulating film 16 such as a $SiO_2$ film is formed to cover the inner wall of the trench 15 and the upper surfaces of the emitter layer 14 and the p-type base layer 13.

In the next step, a polycrystalline silicon (polysilicon) film 17 containing P (phosphorus) is formed by a CVD (Chemical Vapor Deposition) method within the trench 15 and on the surfaces of the emitter layer 14 and the p-type base layer 13. The polysilicon film 17 is for formation of the trench-gate electrode.

Then, the polysilicon film 17 is patterned on the basis of the trench gate lead pattern so as to form a pad (not shown) for contact of the gate electrode. Also, the upper surface of the polysilicon film 17 within the trench 15 is etched back so as to permit the upper surface of the gate electrode 17 to be flush with the upper surfaces of the emitter layer 14 and the p-type base layer 13.

Then, an insulating film 19 is deposited on the upper surfaces of the trench 15, the emitter layer 14 and the p-type base layer 13, followed by forming a large contact hole for the lead of the gate electrode in the insulating film 19 formed on the pad for contact of the gate electrode. Also formed is a contact hole for the lead of the emitter-base in a manner to extend through the insulating film 19 around the opening of the trench 15 and through the gate insulating film 16 positioned below the insulating film 19.

Further, a metal wiring layer such as an aluminum wiring layer is formed by a sputtering method within the contact holes and on the insulating film 19 for the lead of the gate electrode and for the lead of the emitter-base, followed by patterning the metal wiring layer as desired so as to form an emitter electrode 18 and a gate electrode wiring (not shown). Still further, a collector electrode 20 is formed on the back surface of the collector layer 10, thereby forming the trench IGBT.

The operation of the trench IGBT shown in FIG. 1A will now be described.

When the IGBT is turned on, a collector voltage VCE is applied between the collector electrode 20 and the emitter electrode 18. At the same time, a positive gate voltage VGE is applied between the trench-gate electrode 17 and the emitter electrode 18. As a result, an inverted layer (n-type channel) whose conductivity type is inverted from the p-type to the n-type is formed in the channel region CH of the p-type base layer 13. Electrons are injected from the emitter electrode 18 into the n$^-$-type base layer 12 through the inverted layer, and the injected electrons are allowed to migrate through the n$^+$-type buffer layer 11 to reach the p$^+$-type collector layer 10. It should be noted that, since a forward bias is applied between the p$^+$-type collector layer 10 and the n$^-$-type base layer 12, holes are injected from the p$^+$-type collector layer 10 into the n$^+$-type base layer 12. Since both electrons and holes are injected into the n$^-$-type base layer 12, the conductivity is modulated in the region of the n$^-$-type base layer 12 so as to markedly decrease the resistance of the n$^-$-type base layer 12. As a result, the IGBT is turned on.

When the IGBT is turned off, a negative voltage relative to the emitter electrode 18 is applied to the trench-gate electrode 17. As a result, the inverted layer is caused to disappear, with the result that the electron injection from the emitter layer 14 into the n$^-$-type base layer 12 is stopped. On the other hand, the holes accumulated in the n$^-$-type base layer 12 are partly discharged through the p-type base layer 13 into the emitter electrode 18. The remaining holes are recombined with the electrons so as to be caused to disappear, thereby turning off the IGBT.

Where the load is short-circuited in the IGBT having the construction and operation as described above, the power source voltage is applied to the collector electrode 20 when the IGBT is under the conductive state. In this case, a short circuit peak current $I_{cp}$ flows through the IGBT, with the result that the IGBT is broken down a certain time tsc later. The time between the short-circuiting of the load and the breakdown of the IGBT is called herein the short circuit withstand capability tsc. It has been confirmed that the short circuit withstand capability tsc is diminished with increase in the short circuit peak current $I_{cp}$ of the IGBT because of the thermal breakdown caused by the short circuit peak current.

The conventional trench IGBT described above has the advantage that it is possible to increase the channel density so as to decrease the on-voltage. However, if the channel density is increased, the current flow is facilitated, with the result that the short circuit peak current $I_{cp}$ is increased and the short circuit withstand capability tsc is diminished. In other words, the on-voltage and the short circuit withstand capability have a trade-off relationship.

Incidentally, various constructions in addition to the construction shown in FIG. 1A are proposed in respect of the conventional IGBT. For example, proposed is the construction that, where the distance between the adjacent trench-gate electrodes 17 (cell pitch) is relatively large and the width of the contact opening is large to some extent compared with the processing accuracy in the construction shown in FIG. 1A, the short circuit between the emitter layer 14 and the base layer 13 is achieved by the emitter electrode 18 in the entire surface in a direction parallel to the trench 15.

On the other hand, if the cell pitch is diminished, the width of the contact opening is diminished, with the result that it is difficult to achieve the short circuit between the emitter layer 14 and the base layer 13 by the emitter electrode 18 in the entire surface in a direction parallel to the trench.

In order to solve the problem described above, it is proposed to form the emitter layer 14 of the trench IGBT to have a ladder-like pattern as viewed from above. In other words, it is proposed to form the trench IGBT such that rectangular exposed portions of the base layer 13 are dotted.

It is also proposed to form the trench IGBT such that the emitter layer 14 as a whole has a mesh-like (or a lattice-like) pattern or a mesh-like (or zigzag patterned lattice-like) pattern having an offset as viewed from above. In other words, it is proposed to form the trench IGBT such that the band-like emitter layer 14 and the band-like exposed portions of the base layer 13 are alternately present along the trench 15.

Further proposed is a trench contact structure in which a trench for the emitter contact is formed in that portion of the base layer 13 which is positioned between the adjacent emitter layers 14, and the emitter electrode 18 is formed in contact with the side surface of the emitter layer 14 and with the base layer 13 within the trench.

The on-voltage and the short circuit withstand capability have the trade-off relationship in the various trench IGBT's of the constructions described above, making it difficult to satisfy both the on-voltage and the short circuit withstand capability simultaneously.

The construction of a conventional planar IGBT will now be described. FIG. 2A is a cross sectional view schematically showing the construction of the conventional IGBT of the planar gate type.

As shown in the drawing, an n$^-$-type base layer 12 is formed on a p$^+$-type collector layer 10, and a p-type base layer 13 is formed in a part of the surface region of the n$^-$-type base layer 12. Also, an n$^+$-type emitter layer 14 is formed in a part of the surface region of the p-type base layer 13. Further, a gate insulating film 16 is formed to cover the base layers 12, 13 positioned between the adjacent emitter layers 14, and a gate electrode 17 is formed on the gate insulating film 16. An emitter electrode 18 is formed on the other region. It should be noted that the emitter electrode 18 and the gate electrode 17 are electrically insulated from each other by the insulating film 19. Further, a collector electrode 20 is formed on the back surface of the collector region 10 so as to form an IGBT.

FIG. 2B is a graph relating to an impurity concentration profile along the line Y1–Y2 shown in FIG. 2A and shows the impurity concentration distribution in the active area including the channel region CH. As shown in the drawing, the profile includes the n-type impurity concentration distribution 30 in the emitter layer 14, the p-type impurity concentration distribution 31 in the p-type base layer 13, and the n-type impurity concentration distribution 32 in the n⁻-type base layer 12. The p-type impurity concentration in the p-type base layer 13 is increased to reach the highest concentration Cp0 in the position close to the junction between the emitter layer 14 and the p-type base layer 13, and the p-type impurity concentration is gradually lowered toward the n⁻-type base layer 12.

The planar IGBT differs from the trench IGBT in the gate construction. However, since the planar IGBT is equal to the trench IGBT in operation, the on-voltage and the short circuit withstand capability have the trade-off relationship in the planar IGBT, too, though the detailed description thereof is omitted.

As described above, if the on-voltage is increased in the conventional IGBT, the short circuit peak current $I_{cp}$ is increased, with the result that the short circuit withstand capability tsc is diminished. It follows that it is difficult to satisfy simultaneously the requirements for maintaining a low on-voltage and for improving the short circuit withstand capability.

BRIEF SUMMARY OF THE INVENTION

A semiconductor element according to an aspect of the invention comprises:

Including: a first base layer of a first conductivity type; a second base layer of a second conductivity type formed selectively in one surface region of the first base layer; an emitter layer or a source layer of the first conductivity type formed selectively in a surface region of the second base layer; a gate electrode formed on the second base layer positioned between the emitter layer or source layer and the first base layer with a gate insulating film interposed between the gate electrode and the second base layer; a collector layer or a drain layer formed on the other surface region of the first base layer or formed selectively on one surface region of the first base layer; a first main electrode formed on the collector layer or on the drain layer; a second main electrode formed on the emitter layer or source layer and on the second base layer; and a channel region formed in contact with the gate insulating film to permit the carrier to migrate between the emitter layer or source layer and the first base layer, the channel region having an impurity concentration profile along the gate insulating film which is constant substantially between the emitter layer or source layer and the first base layer.

A method of fabricating a semiconductor element according to an aspect of the present invention comprises:

selectively forming a second base layer of a second conductivity type in one surface region of a first base layer of a first conductivity type, the second base layer having an impurity concentration profile such that the point of the highest impurity concentration is positioned in a region close to the junction between the second base layer and the first base layer;

selectively forming an emitter layer or source layer of the first conductivity type in a surface region of the second base layer;

forming a gate electrode on the surface of that region of the second base layer which is positioned between the emitter layer or source layer and the first base layer with a gate insulating film interposed between the gate electrode and the second base layer;

selectively forming a collector layer or drain layer in the other surface region of the first base layer or in one surface region of the first base layer; and forming a first main electrode in contact with the collector layer or drain layer and a second main electrode in contact with the emitter layer or source layer and the second base layer.

BRIEF DESCRIPTION OF THE SEVERAL VIEWS OF THE DRAWING

FIGS. 13A, 13B, 13D and 13F to 13L are cross sectional views collectively showing the fabricating process of a trench IGBT according to the first embodiment of the present invention;

FIGS. 13C and 13E are diagrams showing the impurity concentration profiles in the depth direction along the lines S1–S2 shown in FIGS. 13B and 13D, respectively;

DETAILED DESCRIPTION OF THE INVENTION

Figure 3A:
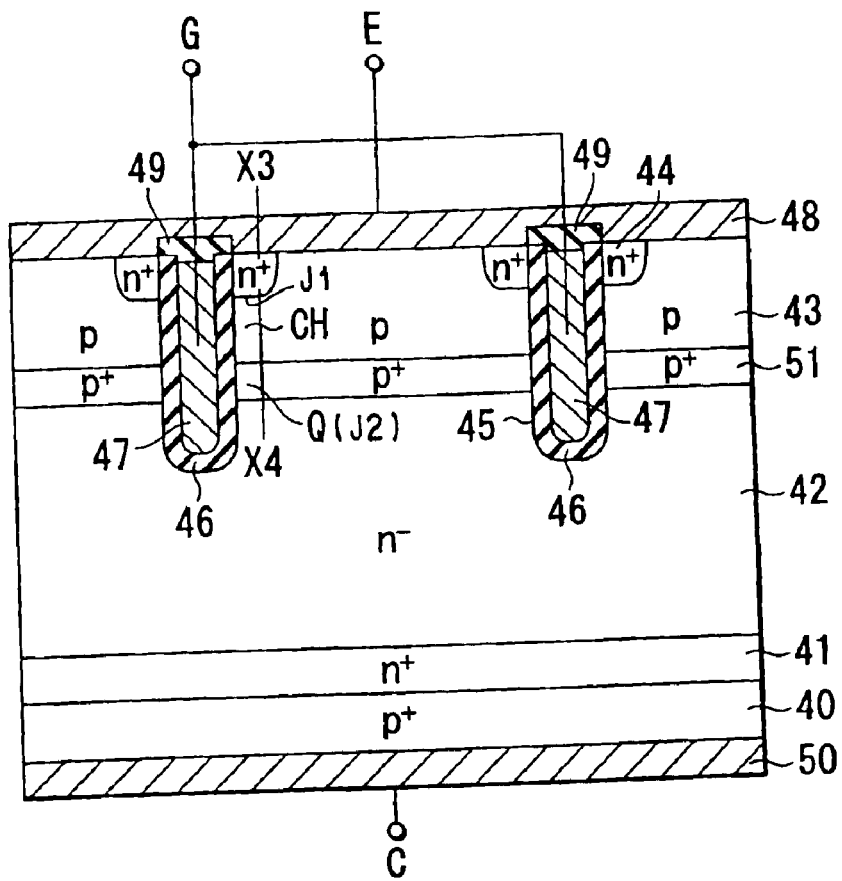
FIG. 3A is a cross sectional view showing a trench IGBT according to a first embodiment of the present invention.

FIG. 3A is a cross sectional view schematically showing the construction of a trench IGBT, which is a power semiconductor element according to the first embodiment of the present invention.

As shown in the drawing, an n⁺-type buffer layer 41, an n-type base layer 42 having a high resistivity, a p⁺-type base layer 51 having a high impurity concentration and a p-type base layer 43 having a low impurity concentration are formed in the order mentioned on one surface region of a p⁺-type collector layer 40. Also, an n⁺-type emitter layer 44 selectively formed in a part of the surface region of the p-type base layer 43. Further, a trench 45 is formed to extend downward from the surface of the emitter layer 14 to reach the n-type base layer 42 through the emitter layer 44, the p-type base layer 43 and the p⁺-type base layer 51. A gate electrode 47 (trench-gate electrode), which is covered with a gate insulating film 46, is buried in the trench 45. Incidentally, the emitter layer 44 is formed to have, for example, a striped pattern consisting of a plurality of columns as viewed from above, and the trench 45 is formed in a middle region of adjacent the emitter layers 44. In other words, each of the trench 45 and the trench-gate electrode 47 is also formed to have a striped pattern consisting of a plurality of columns as viewed from above. Also, the p⁺-type collector layer 40 consists of a p⁺-type silicon substrate, and each of the n⁺-type buffer layer 41 and the n-type base layer 42 consists of an epitaxially grown layer formed on the p⁺-type silicon substrate.

An emitter electrode 48 formed of, for example, an aluminum wiring, which is electrically insulated from the gate electrode 47 and permits the short-circuiting between the emitter layer 44 and the p-type base layer 43, is formed to cover the emitter layer 44 and the p-type base layer 43. To be more specific, an insulating film 49 is deposited on the p-type base layer 43 and the trench-gate electrode 47, and the emitter electrode 48 is formed to be in contact with a part of the emitter layer 44 and with a part of the p-type base layer 43 via a contact hole formed in the insulating film 49 for the lead of the emitter-base.

Incidentally, each of the trench-gate electrode 47 is formed to extend to reach, for example, a gate contact pad (not shown), and a gate electrode wiring is formed in contact with the gate contact pad. Also, a collector electrode 50 is formed on the back surface of the p⁺-type collector layer 40. Incidentally, the n⁺-type buffer layer 41 is intended to improve the breakdown voltage of the IGBT. Where the required breakdown voltage can be maintained by another method, it is possible to omit the n⁺-type buffer layer 41. This is also be case with the second embodiment, et seq. which are to be described herein later.

A MOSFET is formed of the n⁻-type base layer 42, the p⁺-type base layer 51, the p-type base layer 43, the emitter layer 44, the gate insulating film 46 and the trench-gate electrode 47. In the MOSFET thus formed, electrons are injected from the emitter layer 44 into the n⁻-type base layer 42 through a channel region CH formed in those portions of the p$^+$-type base layer 51 and the p-type base layer 43 which are in contact with the trench 45.

Figure 3B:
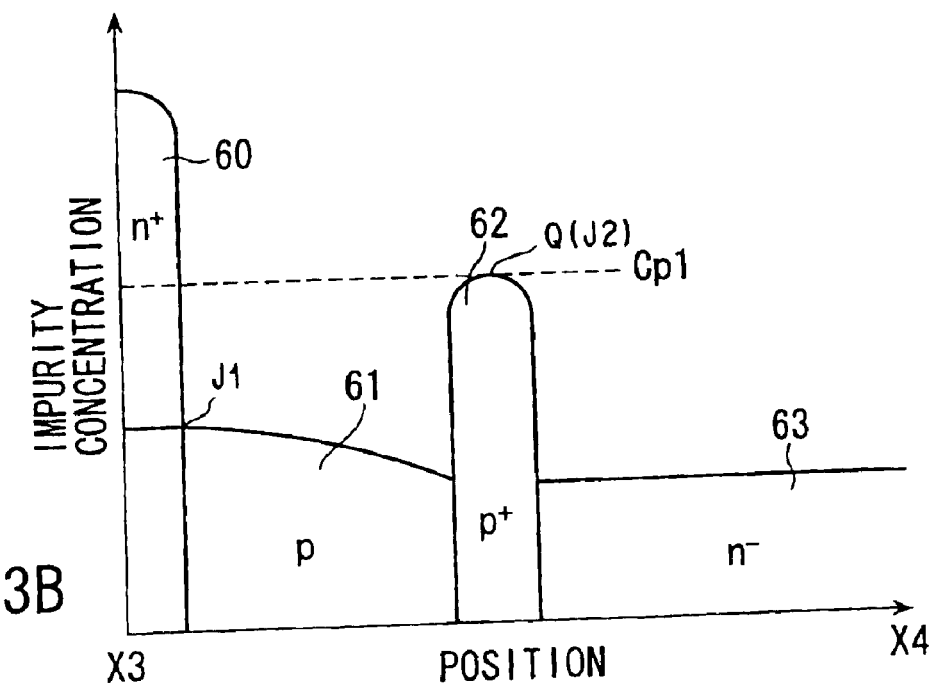
FIG. 3B is a diagram showing the impurity concentration profile in the depth direction of the region ranging between the emitter layer and the n⁻-base layer along the line X3–X4 shown in FIG. 3A.

FIG. 3B is a graph relating to the impurity concentration profile along the line X3–X4 shown in FIG. 3A and shows the impurity concentration distribution in the active region including the channel region CH. The impurity concentration profile includes the n-type impurity distribution 60 in the emitter layer 44, the p-type impurity concentration distribution 61 in the p-type base layer 43, the p-type impurity concentration distribution 62 in the p$^+$-type base layer 51, and the n-type impurity concentration distribution 63 in the n$^-$-type base layer 42. As shown in the drawing, the highest concentration Cp1 of the p-type impurity in the p-type base region is formed in a position close to the junction between the p$^+$-type base layer 43 and the n$^-$-type base region 42, not in a position close to the junction between the emitter layer 44 and the p-type base layer 43.

The operation of the trench IGBT shown in FIG. 3A will now be described.

When the IGBT of the construction according to this embodiment is turned on, a collector voltage VCE is applied first between the collector electrode 50 and the emitter electrode 48. At the same time, a predetermined positive gate voltage VGE is applied between the trench-gate electrode 47 and the emitter electrode 48. As a result, an inverted layer (n-type channel), in which the conductivity is converted from the p-type to the n-type, is formed in the channel region CH of the p-type base layer 43 and the p$^+$-type base layer 51. As a result, electrons are injected from the emitter electrode 48 into the n$^-$-type base layer 42 through the inverted layer. The electrons thus injected are migrated through the n$^+$-type buffer layer 41 to reach the p$^+$-type collector layer 40. Since a forward bias is applied in this step between the p$^+$-type collector layer 40 and the n$^-$-type base layer 42, holes are injected from the p$^+$-type collector layer 40 into the n$^-$-type base layer 42. As a result of the injection of both electrons and holes into the n$^-$-type base layer 42, modulation of the conductivity takes place within the n$^-$-type base layer 42 so as to markedly lower the resistance of the n$^-$-type base layer 42, thereby turning on the IGBT.

When the IGBT is turned off, a negative voltage is applied between the trench-gate electrode 47 and the emitter electrode 48. As a result, the inverted layer is caused to disappear, with the result that the electron injection from the emitter layer 44 into the n$^-$-type base layer 42 is stopped. On the other hand, the holes accumulated in the n$^-$-type base layer 42 are partly discharged to the emitter electrode 48 through the p-type base layer 43 and the p$^+$-type base layer 51, and the remaining holes are re-combined with the electrons so as to be caused to disappear, thereby turning off the IGBT.

Where the load is short-circuited in the IGBT having the construction and operation as described above, the power source voltage is applied to the collector electrode 50 when the IGBT is under the conductive state. In this case, a short circuit peak current $I_{cp}$ flows through the IGBT, with the result that the IGBT is broken down a certain time tsc later. The time between the short-circuiting of the load and the breakdown of the IGBT is called herein the short circuit withstand capability tsc. It has been confirmed that the short circuit withstand capability tsc is diminished with increase in the short circuit peak current $I_{cp}$ of the IGBT because of the thermal breakdown caused by the short circuit peak current.

The IGBT according to this embodiment permits diminishing the saturated current value while maintaining the static characteristics of the collector current of the conventional IGBT. As a result, it is possible to increase the short circuit withstand capability. The reason for the improvement of the short circuit withstand capability is as follows.

In general, if the collector voltage VCE of the IGBT under the on-state is further increased, the potential of the channel region CH of the p-type base layer is also increased, with the result that the difference between the gate potential and the base potential is made smaller than the threshold voltage of the MOSFET. Particularly, since the threshold voltage is increased in the region near the emitter layer having a high impurity concentration, the phenomenon described above is rendered prominent, thereby making it impossible to maintain the inverted layer. As a result, the channel region is depleted (pinch-off) and the resistance of the channel region is rendered infinitely high so as to permit the current of the IGBT to be saturated. In the prior art, the pinch-off takes place in the region near the emitter layer where the p-type impurity has the highest concentration.

In the IGBT according to this embodiment, the threshold voltage is determined by the p$^+$-type base layer 51 having the impurity concentration higher than that of the p-type base layer 43 and, thus, the pinch off phenomenon also takes place in the p$^+$-type base layer 51 having a high impurity concentration. It should be noted that the p$^+$-type base layer 51 is formed in a location deeper than the junction between the emitter layer 44 and the p-type base layer 43. In other words, the pinch-off point is located closer to the n-type base layer in the embodiment of the present invention than in the prior art.

Figure 3C:
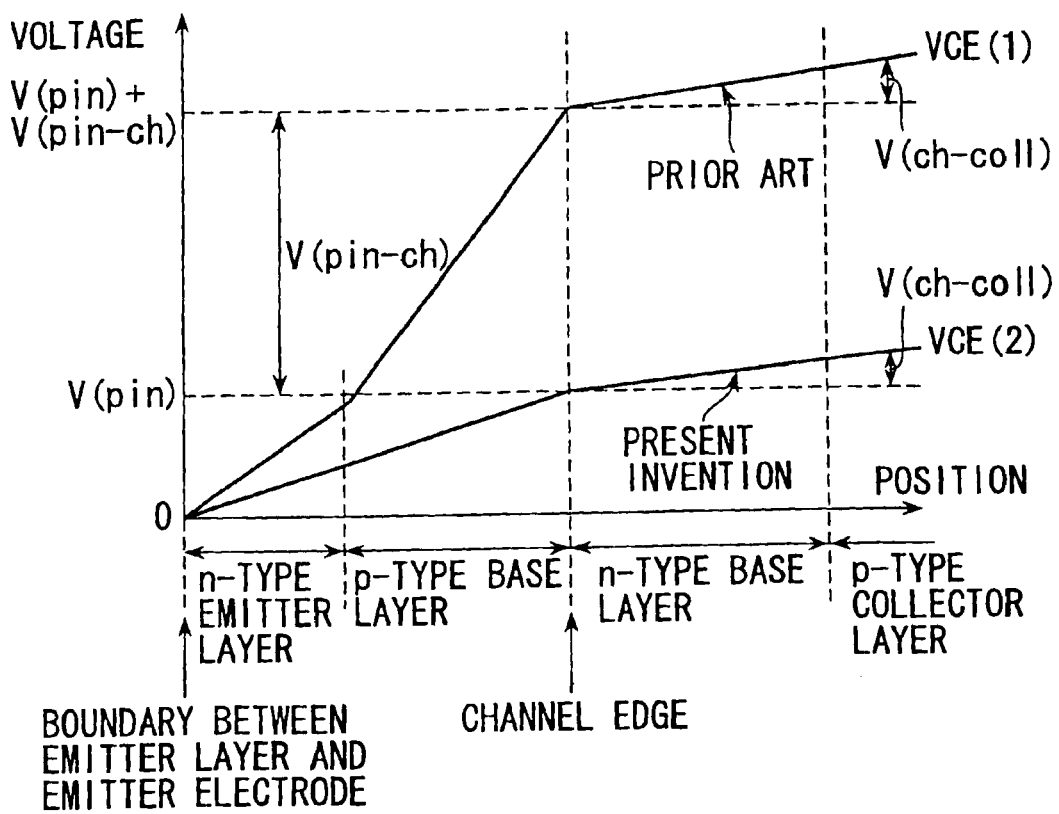
FIG. 3C is a graph showing the voltage distribution in the region ranging between the emitter layer and the collector layer in the trench IGBT shown in FIG. 3A.

As described above, the pinch-off point is controlled by forming the p$^+$-type base layer 51. The significance of the particular control will now be described in detail with reference to the graph of FIG. 3C. In the graph of FIG. 3C, the position in the depth direction, as measured from the boundary between the emitter electrode and the emitter layer, is plotted in the abscissa. Also, the voltage, as measured on the basis of the voltage at the boundary between the emitter electrode and the emitter layer, is plotted on the ordinate of the graph. The voltage distribution over the various regions is plotted in the graph of FIG. 3C in respect of the conventional IGBT and the IGBT according to this embodiment of the present invention. Incidentally, the point in the depth direction is plotted simply as a model on the abscissa of the graph. In general, the emitter layer is actually formed very thin, compared with, for example, the p-type base layer.

As shown in FIG. 3C, the collector voltage VCE(1) of the conventional trench IGBT is equal to the sum of the pinch-off voltage V(pin), the voltage V(pin-ch) provided by the resistance of the channel region CH between the pinch-off point and the n-type base layer, and the voltage V(ch-coll) between the n-type base layer and the p-type collector layer, i.e., VCE(1)=V(pin)+V(pin-ch)+V(ch-coll).

On the other hand, in the IGBT according to this embodiment of the present invention, the pinch-off point is set in a p-type base layer having a high impurity concentration. In other words, the pinch-off point is set to reside in substantially the boundary between the p-type base layer and the n-type base layer. As a result, it is possible to remove the voltage V(pin-ch) caused by the channel region ranging between the pinch-off point and the n-type base layer. It follows that the collector voltage VCE(2) is equal to the sum of the pinch-off voltage V(pin) and the voltage V(ch-coll) between the n-type base layer and the p-type collector layer, i.e., VCE(2)=V(pin)+V(ch-coll). This value VCE(2) is lower than VCE(1) of the conventional IGBT.

Figure 3D:
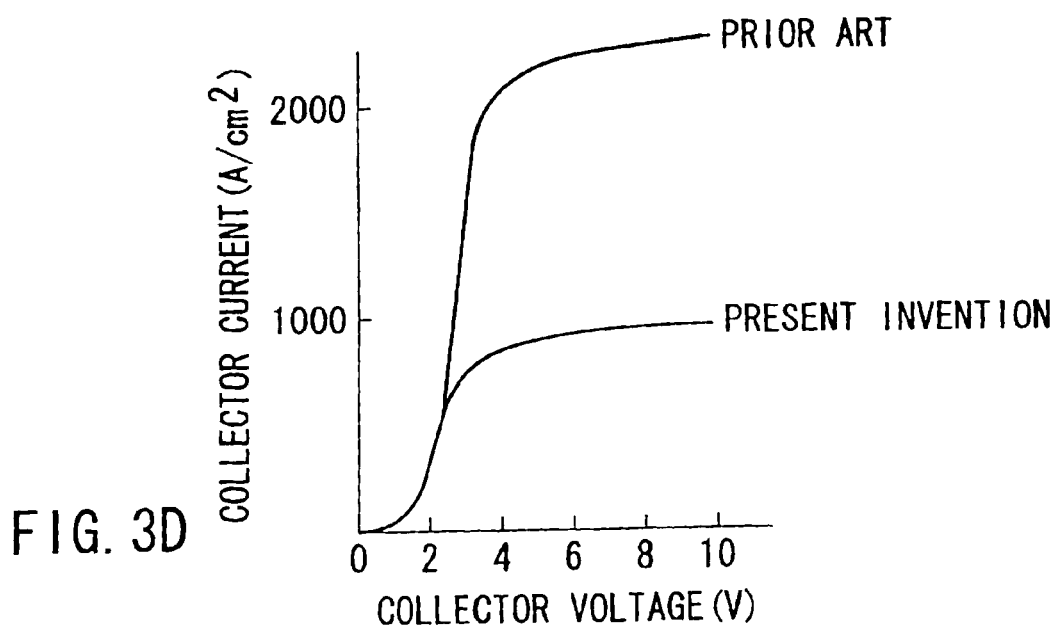
FIG. 3D is a graph showing the change in the collector current relative to the collector voltage in the trench IGBT shown in FIG. 3A.

As described above, it is possible to decrease the collector voltage VCE by setting the pinch-off point in a deep position inside the p-type base layer so as to diminish the saturation value of the collector current because the saturation value of the collector current of the IGBT is basically changed in proportion to the square of the collector voltage VCE. FIG. 3D shows the result of simulation of the static characteristics in terms of the relationship between the collector voltage and the collector current in respect of the conventional IGBT and the IGBT according this embodiment of the present invention. As shown in FIG. 3D, the saturation current value of the IGBT according to this embodiment is lower than that of the conventional IGBT. It follows that it is possible in the embodiment of the present invention to suppress the amount of heat generated by the saturation current, making it possible to improve the short circuit withstand capability.

To be more specific, the peak of the impurity concentration in the p-type base layer 13 resides in a point 0.5 µm deep from the boundary between the p-type base layer 13 and the emitter layer 14 in the conventional trench IGBT. The saturation value of the current of the IGBT in this case was 2300 A/cm$^2$ and the short circuit withstand capability was not higher than 1 µs.

On the other hand, when it comes to the IGBT according to this embodiment of the present invention, it was possible to lower the saturation value of the current of the IGBT to 800 A/cm$^2$ by setting the high impurity p$^+$-type base layer 51 in a point 3 µm deep from the side of the emitter layer, thereby making it possible to improve the short circuit withstand capability to 20 µs.

As described above, the trench IGBT according to this embodiment of the present invention makes it possible to improve the short circuit withstand capability without affecting the on-voltage characteristics.

Figure 1A:
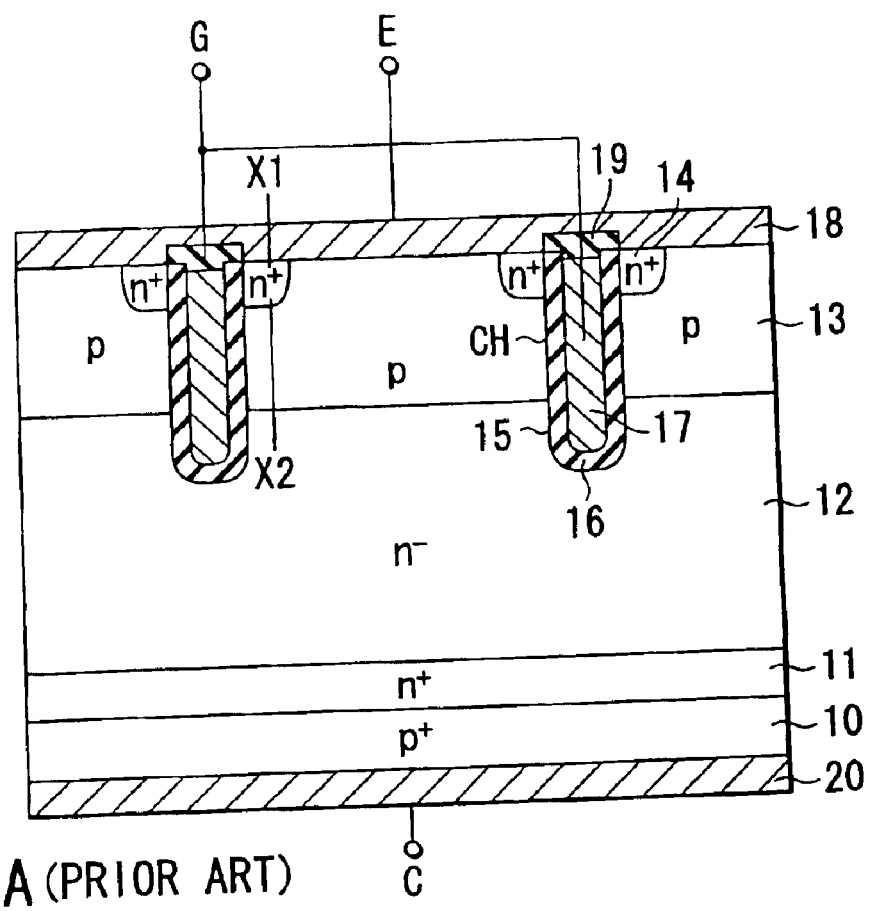
FIG. 1A is a cross sectional view showing a conventional trench IGBT.
Figure 1B:
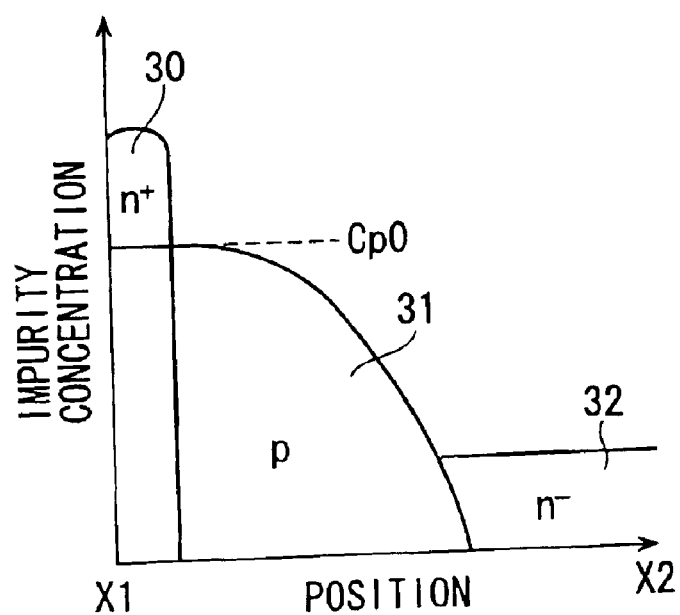
FIG. 1B is a diagram showing the impurity concentration profile in the depth direction of the region ranging between the emitter layer and the n⁻-type base layer along the line X1–X2 shown in FIG. 1A.
Figure 2A:
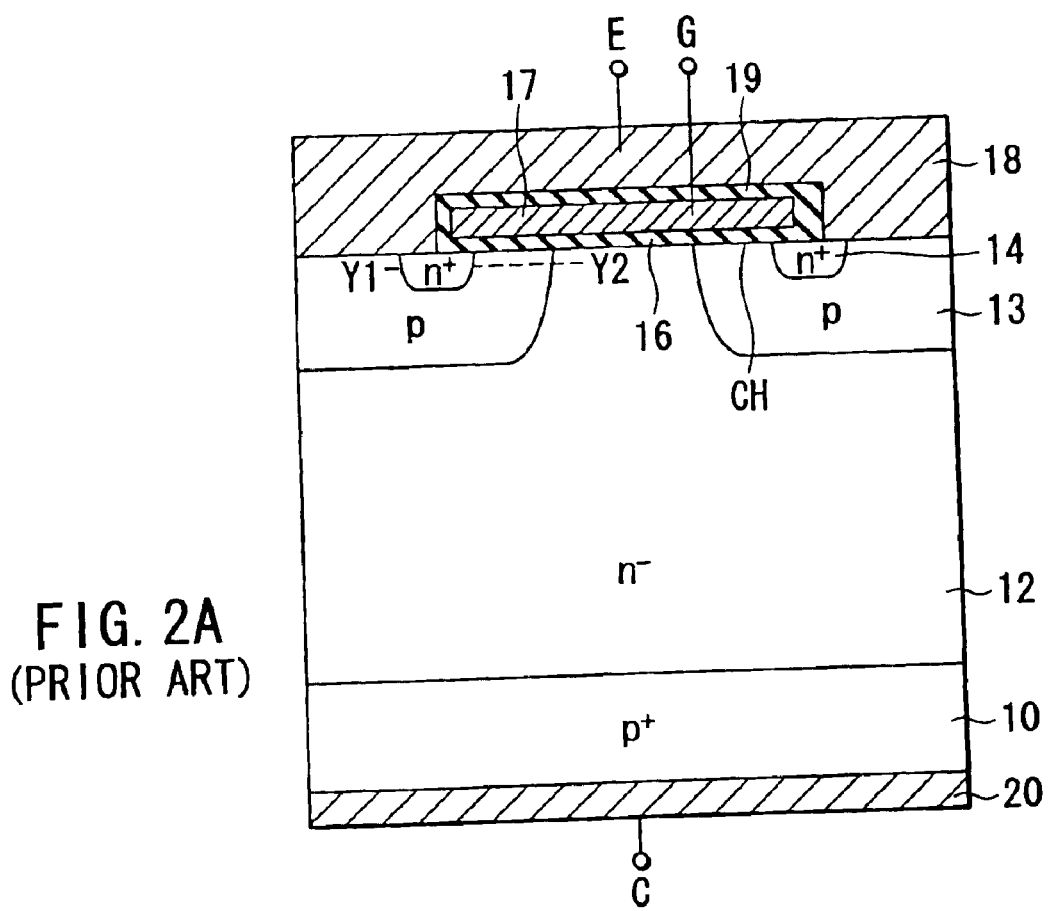
FIG. 2A is a cross sectional view showing a conventional planar IGBT.
Figure 2B:
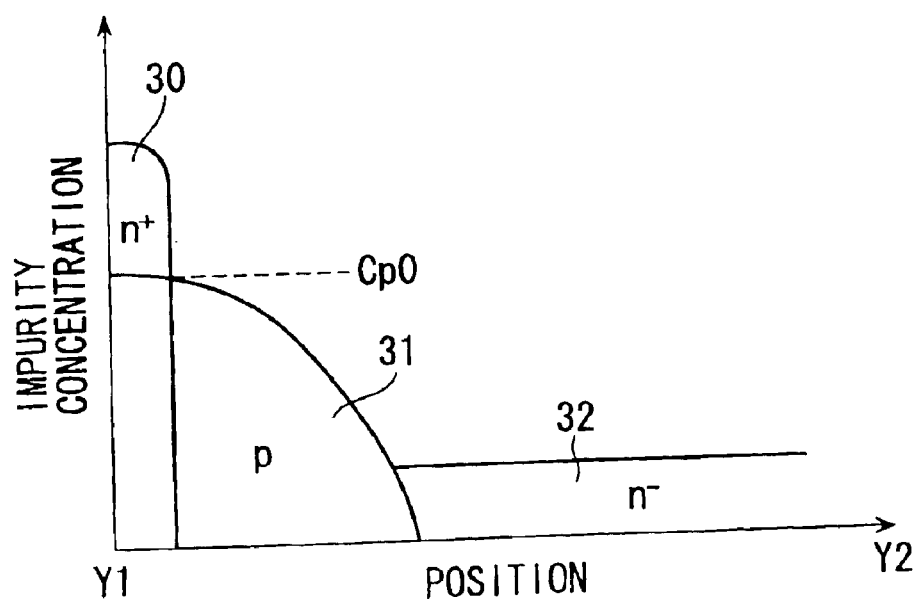
FIG. 2B is a diagram showing the impurity concentration profile in the planar direction of the region ranging between the emitter layer and the n⁻-type base layer along the line Y1–Y2 shown in FIG. 2A.

In the embodiment described above, the planar patterns of the emitter region and the exposed portion of the base region (contact region with the emitter electrode) of the trench IGBT are equal to the patterns of FIG. 1A described previously in conjunction with the prior art. However, it is possible to modify these planar patterns in various fashions.

Figure 4A:
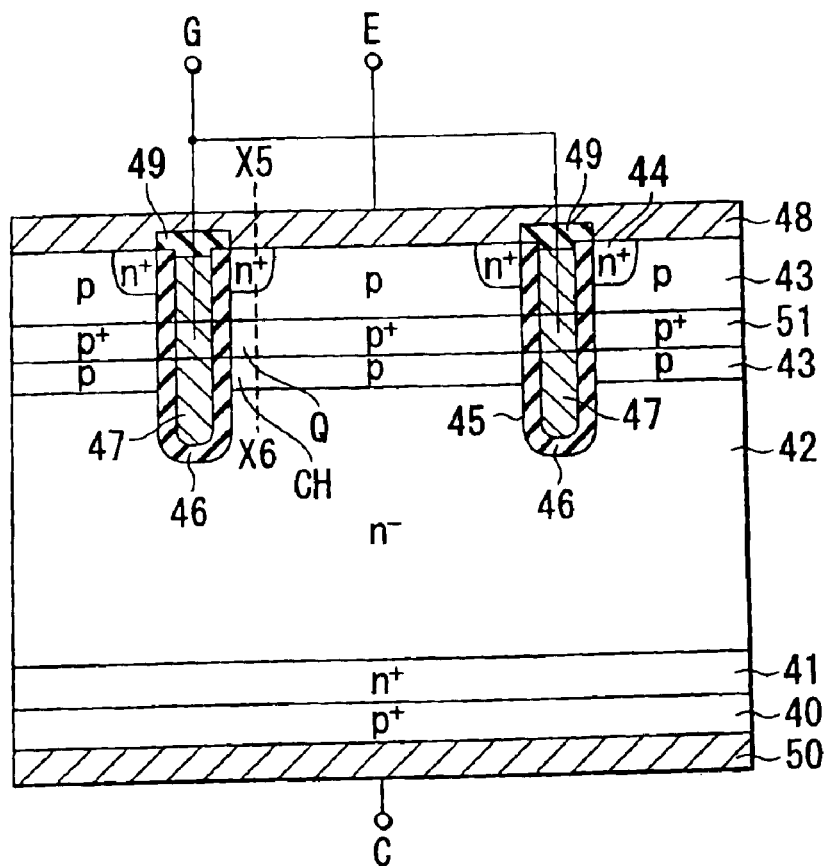
FIG. 4A is a cross sectional view showing a trench IGBT according to a second embodiment of the present invention.

FIG. 4A is a cross sectional view schematically showing a trench IGBT, which is directed to the construction of a power semiconductor element according to the second embodiment of the present invention. In the second embodiment, the p$^+$-type base layer 51 in the first embodiment is arranged within the p-type base layer 43 in the depth direction.

To be more specific, an n$^+$-type buffer layer 41, an n$^-$-type buffer layer 41 having a high resistively, and a p-type base layer 43 having a low impurity concentration are formed in the order mentioned on one surface region of a p$^+$-type collector layer 40. Also, a p$^+$-type base layer 51 is formed within the p-type base layer 43, and an n$^+$-type emitter layer 44 is selectively formed in a part of the surface region of the p-type base layer 43. Further, a trench 45 is formed to extend downward from the surface of the emitter layer 44 to reach the n$^-$-type base layer 42 through the emitter layer 44, and the p-type and p$^+$-type base layers 43, 51 and 43. A gate electrode 47 (trench-gate electrode), which is covered with a gate insulating film 46, is buried in the trench 45. The construction of the other portion is exactly equal to that described previously in conjunction with the first embodiment and, thus, the description thereof is omitted herein.

Figure 4B:
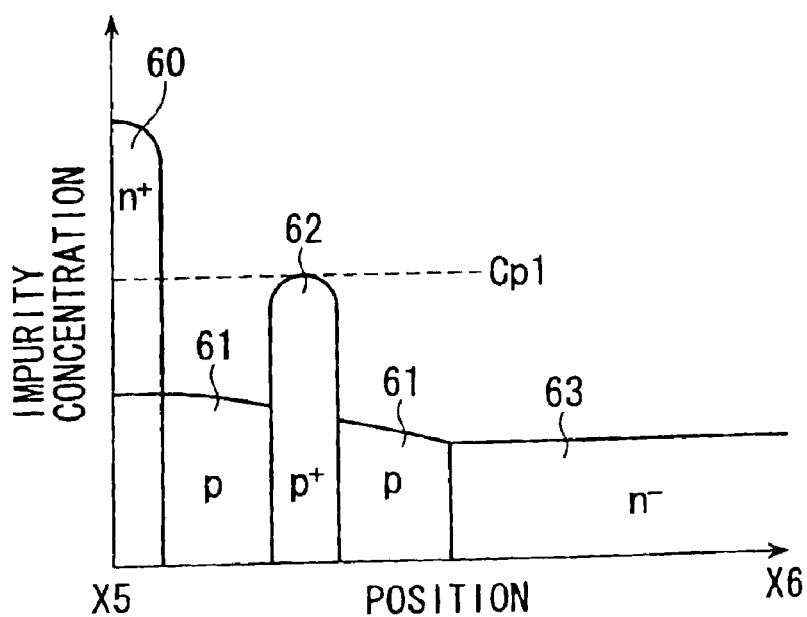
FIG. 4B is a diagram showing the impurity concentration profile in the depth direction of the region ranging between the emitter layer and the n⁻-base layer along the line X5–X6 shown in FIG. 4A.

FIG. 4B is a graph relating to the impurity concentration profile along the line X5–X6 shown in FIG. 4A and shows the impurity concentration distribution in the active region including the channel region CH. The impurity concentration profile shown in FIG. 4B includes the n-type impurity concentration distribution 60 in the emitter layer 44, the p-type impurity concentration distribution 61 in the p-type base layer 43, the p-type impurity concentration distribution 62 in the p$^+$-type base layer 51, and the n-type impurity concentration distribution 63 in the n$^-$-type base layer 42. As shown in the drawing, the point of the highest concentration Cp1 of the p-type impurity concentration in the p-type base region resides in substantially the center in the depth direction of the p-type base layer 43.

Figure 4C:
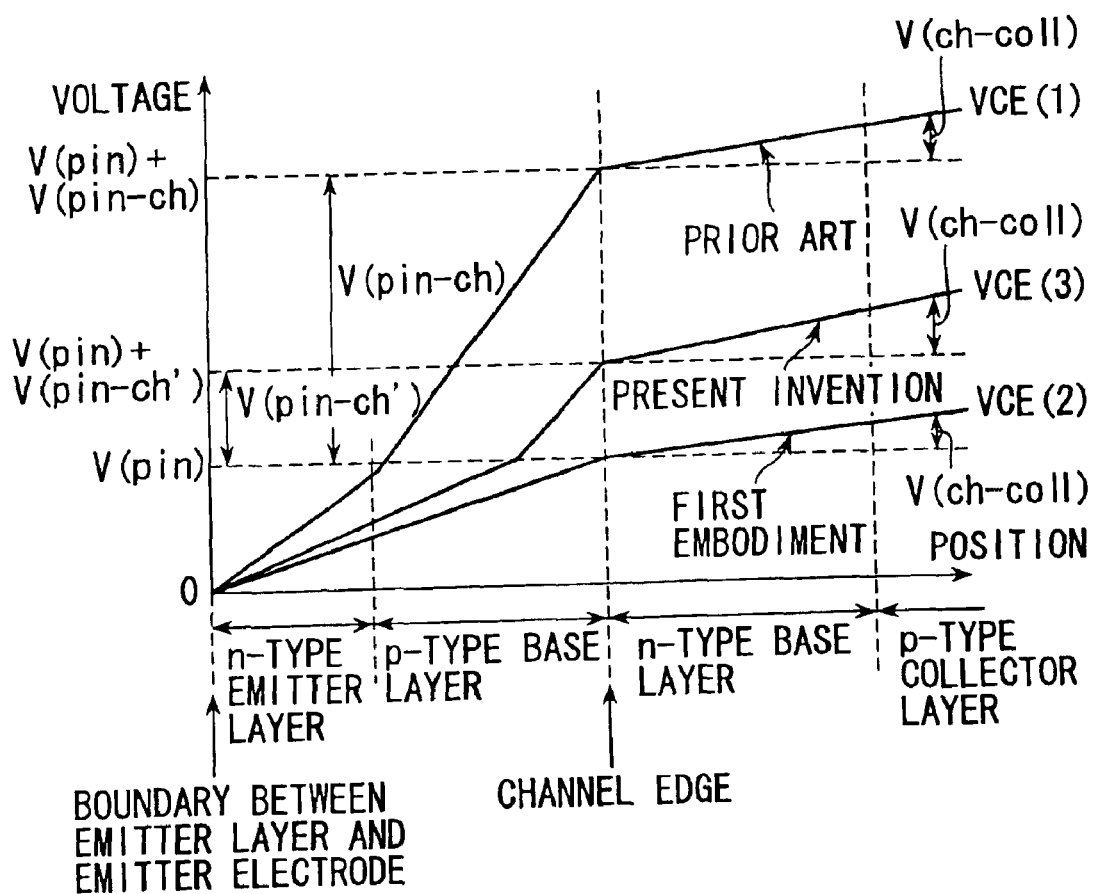
FIG. 4C is a graph showing the voltage distribution in the region ranging between the emitter layer and the collector layer in the trench IGBT shown in FIG. 4A.

The operation of the IGBT in the second embodiment is substantially equal to that described previously in conjunction with the first embodiment. To reiterate, the threshold voltage is determined by the portion of the p$^+$-type base layer 51 having a high impurity concentration, and the pinch-off phenomenon takes place within the p$^+$-type base layer 51. FIG. 4C shows the voltage distribution over the various regions as in the first embodiment.

The pinch-off point Q is positioned within the p$^+$-type base layer, i.e., in a position closer to the n$^-$-type base layer than in the prior art. Also, the voltage drop of V(pin) takes place between the boundary between the emitter layer and the p-type base layer and the pinch-off point Q, and the voltage drop of V(pin-ch') takes place between the pinch-off point Q and the edge of the channel. It follows that the collector voltage VCE(3) is equal to the sum of V(pin), V(pin-ch') and V(ch-coll), i.e., VCE(3)=V(pin)+V(pin-ch')+V(ch-coll). Since the pinch-off point Q is positioned closer to the n$^-$-type base layer than in the prior art, V(pin-ch') is naturally smaller than the conventional V(pin-ch) and the relationship VCE(2)<VCE(3)<VCE(1) is established in terms of the relationship with the conventional construction and the construction described previously in conjunction with the first embodiment. As a result, the saturation current also has the relationship given above.

As described above, it is possible to improve the short circuit withstand capability by setting the point-off point in a deeper position than in the prior art, not in the boundary position with the n$^-$-type base layer as in the first embodiment. In the second embodiment, the pinch-off point is set in substantially the center of the p-type base layer. Needless to say, however, the pinch-off point is not limited to the center of the p-type base layer. Naturally, it is most effective to design the IGBT such that the pinch-off phenomenon is generated in the deepest position of the p-type base layer as in the first embodiment. However, the requirements for the short circuit withstand capability differ in various fashions depending on the load element controlled by the IGBT. It is considered reasonable to state that it is most desirable in view of the process to obtain a desired short circuit withstand capability by controlling the position of the pinch-off point depending on the degree of the requirement as in the second embodiment.

The second embodiment is featured in that the pinch-off phenomenon is generated in a deeper position than in the prior art, as in the first embodiment. In other words, the second embodiment is featured in that formed is the p$^+$-type base layer 51 having an impurity concentration distribution having a maximum value Cp1 of the impurity concentration higher than a maximum value Cp2 of the impurity concentration within the p-type base layer 43 in a position deeper than the position of the maximum value Cp2. As a result, the impurity concentration profiles as shown in, for example, FIGS. 4D to 4G as well as in FIG. 4B produce the similar effect.

Figure 4D:
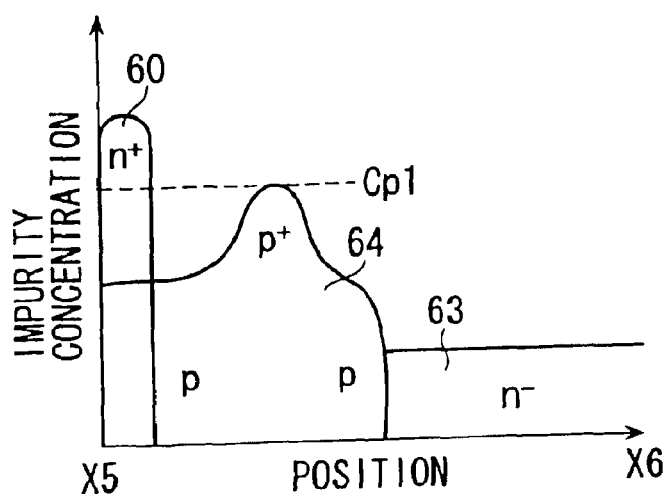
FIGS. 4D to 4H are graphs each showing the impurity concentration profile in the depth direction of the region ranging between the emitter layer and the n⁻-type base layer along the line X5–X6 shown in FIG. 4A.
Figure 4E:
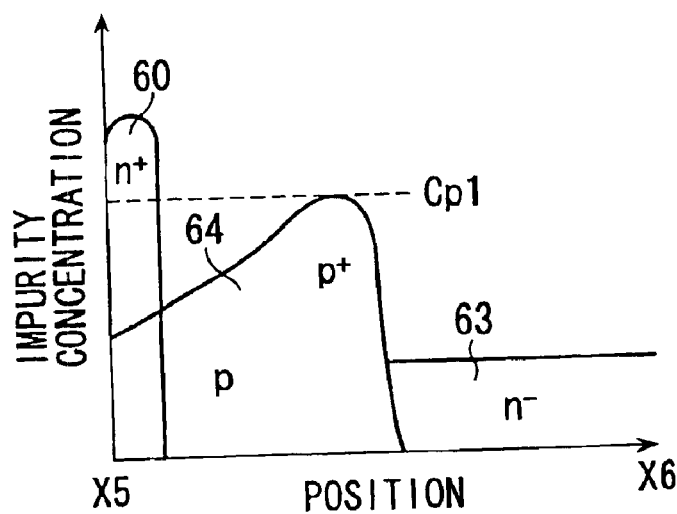

FIGS. 4D and 4E show the impurity concentration profiles in which the p-type base layer 43 and the p$^+$-type base layer 51 are regarded as a single layer. To be more specific, FIG. 4D shows the impurity concentration profile having the highest impurity concentration Cp1 in substantially the center of the p-type base layer. On the other hand, FIG. 4E shows that the impurity concentration 64 within the p-type base layer is increased with increase in the depth so as to reach the maximum value Cp1 in the vicinity of the boundary with the n⁻-type base layer.

Figure 4F:
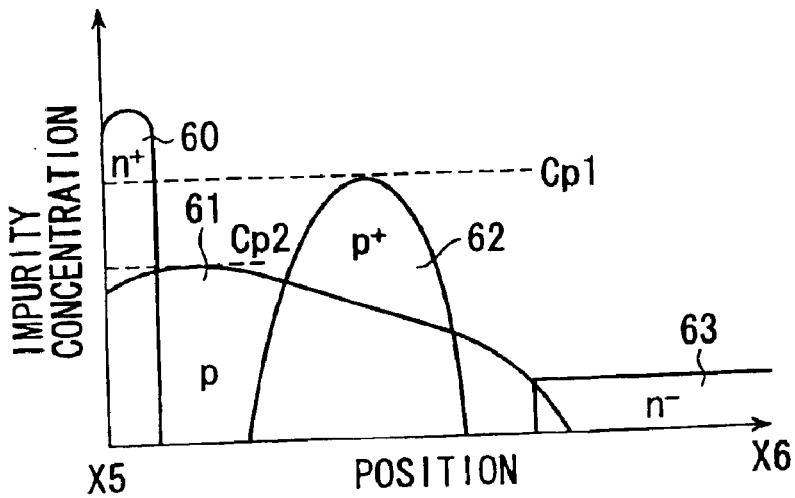
Figure 4G:
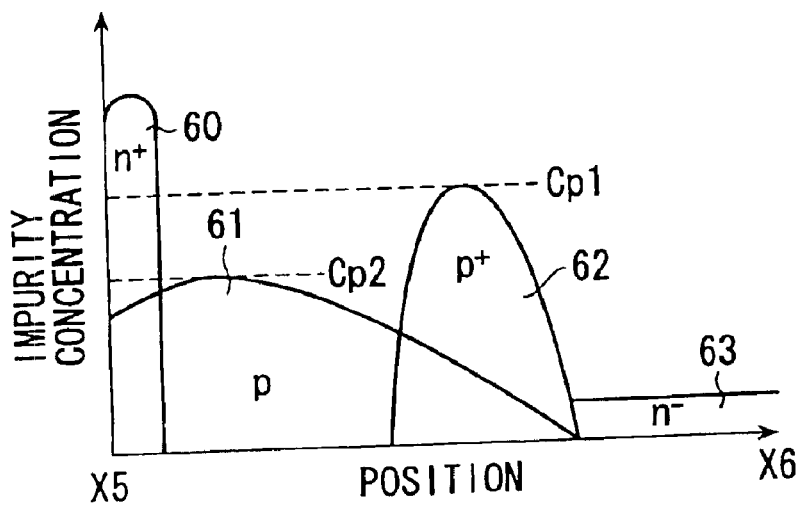

The impurity concentration profile shown in each of FIGS. 4F and 4G consists of the overlapping of a profile in which the impurity concentration is diminished with increase in the depth of the p-type base layer 43 as in the conventional profile and a profile of the p⁺-type base layer 51 having the maximum value Cp1 larger than the maximum value Cp2 of the impurity concentration in the p-type base layer. According to the impurity concentration profiles shown in FIGS. 4F and 4G, the p-type base layer has two peaks Cp1 and Cp2 of the impurity concentration (Cp1>Cp2). In this case, the effect of the second embodiment can be obtained by allowing the point of the maximum value Cp1 to be positioned deeper than the point of the maximum value Cp2.

As a result of an extensive research, the present inventors have found that there is a relationship as shown in Table 1 between the short circuit withstand capability and the position of the p⁺-type base layer 51 having a high impurity concentration and positioned between the surface of p-type base layer 43 and the junction between the p-type base layer 43 and the n⁻-type base layer 42 or the position where the p⁺-type base layer 51 has the concentration peak Cp1. Table 1 shows the short circuit withstand capability, i.e., the time between the flow of the short circuit peak current Icp and the start up of the short circuit protection circuit of the element, covering the case where the p⁺-type base layer 51 or the position of the impurity concentration Cp1 is successively deepened by the distance of 0.5 μm. Specifically, it has been confirmed that it is possible to achieve 10 μs of the short circuit withstand capability, which is required in recent years, by setting the position of the p⁺-type base layer 51 or the position of the impurity concentration Cp1 at the position at least 1 μm deep from the surface of the p-type base layer 43.

TABLE 1

| Concentration peak position within p-type base layer [μm] | 0 | 0.5 | 1 | 1.5 | 2 |
|---|---|---|---|---|---|
| Saturated current of IGBT [A] | 2500 | 2300 | 1400 | 1300 | 1100 |
| Short circuit withstand capability [μs] | ≦1 | ≦1 | 12 | 15 | 17 |

The ion implantation method and annealing, which is widely used for forming an impurity diffusion layer, can also be used in the embodiment of the present invention for forming the p-type base layer. It is known to the art that, if the accelerating voltage of the impurity in the ion implantation step is increased, the concentration peak of the impurity is changed. Therefore, where the high concentration p⁺-type base 51 layer is formed by the ion implantation and annealing, it is necessary to set the accelerating voltage such that it is possible to obtain a desired short circuit withstand capability. Table 2 shows the result of simulation of the relationship between the accelerating voltage and the short circuit withstand capability.

TABLE 2

| Accelerating voltage [kev] | 60 | 100 | 300 | 500 | 600 |
|---|---|---|---|---|---|
| Short circuit withstand capability [μs] | 0 | 6 | 11 | 14 | 15.5 |

Figure 4H:
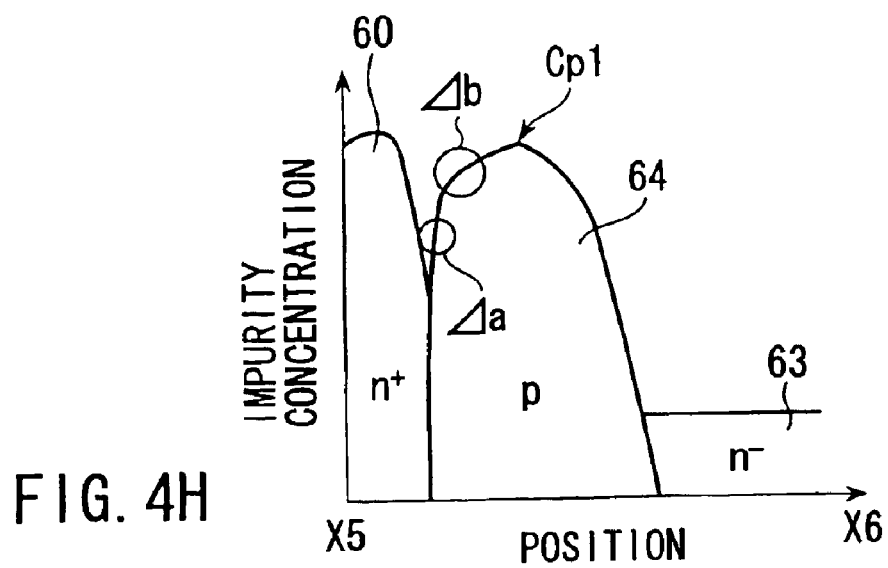

As described previously, the highest concentration in the impurity concentration distribution in the channel region CH is formed in a position closer to the n⁻-type base layer 42 than the junction between the emitter layer 44 and the p-type base layer 43 in the second embodiment of the present invention. This will be explained from a different stand point with reference to FIG. 4H, which shows the impurity concentration profile of the IGBT like FIGS. 4D to 4G.

First of all, attentions are paid to the impurity concentration distribution in the p-type base layers 43, 51 and the n⁺-type emitter layer 44. The impurity concentration distribution at the junction between the p-type base layer 43 and the emitter layer 44 is formed by the overlapping of the p-type impurity concentration distribution in the p-type base layers 43, 51 and the n-type impurity concentration distribution in the emitter layer 44. Therefore, the impurity concentration distribution in the junction noted above has a very sharp gradient Δa. In the conventional structure, the p-type base layer has the highest concentration at the peak arrived at by the gradient Δa. In the second embodiment of the present invention, however, the highest concentration point of the p-type base layer is formed at a deeper position. As a result, a region having a moderate concentration gradient Δb is included in the region between the region having the sharp gradient Δa and the point of the highest concentration Cp1.

If attentions are paid to the channel conductance of the channel region CH, it is possible to describe the second embodiment of the present invention as follows.

Specifically, the channel conductance between the pinch-off point Q having the highest impurity concentration of the p-type base layer 43 and the emitter layer 44 is defined as g1, and the channel conductance between the pinch-off point Q noted above and the n⁻-type base layer 42 is defined as g2. Naturally, with increase in the channel conductance, the voltage drop in the particular region is diminished, with the result that g2 is smaller than g1 (g2<g1) in the IGBT of the conventional structure. In the second embodiment of the present invention, however, the voltage V(pin-ch) owing to the resistance of the channel region between the pinch-off point Q and the n-type base layer 42 is removed by setting the pinch-off point Q within the high concentration p-type base layer 11. This is equal to the arrangement that g2 is set to be not smaller than g1 (g2≧g1).

Roughly speaking, the channel conductance can be represented by the formula that the value obtained by integrating the carrier density induced within the channel with the length of the inverted layer is multiplied by W/L, where W represents the channel width and L denotes the channel length. In other words, the channel conductance is inversely proportional to the channel length. If the pinch-off point is moved toward the n⁻-type base layer 42 as in the second embodiment of the present invention, the channel length L in the channel conductance g2 is naturally diminished. In other words, g1 is diminished and g2 is enlarged if the pinch-off point is moved toward the n⁻-type base layer 42, with the result that the relationship between g2 and g1 in the pinch-off point is reversed so as to satisfy the relationship of g2≧g1.

It should be noted, however, that it is not absolutely necessary for g1 and g2 to satisfy the relationship of g2>g1. As far as it is possible to move the pinch-off point closer to the n⁻-type base layer than in the prior art, it is possible to diminish the value of V(pin-ch) in VCE so as to obtain the effect the embodiment of the present invention.

As described above, the second embodiment of the present invention permits improving the short circuit withstand capability like the first embodiment described previously.

A power semiconductor element according to the third embodiment of the present invention will now be described. In each of the first and second embodiments described above, the p⁺-type base layer 51 was formed to extend over the adjacent trenches 45. However, it is not absolutely necessary for the p⁺-type base layer 51 to extend over the entire region between the adjacent trenches 45. In other words, it suffices for the p⁺-type base layer 51 to be present in at least the region where the channel is formed. The particular construction of the third embodiment will now be described with reference to FIG. 5, which is a cross sectional view showing a trench IGBT according to the third embodiment of the present invention.

Figure 5:
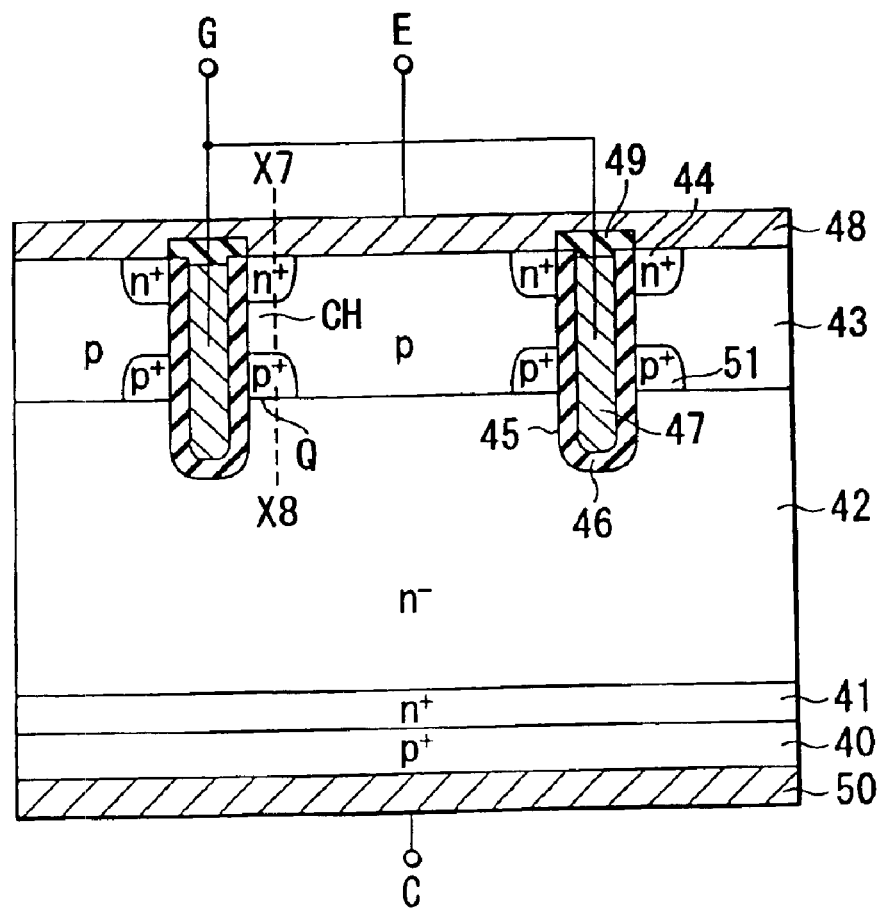
FIG. 5 is a cross sectional view showing a trench IGBT according to a third embodiment of the present invention.

As shown in FIG. 5, a p⁺-type base layer 51 is formed in contact with an n⁻-type base layer 42 and with the trench 45 and only in the vicinity of the trench 45. The other construction is equal to that of each of the first and second embodiments described previously and, thus, the description thereof is omitted.

In the construction shown in FIG. 5, the impurity concentration profile along the line X7–X8, i.e., along the n⁺-type emitter layer 44, the channel region CH, and the n⁻-type base layer 42, is equal to that shown in FIG. 3B, 4E or 4G.

Also, the operation of the IGBT shown in FIG. 5 is basically equal to that of the IGBT according to each of the first and second embodiments described previously. To reiterate, since the threshold voltage of the MOSFET is determined by the p⁺-type base layer 51 having a high impurity concentration, the pinch-off phenomenon also takes place in the pinch-off point Q within the p⁺-type base layer 51. In other words, the channel conductance g1 between the emitter layer 44 and the pinch-off point Q is not larger than the channel conductance g2 between the pinch-off point Q and the n⁻-type base layer 42, i.e., g2≧g1. As a result, it is possible to make the collector voltage VCE, at which the pinch-off phenomenon takes place, smaller than that in the prior art as described previously in detail in conjunction with each of the first and second embodiments so as to suppress more effectively the saturation current value. As a result, it is possible to improve the short circuit withstand capability.

Incidentally, the third embodiment is featured in that the p⁺-type base layer 51 having an impurity concentration higher than that in the p⁺-type base layer 43 is formed within the p⁺-type base layer 43. Such being the situation, it is possible to permit the p⁺-type base layer 51 to be present only in the vicinity of the trench 45 in a manner to be isolated from the n-type base layer 42 and in contact with the trench 45. In this case, the impurity concentration profile along the line X7–X8 is as shown in FIG. 4B, FIG. 4D or FIG. 4F.

A power semiconductor element according to a fourth embodiment of the present invention will now be described with reference to FIG. 6, which is a cross sectional view showing a trench IGBT. The trench IGBT according to the fourth embodiment is substantially equal to that according to the first embodiment, except that the trench IGBT of the fourth embodiment is allowed to have a trench contact structure.

Figure 6:
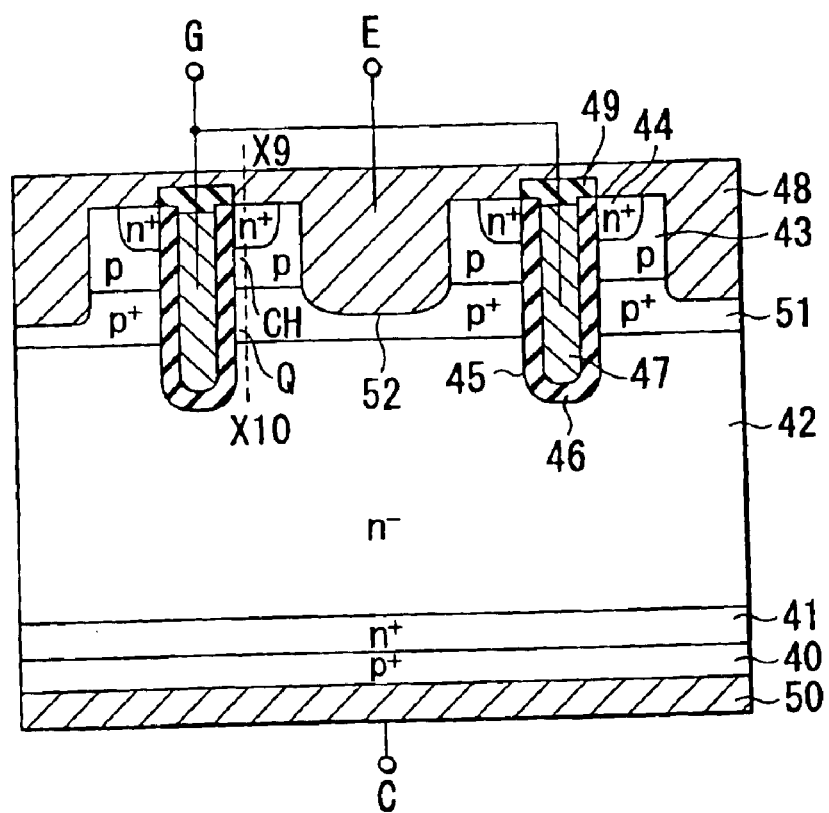
FIG. 6 is a cross sectional view showing a trench IGBT according to a fourth embodiment of the present invention.

As shown in FIG. 6, a trench 52 extending through a p-type base layer 43 in a manner to have the bottom thereof positioned on the surface of or within a p⁺-type base layer 51 is formed between the adjacent trenches 45. Also, an emitter electrode 48 is buried in the trench 52. It should be noted that the emitter electrode 48 is in contact with not only the p-type base layer 43 but also the p⁺-type base layer 51 (trench contact).

Also, in the construction shown in FIG. 6, the impurity concentration profile along the line X9–X10, i.e., along the n⁺-type emitter layer 44, the channel region CH and the n⁻-type base layer 42, is substantially equal to that shown in FIG. 3B, FIG. 4E or FIG. 4G.

The IGBT of the fourth embodiment shown in FIG. 6 also permits making the collector voltage VCE, at which the pinch-off phenomenon is generated, smaller than that in the prior art as in any of the first to third embodiments described above so as to suppress the saturation current value. It follows that it is also possible to improve the short circuit withstand capability in the fourth embodiment.

It should also be noted that it is possible to improve the withstand capability of the IGBT to the latch-up occurrence by employing the trench contact structure. To be more specific, since the emitter electrode 48 is buried to reach a region in contact with the p⁺-type base layer 51, it is possible to suppress the operation of a parasitic transistor performed by the carrier injected into the n⁻-type base layer 42.

In the fourth embodiment, it is also possible to permit the p⁺-type base layer 51 to be present only in the vicinity of the trench 45 in a manner to be isolated from the n-type base layer 42 and in contact with the trench 45, as in the third embodiment. In this case, the impurity concentration profile along the line X9–X10 is substantially equal to that shown in FIG. 4B, FIG. 4D or FIG. 4F.

A power semiconductor element according to a fifth embodiment of the present invention will now be described with reference to FIG. 7, which is a cross sectional view showing a trench IGBT according to the fifth embodiment of the present invention.

As shown in the drawing, the IGBT according to the fifth embodiment of the present invention is substantially equal to that according to the fourth embodiment, except that, in the fifth embodiment, an n⁺-type emitter layer 44 is formed on the entire surface of a p-type base layer 43.

Figure 7:
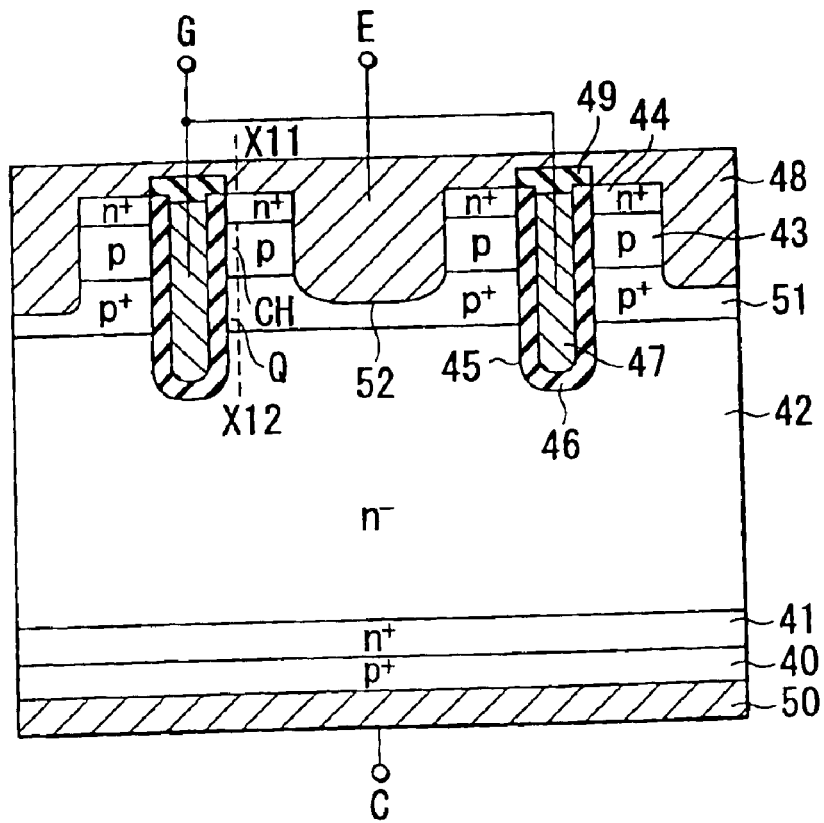
FIG. 7 is a cross sectional view showing a trench IGBT according to a fifth embodiment of the present invention.

In the construction shown in FIG. 7, the impurity concentration profile along the line X11–X12, i.e., along the emitter layer 44, the channel region CH, and the n⁻-type base layer 42 is substantially equal to that shown in FIG. 3B, FIG. 4E or FIG. 4G.

The IGBT of the fifth embodiment shown in FIG. 7 also permits making the collector voltage VCE, at which the pinch-off phenomenon is generated, smaller than that in the prior art as in any of the first to fourth embodiments described above so as to suppress the saturation current value. It follows that it is also possible to improve the short circuit withstand capability in the fifth embodiment.

It should also be noted that the withstand capability of the IGBT to the latch-up occurrence can be improved in the fifth embodiment by employing the trench contact structure as in the fourth embodiment.

Further, in the fifth embodiment, the emitter electrode 48 and the emitter layer 43 are in contact with the side surface of the trench 52, making it possible to increase the contact areas of the trench 52 with the emitter electrode 48 and the emitter layer 43. As a result, the trench distance can be diminished so as to diminish the cell pitch and, thus, to improve the area efficiency of the IGBT.

Incidentally, it is possible to permit the p+-type base layer 51 to be present only in the vicinity of the trench 45 in a manner to be isolated from the n−-type base layer 42 and in contact with the trench 45. In this case, the impurity concentration profile along the line X11–X12 is substantially equal to that shown in FIG. 4B, FIG. 4D or FIG. 4F.

Figure 8A:
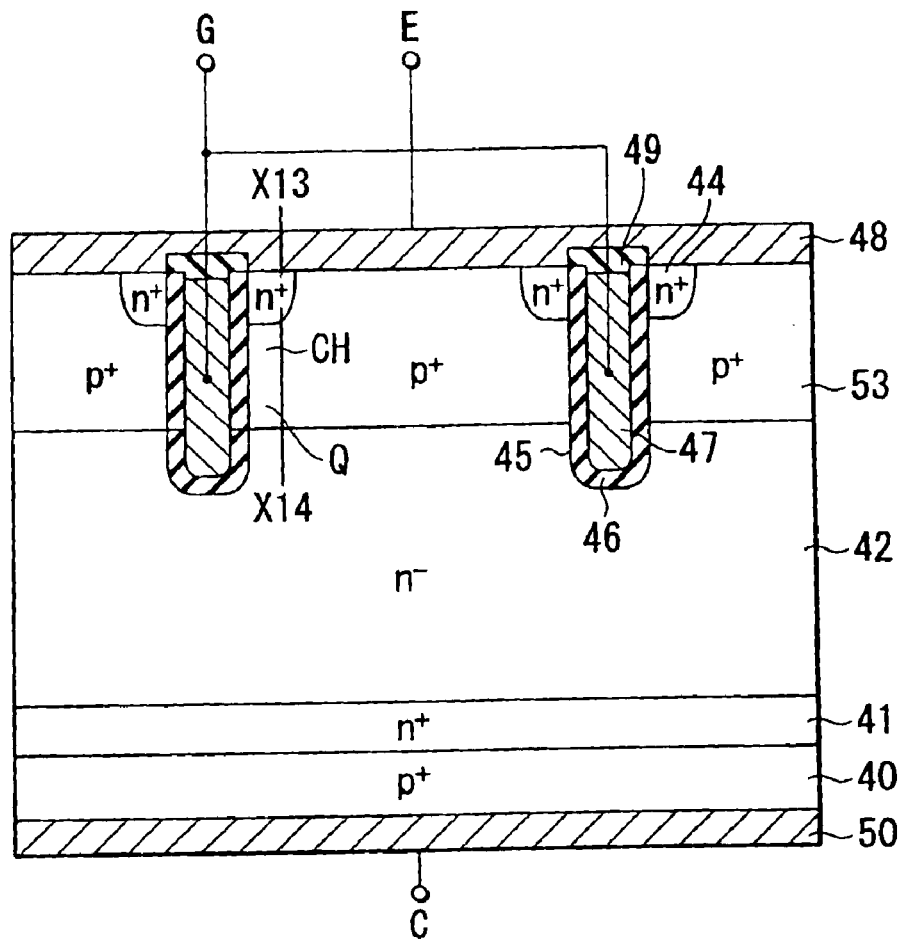
FIG. 8A is a cross sectional view showing a trench IGBT according to a sixth embodiment of the present invention.
Figure 8B:
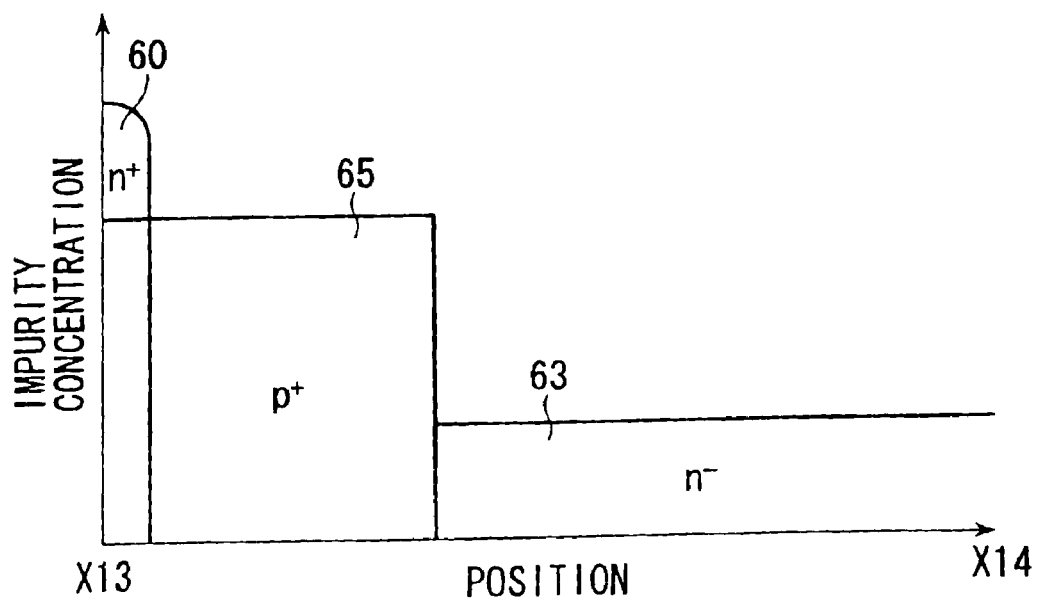
FIG. 8B is a diagram showing the impurity concentration profile in the depth direction of the region ranging between the emitter layer and the n⁻-type base layer along the line X13–X14 shown in FIG. 8A.

A power semiconductor element according to the sixth embodiment of the present invention will now be described with reference to FIGS. 8A and 8B, wherein FIG. 8A is a cross sectional view showing a trench IGBT according to the sixth embodiment of the present invention, and FIG. 8B shows the impurity concentration profile along the line X13–X14 shown in FIG. 8A.

As shown in the drawing, the p-type base layer of the trench IGBT of the sixth embodiment is formed of only a p+-type base layer 53. Also, the impurity concentration distribution 65 of the p+-type base layer 53 is substantially constant in the depth direction.

Since the impurity concentration distribution in the p+-type base layer 53 is substantially constant in the depth direction in the construction shown in FIG. 8A, the threshold voltage of the MOSFET is not dependent on the position of the channel region CH and is constant over the entire channel region CH. Also, since the highest voltage is applied to that portion of the channel region CH which is in contact with the n−-type base layer 42, the pinch-off phenomenon is generated in the particular position. In other words, since it is possible to obtain the function exactly equal to that obtained in the first embodiment, it is possible to improve the short circuit withstand capability in the sixth embodiment, too.

Figure 9A:
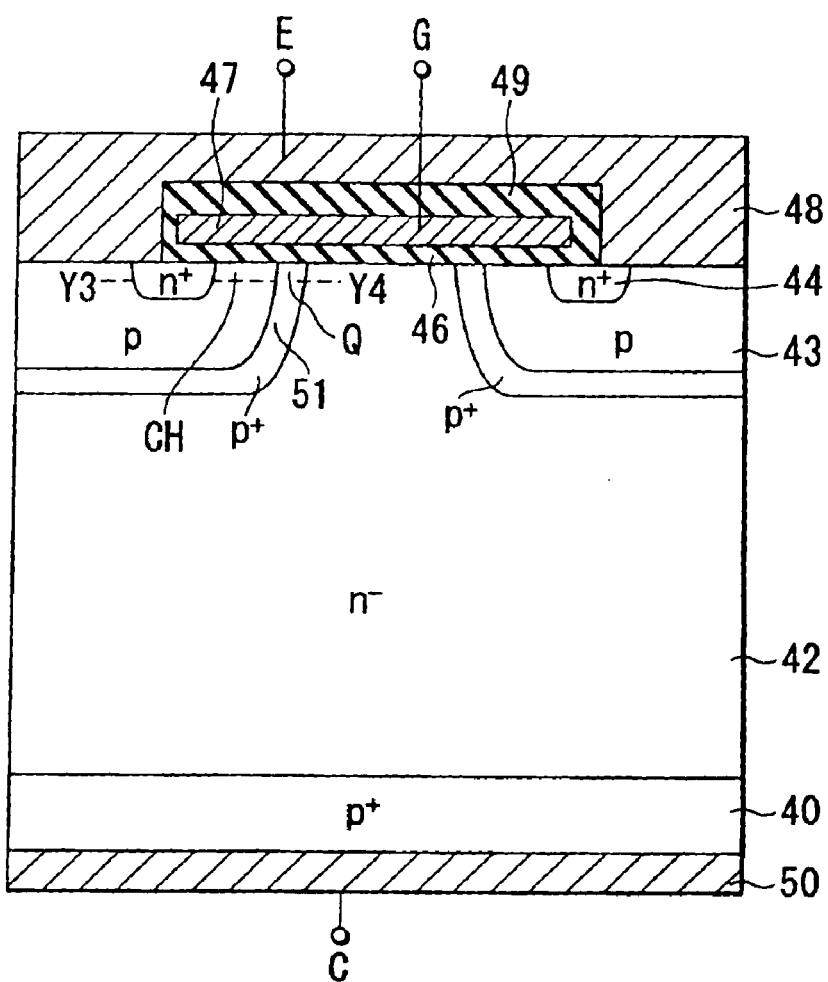
FIG. 9A is a cross sectional view showing a planar IGBT according to a seventh embodiment of the present invention.
Figure 9B:
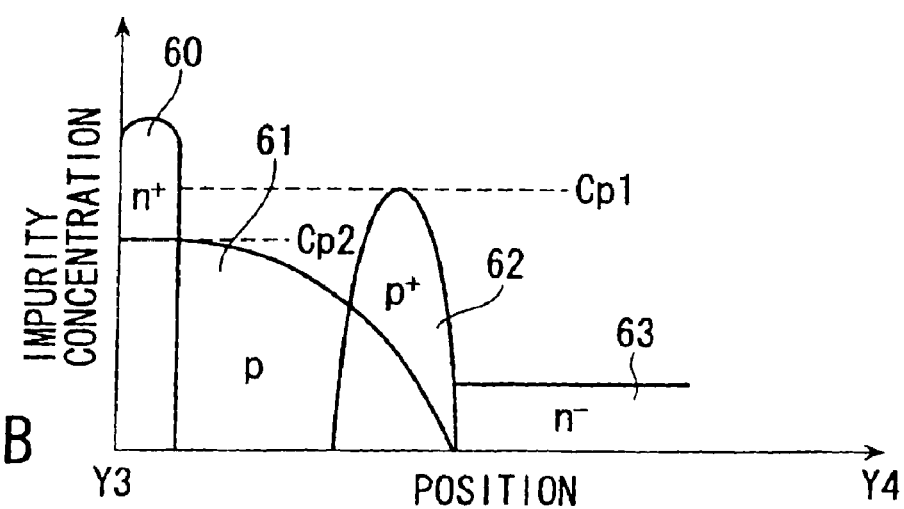
FIG. 9B is a diagram showing the impurity concentration profile in the planar direction of the region ranging between the emitter layer and the n⁻-type base layer along the line Y3–Y4 shown in FIG. 9A.

A power semiconductor element according to the seventh embodiment of the present invention will now be described with reference to FIGS. 9A and 9B, wherein FIG. 9A is a cross sectional view showing a planar IGBT according to the seventh embodiment of the present invention, and FIG. 9B shows the impurity concentration distribution along the line Y3–Y4 shown in FIG. 9A.

As shown in the drawing, an n−-type base layer 42 is formed on the p+-type collector region 40, and a p-type base layer 43 is formed in a part of the surface region of the n−-type base layer 42. Also, an n+-type emitter layer 44 is formed in a part of the surface region of the p-type base layer 43. Further, a p+-type base layer 51 is formed within the p-type base layer in a manner to contact the n−-type base layer 42. It should be noted that a gate insulating film 46 is formed on the base layers 42, 43, and 51 positioned between the adjacent emitter layers 44, and a gate electrode 47 is formed on the gate insulating layer 46. An emitter electrode 48 is formed on the other region. The emitter electrode 48 thus formed is electrically insulated from the gate electrode 47 by the insulating film 49. Further, a collector electrode 50 is formed on the back surface of the p+-type collector layer 40 so as to form an IGBT.

Incidentally, it is not absolutely necessary for the p+-type base layer 51 to be in contact with the n−-type base layer 42. It suffices for the p+-type base layer 51 to be present in the vicinity of the n−-type base layer 42.

A MOSFET is formed by the n−-type base layer 42, the p+-type base layer 51, the p-type base layer 43, the n+-type emitter layer 44, the gate insulating film 46 and the gate electrode 47. In this MOSFET, electrons are injected from the emitter layer 44 into the n−-type base layer 42 through the channel region formed in the p-type base layers 43 and 51.

FIG. 9B is a graph relating to the impurity concentration profile along the line Y3–Y4 shown in FIG. 9A and shows the impurity concentration distribution in the active region including the channel region CH. The impurity concentration profile includes the n-type impurity concentration distribution 60 in the emitter layer 64, the p-type impurity concentration distribution 61 in the p-type base layer 43, the p-type impurity concentration distribution 62 in the p+-type base layer 51, and the n-type impurity concentration distribution 63 in the n+-type base layer 42. The position where the p-type impurity concentration in the p-type base layer 43 forms the maximum concentration Cp2 is close to the junction between the emitter layer 44 and the p-type base layer 43, and the p-type impurity concentration is gradually lowered toward the n−-type base layer 42.

The operation of the planar IGBT shown in FIG. 9A will now be described.

When the planar IGBT according to the seventh embodiment shown in FIG. 9A is turned on, the collector voltage VCE is applied between the collector electrode 50 and the emitter electrode 48. At the same time, a predetermined positive gate voltage VGE is applied between the gate electrode 47 and the emitter electrode 48. As a result, an inverted layer (n-type channel), in which the conductivity is inverted from the p-type to the n-type, is formed in the channel region CH of the p-type base layers 43 and 51. Electrons are injected from the emitter electrode 48 into the n−-type base layer 42 through the inverted layer. The electrons thus injected are migrated to reach the p+-type collector layer 40. It should be noted that, since a forward bias is applied across the junction between the p+-type collector layer 40 and the n−-type base layer 42 in this step, holes are injected from the p+-type collector layer 40 into the n−-type base layer 42. Since both electrons and holes are injected into the n−-type base layer 42, modulation of the conductivity takes place within the n−-type base layer 42. As a result, the resistance of the n−-type base layer 42 is markedly lowered so as to turn on the IGBT.

When the IGBT is turned off, a negative voltage relative to the emitter electrode 48 is applied to the gate electrode 47. As a result, the inverted layer is caused to disappear. It follows that the electron injection from the emitter layer 44 into the n-type base layer 42 is stopped. On the other hand, the holes accumulated in the n−-type base layer 42 are partly discharged to the emitter electrode 48 through the p-type base layers 43 and 51, and the remaining holes are re-combined with the electrons so as to be caused to disappear, thereby turning off the IGBT.

Where the load is short-circuited in the IGBT having the construction and operation as described above, the power source voltage is applied to the collector electrode 50 when the IGBT is under the conductive state. In this case, a short circuit peak current $I_{cp}$ flows through the IGBT, with the result that the IGBT is broken down a certain time tsc later. The time between the short-circuiting of the load and the breakdown of the IGBT is called herein the short circuit withstand capability tsc. It has been confirmed that the short circuit withstand capability tsc is diminished with increase in the short circuit peak current $I_{cp}$ of the IGBT because of the thermal breakdown caused by the short circuit peak current.

The planar IGBT according to the seventh embodiment of the present invention permits diminishing the saturation current value while maintaining the static characteristics of the collector current of the conventional IGBT. As a result, it is possible to increase the short circuit withstand capability. The reason for the improvement of the short circuit withstand capability is as follows.

Specifically, in general, if the collector voltage VCE of the IGBT under the on-state is further increased, the potential of the channel region CH of the p-type base layer is also increased, with the result that the difference between the gate potential and the base potential is made smaller than the threshold voltage of the MOSFET. Particularly, since the threshold voltage is increased in the region near the emitter layer having a high impurity concentration, the phenomenon described above is rendered prominent, thereby making it impossible to maintain the inverted layer. As a result, the channel region is depleted (pinch-off) and the resistance of the channel region is rendered infinitely high so as to permit the current of the IGBT to be saturated. In the prior art, the pinch-off takes place in the region near the emitter layer where the p-type impurity has the highest concentration.

In the IGBT according to the seventh embodiment of the present invention, the threshold voltage is determined by the portion of the $p^+$-type base layer 51 having an impurity concentration higher than that in the p-type base layer 43 and, thus, the pinch-off phenomenon takes place in the $p^+$-type base layer 51 having a high impurity concentration. It should be noted that the $p^+$-type base layer 51 is positioned deeper than the junction between the emitter layer 44 and the p-type base layer 43. As a result, the voltage distribution in the longitudinal direction of the channel region CH is rendered equal to that shown in FIG. 3C described previously in conjunction with the first embodiment. As described above, in the planar IGBT according to the seventh embodiment of the present invention, the voltage drop caused by the resistance of the channel region CH is removed by setting the pinch-off point Q within the $p^+$-type base layer 51 having a high impurity concentration. In other words, the channel conductance g1 between the pinch-off point Q within the $p^+$-type base layer 51 and the $n^+$-type emitter layer 44 is made not larger than the channel conductance g2 between the pinch-off point Q and the $n^-$-type base layer 42, i.e., the relationship $g2 \geq g1$ is established, in contrast to the relationship $g2 < g1$ in the conventional structure. As a result, it is possible to make the collector voltage VCE, at which the pinch-off is generated, lower than that in the prior art as in each of the embodiments described previously. It follows that it is possible to diminish the saturation current value so as to improve the short circuit withstand capability.

Figure 10A:
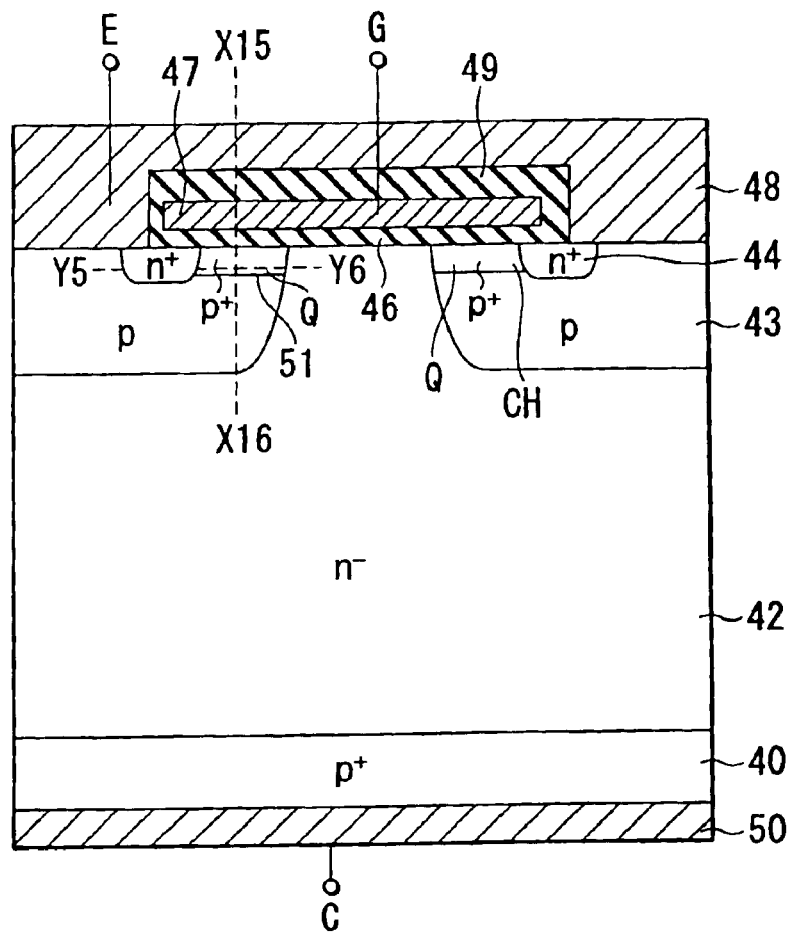
FIG. 10A is a cross sectional view showing a planar IGBT according to a eighth embodiment of the present invention.

A power semiconductor element according to the eighth embodiment of the present invention will now be described with reference to FIGS. 10A to 10C, wherein FIG. 10A is a cross sectional view showing a planar IGBT according to the eighth embodiment of the present invention, FIG. 9B is a graph showing the impurity concentration profile in the depth direction along the line X15–X16 shown in FIG. 10A, and FIG. 9C is a graph showing the impurity concentration profile in the longitudinal direction of the channel region along the line Y5–Y6 shown in FIG. 10A.

The IGBT according to the eighth embodiment of the present invention is substantially equal to the IGBT according to the seventh embodiment, except that, in the eighth embodiment, a $p^+$-type base layer 51 is formed on the entire surface of the p-type base layer 43 sandwiched between the $n^+$-type emitter layer 44 and the $n^-$-type base layer 42 and in contact with the gate insulating film 46.

Figure 10B:
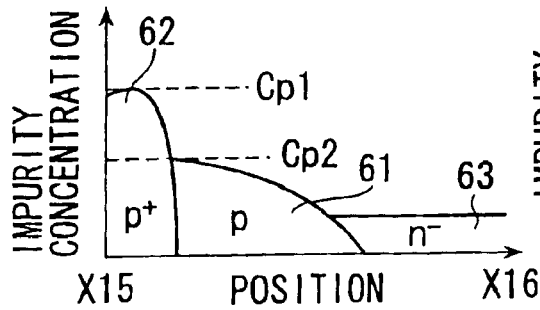
FIG. 10B is a diagram showing the impurity concentration profile in the depth direction of the region ranging between the emitter layer and the n⁻-type base layer along the line X15–X16 shown in FIG. 10A.
Figure 10C:
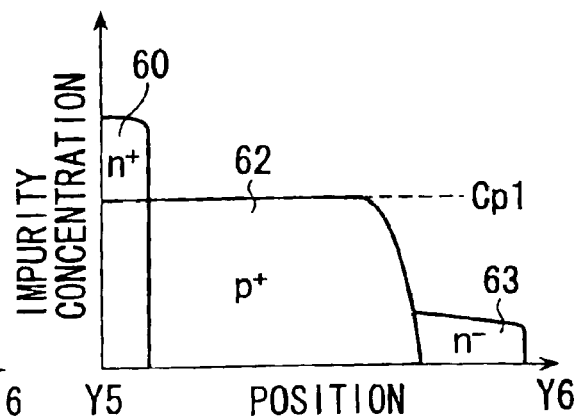
FIG. 10C is a diagram showing the impurity concentration profile in the planar direction of the region ranging between the emitter layer and the n⁻-type base layer along the line Y5–Y6 shown in FIG. 10A.

The impurity concentration profile in the depth direction of the region ranging between the $p^+$-type base layer 51 and the $n^-$-type base layer is as shown in FIG. 10. Also, the impurity concentration profile in the longitudinal direction of the channel region ranging between the $n^+$-type emitter layer 44 and the $n^-$-type base layer 42 is as shown in FIG. 10C. The impurity concentration profiles shown in FIGS. 10B and 10C include the n-type impurity concentration distribution 60 in the $n^+$-type emitter layer 44, the p-type impurity concentration distribution 61 in the p-type base layer 43, the p-type impurity concentration distribution 62 in the $p^+$-type base layer 51, and the n-type impurity concentration distribution 63 in the $n^-$-type base layer 52. The maximum impurity concentration in the $p^+$-type base layer 51 is denoted by Cp1, and the maximum impurity concentration in the p-type base layer 43 is denoted by Cp2.

In the MOSFET shown in FIG. 10A, which is formed of the $n^-$-type base layer 42, the $p^+$-type base layer 51, the p-type base layer 43, the $n^+$-type emitter layer 44, the gate insulating film 46 and the gate electrode 47, a channel region CH is formed in the $p^+$-base layer 51. The $p^+$-type base layer 51 in which the channel region is formed has an impurity concentration higher than that in the adjacent p-type base layer 43 and has a constant impurity distribution in the longitudinal direction of the channel region. As a result, the pinch-off phenomenon takes place in the junction portion between the $p^+$-type base layer 51 and the $n^-$-type base layer 42. It follows that the voltage distribution in the channel region CH in the longitudinal direction of the channel region CH is equal to the distribution shown in FIG. 3C described previously in conjunction with the first embodiment. What should be noted is that, in the planar IGBT according to this embodiment, the voltage drop V(pin-ch) caused by the resistance in the channel region CH is removed by setting the pinch-off point Q within the $p^+$-type base layer 51 having a high impurity concentration. In other words, the channel conductance g1 between the pinch-off point Q of the $p^+$-type base layer 51 and the $n^+$-type emitter layer 44 is not larger than the channel conductance between the pinch-off point Q and the $n^-$-type base layer 42, i.e., the relationship of $g2 \geq g1$ is established in contrast to the relationship of $g2 < g1$ in the prior art. As a result, it is possible to make the collector voltage VCE, at which the pinch-off phenomenon takes place, lower than that in the prior art, as in each of the embodiments described previously. It follows that the saturation current value can be diminished so as to improve the short circuit withstand capability.

A power semiconductor element according to a ninth embodiment of the present invention will now be described with reference to FIG. 11A, which is a cross sectional view showing a lateral IGBT.

As shown in the drawing, an $n^-$-type base layer 42 is formed on one surface of a $p^+$-type semiconductor substrate layer 54. An $n^+$-type buffer layer 41 and a p-type base layer 43 are selectively formed separately from each other in the surface of the $n^-$-type base layer 42. Also, a $p^+$-type collector layer 40 is formed in the surface of the $n^+$-type buffer layer 41, and an $n^+$-type emitter layer 44 is formed in the surface of the p-type base layer 43. Further, a $p^+$-type base layer 51 having an impurity concentration higher than that in the p-type base layer 43 is formed in that region of the surface of the p-type base layer 43 which is in contact with the $n^-$-type base layer 42. Incidentally, it is not absolutely necessary for the $p^+$-type base layer 51 to be in contact with the $n^-$-type base layer 42 as far as the $p^+$-type base layer 51 is positioned in the vicinity of the $n^-$-type base layer 42.

Further, a gate insulating film 46 is formed on the surfaces of the p-type base layers 43, 51, the $n^-$-type base layer 42 and the $n^+$-type buffer layer 41, which are positioned between the p+-type collector region 40 and the n+-type emitter region 44. A gate electrode 47 is formed on the gate insulating film 46, and the gate electrode 47 is covered with an insulating film 49. Also formed is an emitter electrode 44 that is in contact with the n+-type emitter layer 44 and the p-type base layer 43 via a contact hole formed in the insulating film 49. Further, a collector electrode 50 is formed on the p+-type collector layer 40, and an emitter electrode 55 is formed on the back surface of the p+-type substrate layer 54.

Incidentally, the gate electrode 47 is electrically separated from the emitter electrode 48, the collector electrode 50, the n−-type base layer 42 and the p-type base layer 43 by the gate insulating film 46 and the insulating film 49.

A MOSFET is formed of the n−-type base layer 42, the p+-type base layer 51, the p-type base layer 43, the emitter layer 44, the gate insulating film 46 and the gate electrode 47. In this case, electrons are injected from the emitter layer 44 into the n−-type base layer 42 through the channel region CH formed in the contact region of the p+-type and p-type base layers 51, 43 with the gate insulating film 46.

Figure 11A:
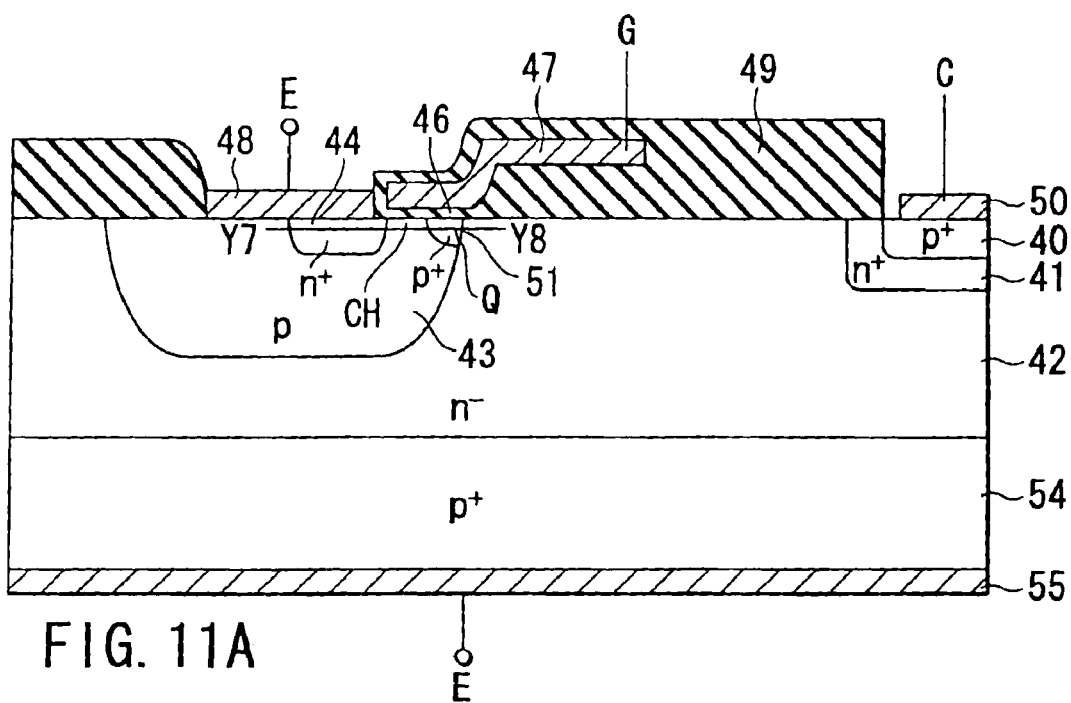
FIG. 11A is a cross sectional view showing a lateral IGBT according to a ninth embodiment of the present invention.
Figure 11B:
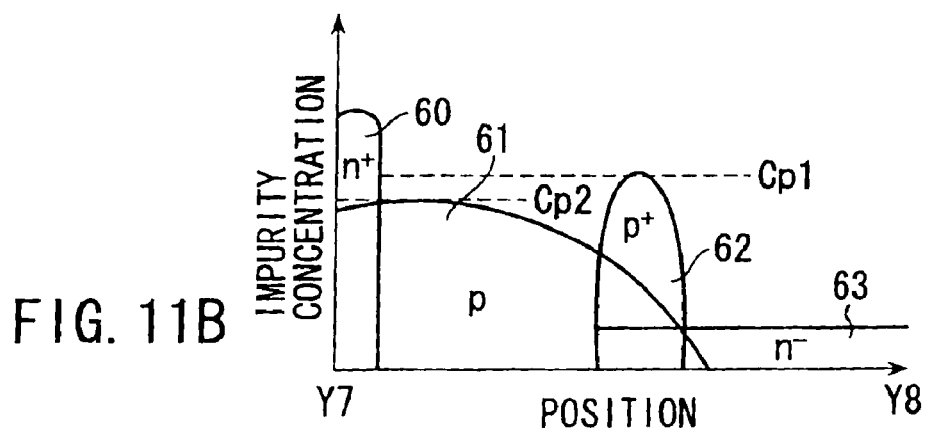
FIGS. 11B and 11C are diagrams each showing the impurity concentration profile in the planar direction of the region ranging between the emitter layer and the n⁻-type base layer along the line Y7–Y8 shown in FIG. 11A.

FIG. 11B is a graph relating to the impurity concentration profile along the line Y7–Y8 shown in FIG. 11A and denotes the impurity concentration distribution in the active region including the channel region CH. The impurity concentration profile shown in FIG. 11A includes the n-type impurity concentration distribution 60 in the emitter layer 44, the p-type impurity concentration distribution 61 in the p-type base layer 43, the p-type impurity concentration distribution 62 in the p+-type base layer 51, and the n-type impurity concentration distribution 63 in the n−-type base layer 42. As shown in the drawing, the maximum concentration Cp1 of the p-type impurity concentration within the p-type base layers (43, 51), which is positioned within the p+-type base layer 51, resides in the vicinity of the junction portion between the p+-type base layer 43 and the n−-type base layer, not in the vicinity of the junction portion between the emitter layer 44 and the p-type base layer 43.

The operation of the trench IGBT shown in FIG. 11A will now be described.

The operation of the lateral IGBT is basically equal to that of the trench IGBT described previously in conjunction with the first embodiment, except that, in the lateral IGBT, electrons and holes flow in the lateral direction into the p+-type collector layer 40 formed flush with the emitter layer 44, the p-type base layer 43 and the p+-type base layer 51, though electrons and holes flow in the vertical direction in the trench IGBT.

Where the element is under the load short-circuited state, a power source voltage is applied to the collector electrode 50 under the conductive state of the element, as described previously in conjunction with the first embodiment. A pinch-off phenomenon is generated, if the collector voltage VCE of the IGBT under the on-state is increased so as to exceed a certain threshold value. In the prior art, the pinch-off phenomenon takes place in the junction portion of the p-type base layer 43 with the emitter layer 44. In the IGBT according to this embodiment of the present invention, however, the p+-type base layer 51 having a high impurity concentration is formed in the junction portion with the n−-type base layer 42. As a result, the threshold voltage of the MOSFET is determined by the p+-type base layer 51 rather than by the p-type base layer 43, with the result that the pinch-off phenomenon also takes place within the p+-type base layer 51.

Such being the situation, the voltage distribution within the channel region CH in the longitudinal direction of the channel region CH is as shown in FIG. 3C described previously in conjunction with the first embodiment. As described above, in the lateral IGBT according to this embodiment, the voltage drop V(pin-ch) caused by the resistance of the channel region CH is removed by setting the pinch-off point Q within the p+-type base layer 51 having a high impurity concentration. In other words, the channel conductance between the pinch-off point Q within the p+-type base layer 51 and the emitter layer 44 is not higher than the channel conductance g2 between the pinch-off point Q and the n−-type base layer 42, i.e., the relationship of g2≧g1 is established in contrast to the relationship of g2<g1 in the prior art. As a result, it is possible to make the collector voltage VCE, at which the pinch-off phenomenon takes place, lower than that in the prior art, as in each of the embodiments described previously. It follows that the saturation current value can be diminished so as to improve the short circuit withstand capability.

Figure 11C:
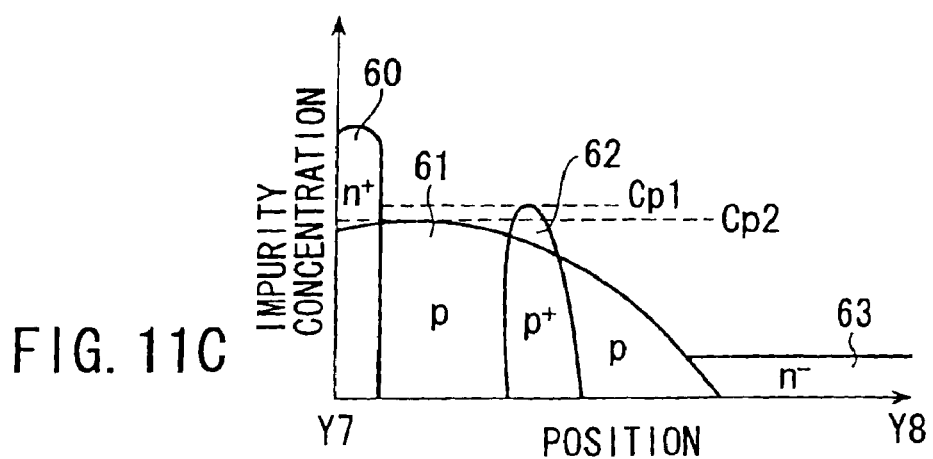

FIG. 11C is a graph relating to another example of the impurity concentration profile and shows the impurity concentration distribution in the case where the p+-type base layer 51 is formed not in contact with the n−-type base layer. Further, it is possible to form the gate portion on the side of the cathode by utilizing a trench, a gate insulating film and a gate electrode filling the trench, and an insulating film formed above the trench for insulating the gate electrode, as in the first embodiment.

A power semiconductor element according to a tenth embodiment of the present invention will now be described with reference to FIG. 12A, which is a cross sectional view of a power MOSFET.

Figure 12A:
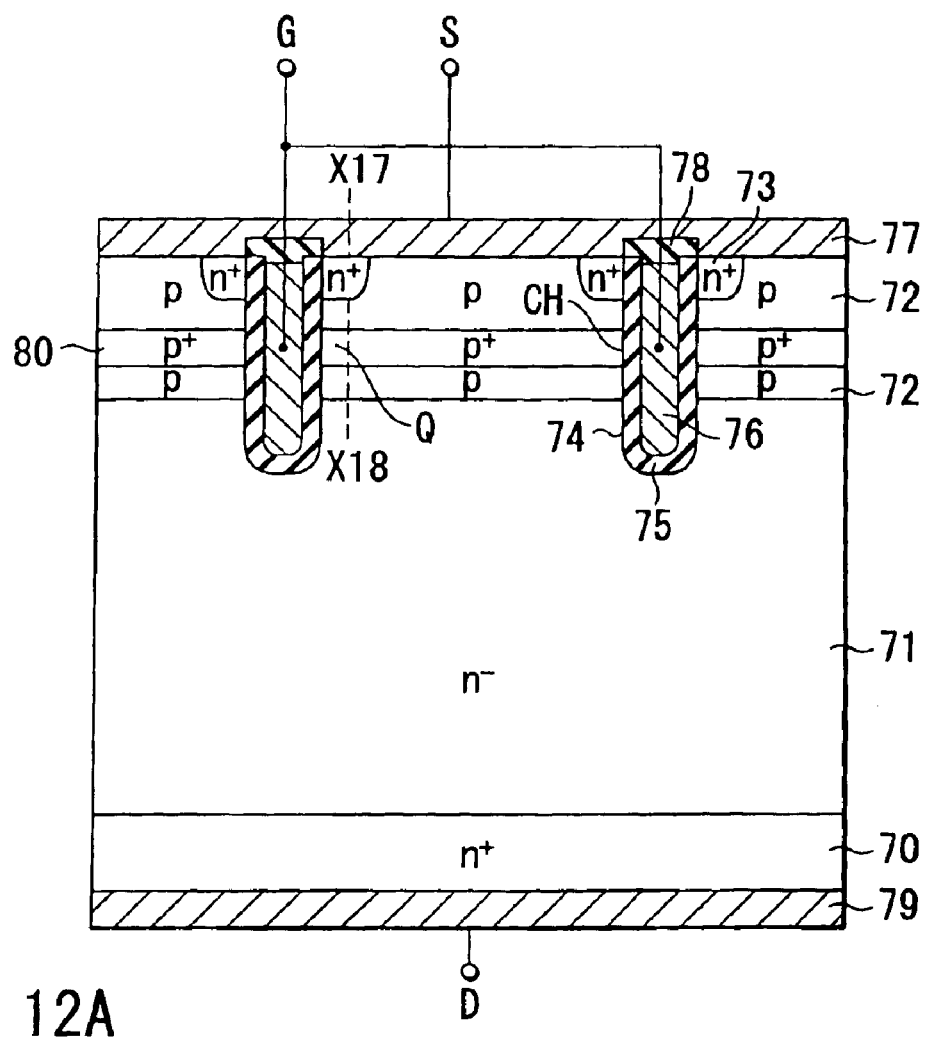
FIG. 12A is a cross sectional view showing a MOSFET according to a tenth embodiment of the present invention.

The construction of the power MOSFET shown in FIG. 12A is substantially equal to that of the trench IGBT described previously in conjunction with the second embodiment of the present invention, except that the p+-type collector layer included in the second embodiment is not included in the embodiment shown in FIG. 12A, that the collector electrode in the second embodiment is converted into the drain electrode in the embodiment shown in FIG. 12, that the emitter layer included in the second embodiment is converted into the source layer in the embodiment shown in FIG. 12, and that the emitter electrode included in the second embodiment is converted into source electrode in the embodiment shown in FIG. 12.

As shown in FIG. 12, an n−-type base layer having a high resistively and a p-type base layer 72 having a low impurity concentration are formed on one surface region of an n+-type drain layer 70. A p+-type base layer 80 having a high impurity concentration is formed within the p-type base layer 72, and an n+-type source layer 73 is selectively formed in a part of the surface region of the p-type base layer 72. Also, formed is a trench 74 extending from the surface of the source layer 73 to reach the n−-type base layer 71 through the source layer 73, the p-type and the p+-type base layers 72, 80 and 72. Further, a gate electrode 76 (trench-gate electrode) covered with a gate insulating film 75 is buried in the trench 74.

Formed on the surfaces of the source layer 73 and the p-type base layer 72 are a source electrode 77 formed of, for example, an aluminum wiring. The source electrode 77 is electrically separated from the gate electrode 76 and serves to achieve short-circuiting between the n-type source layer 73 and the p-type base layer 72. To be more specific, an insulating film 78 is deposited on the p-type base layer 72 and the trench-gate electrode 76, and the source electrode 77 is formed so as to be in contact with both a part of the source layer 73 and a part of the base layer 72 via a contact hole formed in the insulating film 78 for the lead of the source base layers. Further, a drain electrode 79 is formed on the back surface of the n⁺-type drain layer 70, thereby forming a power MOSFET.

In the power MOSFET of the construction described above, electrons are injected from the source layer 73 into the n⁺-type drain layer 70 via the n⁻-type base layer 71. These electrons are allowed to migrate to reach the n⁺-type drain layer 70 through the channel region CH formed in those regions of the p⁺-type and p-type base layers 80, 72 which are in contact with the trench 74.

Figure 12B:
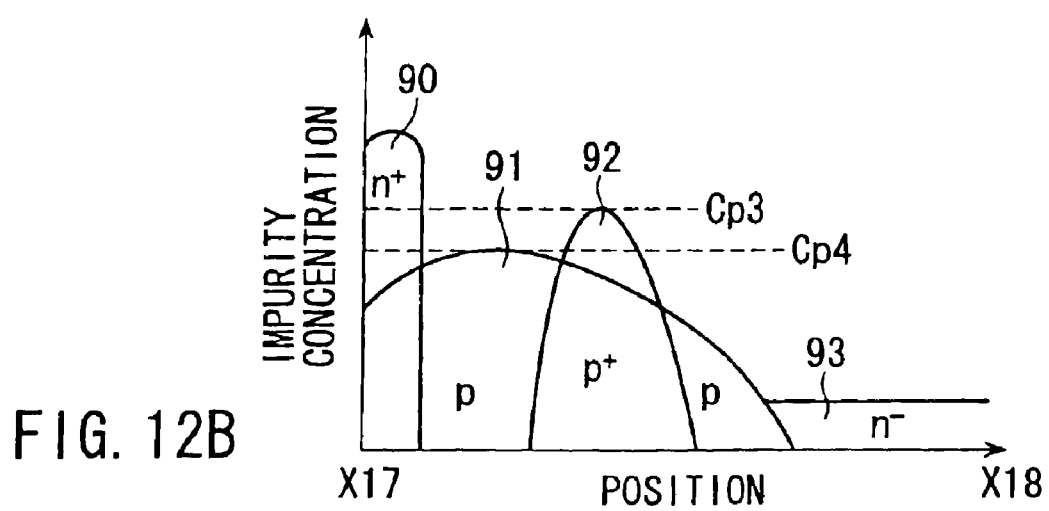
FIGS. 12B and 12C are diagrams each showing the impurity concentration profile in the depth direction of the region ranging between the source layer and the n⁻-type base layer along the line X17–X18 shown in FIG. 12A.

FIG. 12B is a graph relating to the impurity concentration profile along the line X17–X18 shown in FIG. 12A, and shows the impurity concentration distribution in the active region including the channel region CH. The impurity concentration profile includes the n-type impurity concentration distribution 90 in the source layer 73, the p-type impurity concentration 91 in the p-type base layer 72, the p-type impurity concentration distribution 92 in the p⁺-type base layer 80, and the n-type impurity concentration distribution 93 in the n⁻-type base layer 71. As shown in the graph, the maximum concentration Cp3 of the p-type impurity concentration in the p-type base region is formed in a position deeper than the junction between the source layer 73 and the p-type base layer 72 (case 1).

Figure 12C:
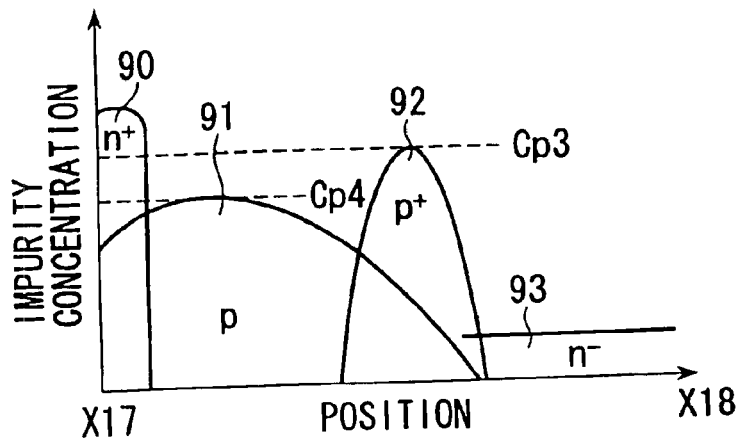

FIG. 12C exemplifies another impurity concentration profile. In this example, the maximum concentration Cp3 of the p-type impurity concentration within the p-type base region is positioned substantially in the vicinity of the boundary between the p-type base region and the n⁻-type base layer (case 2).

The operation of the power MOSFET shown in FIG. 12A will now be described.

When the power MOSFET of the construction shown in FIG. 12A is turned on, a drain voltage VDS is applied between the drain electrode 79 and the source electrode 77. At the same time, a predetermined positive gate voltage VGS is applied between the trench-gate electrode 76 and the source electrode 77. As a result, an inverted layer (n-type channel), in which the conductivity is converted from the p-type to the n-type, is formed in the channel region CH of the p-type base layers 72 and 80. The electrons are migrated through the inverted layer such that the electrons flow from the source electrode 77 to reach the n⁺-type drain layer 70 through the n⁻-type base layer 71.

When the power MOSFET is turned off, a negative voltage relative to the source electrode 77 is applied to the trench-gate electrode 76. As a result, the inverted layer is caused to disappear. It follows that the electron injection from the source layer 73 into the n⁺-type drain layer 70 is stopped.

Under the state that the load is short-circuited in the power MOSFET of the construction and operation described above, a power source voltage is applied to the drain electrode 79 under the conductive state of the MOSFET. If the drain voltage VDS of the MOSFET under the on-state is increased, the voltage in the pinch-off point Q in the channel region of the p⁺-type base layer 80 is increased so as to make the potential difference between the gate potential and the base potential in the pinch-off point Q smaller than the threshold voltage. As a result, it is impossible to maintain the inverted layer so as to bring about the pinch-off phenomenon at the point Q. If the pinch-off phenomenon takes place in the prior art, it is impossible for the gate voltage to control the drain current. As a result, an excessively large drain current flows so as to breakdown the MOSFET. However, the short circuit withstand capability was not sufficient in the prior art.

According to the power MOSFET according to this embodiment of the present invention, however, it is possible to diminish the saturation current value in the event of the load short circuit, with the result that it is possible to increase the short circuit withstand capability. The reason for the improvement in the short circuit withstand capability achieved in the embodiment of the present invention will now be described.

Since the threshold voltage of the MOSFET according to this embodiment of the present invention is determined by the p⁺-type base layer 80 having an impurity concentration higher than that in the p-type base layer 72, the pinch-off phenomenon takes place in the p⁺-type base layer 80. It should be noted that the p⁺-type base layer 80 is positioned deeper than the junction between the source layer 73 and the p-type base layer 72.

Figure 12D:
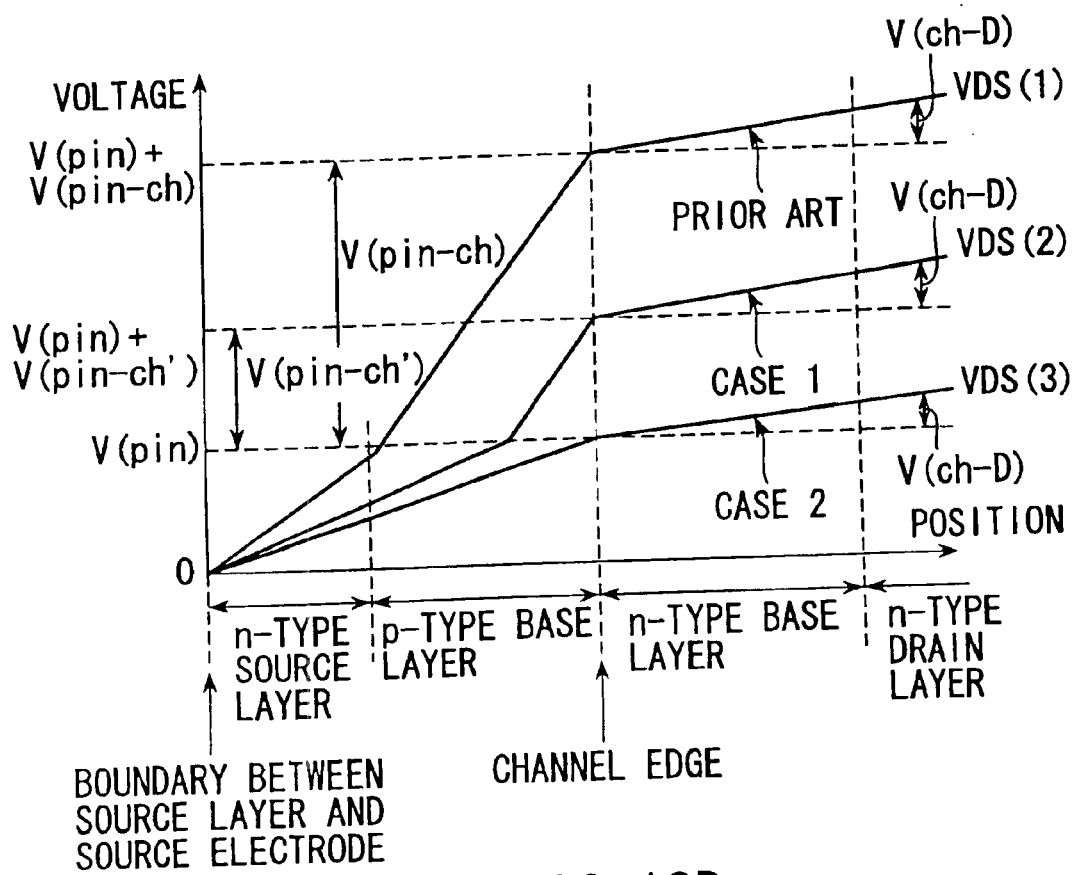
FIG. 12D is a graph showing the voltage distribution in the region ranging between the source layer and the drain layer in the MOSFET shown in FIG. 12A.

As described above, the position where the pinch-off phenomenon is generated is controlled by the arrangement of the p⁺-type base layer 80. The significance of the particular control will now be described with reference to the graph shown in FIG. 12D. In the graph of FIG. 12D, the position in the depth direction on the basis of the boundary between the source electrode and the source layer is plotted on the abscissa. Also, the voltage based on the reference voltage (ground point) at the boundary between the source electrode and the source layer is plotted on the ordinate. The voltage distribution over various regions are plotted in the graph of FIG. 12D in respect of the conventional power MOSFET and the power MOSFET according to this embodiment of the present invention (CASE1, CASE2). Incidentally, the abscissa is plotted simply as a model. In general, the source layer is actually formed very much thinner than the p-type base layer, etc.

As shown in the graph, the drain voltage VDS(1) of the conventional power MOSFET is equal to the sum of the pinch-off voltage V(pin), the voltage V(pin-ch) caused by the resistance of the channel region CH ranging between the pinch-off point and the n-type base layer, and the voltage V(ch-D) between the n-type base layer and the p-type drain layer, i.e., VDS(1)=V(pin)+V(pin-ch)+V(ch-D).

On the other hand, when it comes to the power MOSFET according to this embodiment of the present invention, which has the impurity concentration profile of case 1, the p-type base layer is arranged so as to permit the pinch-off point Q to be positioned closer to the n-type base layer than in the prior art. Also, the voltage drop of V(pin) is generated between the boundary between the source electrode and the source layer and the pinch-off point Q. Also, the voltage drop V(pin-ch') is generated between the pinch-off point Q and the edge of the channel. If follows that the drain voltage VDS(2) is equal to the sum of V(pin), V(pin-ch') and V(ch-D), i.e., VDS(2)=V(pin)+V(pin-ch')+V(ch-D). It should be noted that, since the pinch-off point Q is positioned closer to the n⁻-type base layer than in the prior art, the value of V(pin-ch') is naturally smaller than the value of V(pin-ch) for the prior art. In other words, the relationship of VDS(2)<VDS(1) is established.

When it comes to the power MOSFET for case 2 according to this embodiment of the present invention, the p⁺-base layer having a high impurity concentration is formed in contact with the n-type base layer. Therefore, the pinch-off point Q is positioned in substantially the boundary with the n-type base layer, with the result that it is possible to remove the voltage V(pin-ch) caused by the resistance of the channel region CH between the pinch-off point and the n-type base layer. It follows that the drain voltage VDS(3) is equal to the sum of the voltage V(pin) that is pinched off and the voltage V(ch-D) between the n-type base layer and the p-type drain layer, i.e., VDS(3)=V(pin)+V(ch-D), which is smaller than the collector voltage VDS(1) for the prior art. In other words, the relationship of VDS(3)<VDS(2)<VDS(1) is established in terms of the drain voltages of the conventional power MOSFET and the MOSFETs (cases 1 and 2) according this embodiment of the present invention.

If the drain voltage VDS can be diminished by setting the pinch-off point in a deep position within the p-type base layer, it is possible to diminish the saturation value of the drain current because the saturation value of the collector current of MOSFET is basically changed in proportion to the drain voltage VDS.

In other words, the channel conductance g3 between the pinch-off point Q of the $p^+$-type base layer 80 and the $n^+$-type source layer 73 is not larger than the channel conductance g4 between the pinch-off point Q and the n-type base layer 71. In short, the relationship of g4>g3 is established in the power MOSFET of the embodiment of the present invention in contrast to the relationship of g4<g3 for the prior art. As a result, it is possible to diminish the drain voltage VDS, at which the pinch-off phenomenon is generated, compared with the prior art, so as to diminish the saturation current value and, thus, to improve the short circuit withstand capability of the power MOSFET.

Incidentally, the technical idea of the embodiment of the present invention can also be applied to the case where the n-type drain layer 70 and the drain electrode 79 are formed flush with the n-type source layer 73 and the source electrode 77. Further, it is possible to apply the trench contact structure described previously in conjunction with the examples of IGBT to the MOSFET according to this embodiment of the present invention.

As described above in conjunction with the first to tenth embodiments of the present invention, the embodiment of the present invention makes it possible to improve the short circuit withstand capability of the power semiconductor elements such as IGBT and the power MOSFET without inviting deterioration of the on-voltage characteristics.

The technical idea of the embodiment of the present invention resides in that the pinch-off phenomenon is generated in a position closer to the n-type base layer than in the prior art. It should be noted that it is not absolutely necessary to meet the condition of Cp1>Cp2 in the impurity concentration profile shown in, for example, FIG. 4F. Cp1 can be equal to Cp2, i.e., Cn1=Cp2, or can be smaller than Cp2, i.e., Cp1<Cp2. This is because the MOSFET has a threshold voltage that is lower at a position near the n-type base layer than at the junction between the emitter layer and p-type base layer, (hereinafter, this junction will be referred to as "point J111, shown in FIG. 3A and FIG. 3B.)

In this regard, assume that pinch-off occurs at point J1. Then, the pinch-off voltage V(pin) is Vg+Vth(1), where Vg is the gate voltage and Vth(1) is the threshold voltage. If so, the potential Vth(a) at a position (hereinafter referred to as "point J2", shown in FIG. 3A and FIG. 3B), which is closer to the n-type base layer than the point J1, is V(pin)+V(ch), where V(ch) is the voltage drop that occurs in the p-type base layer. To cause pinch-off at point J2, the condition of V(pin)+V(ch)=Vg−Vth(a) should be satisfied. Thus, the pinch-off voltage V(pin) should be: V(pin)=Vg−(Vth(a)+V(ch)).

The condition of causing pinch-off at both points J2 and J1 is: Vth(1)=Vth(a)+V(ch). This equation indicates the relation of: Vth(a)<Vth(1). The relation means that the threshold voltage Vth(a) at point J2 is lower than the threshold voltage Vth(1) by the voltage drop V(ch) that takes place in the p-type base layer.

The threshold voltage is proportional to the impurity concentration. In view of this, the impurity concentration at point J2 can be lower than the impurity concentration at point J1, by a value that corresponds to the voltage drop V(ch). Even if the impurity concentration at point J2 is lower than that at point J1, the pinch-off occurs at point J2, not point J1, so long as the difference in impurity concentration is less than the value corresponding to the voltage drop V(ch).

In the embodiment of the invention, the impurity concentration at point J2 is Cp1, while the impurity concentration at point J1 is Cp2. Hence, even if Cp1<Cp2, pinch-off can be caused in the region located near the n-type base layer and having the impurity concentration Cp1, not in the region having the impurity concentration Cp2, so long as the difference between Cp1 and Cp2 is less than the value that corresponds to the voltage drop that occurs in the channel region. This is common with all the embodiments of the present invention, i.e., the first to tenth embodiments.

The method of manufacturing the power semiconductor element according to the first embodiment of the present invention will now be described with reference to FIGS. 13A to 13L. FIGS. 13A, 13B, 13D and 13F to 13L are cross sectional views collectively showing the manufacturing process of the trench IGBT. On the other hand, FIGS. 13C and 13E show the impurity concentration profiles in the depth direction along the lines S1–S2 shown in FIGS. 13B and 13D, respectively.

Figure 13D:
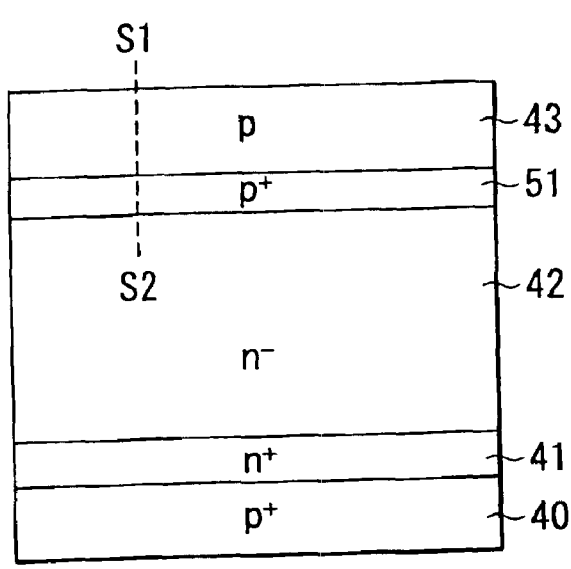
Figure 13E:
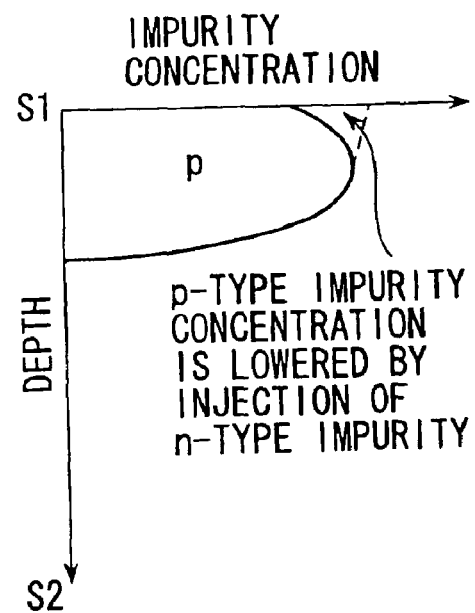

In the first step, an $n^+$-type buffer layer 41 and an $n^-$-type base layer 42 are formed by the epitaxial growth on the surface of a $p^+$-type silicon substrate (collector layer) 40, as shown in FIG. 13A. Then, ions of a p-type impurities such as boron ions are implanted into a surface region of the $n^-$-type base layer 42, followed by thermally diffusing the implanted boron ions, thereby forming a p-type base layer 103, as shown in FIG. 13B. FIG. 13C shows the impurity concentration profile in the p-type base layer 103 thus formed. Then, ions of an n-type impurity such as phosphorus are implanted into a surface region of the p-type base layer 103, followed by thermally diffusing the implanted phosphorus ions. As a result, the p-type impurity and the n-type impurity offset each other in the surface region of the p-type base layer 103 so as to form a p-type base layer 43 having a low impurity concentration in the surface region of the p-type base layer 103 and to form a $p^+$-type base layer 51 having an impurity concentration higher than that in the p-type base layer 43 on the side of the $n^-$-type base layer 42, as shown in FIG. 13D. FIG. 13E shows the impurity concentration profile in the p-type base layers 43 and 51.

Figure 13F:
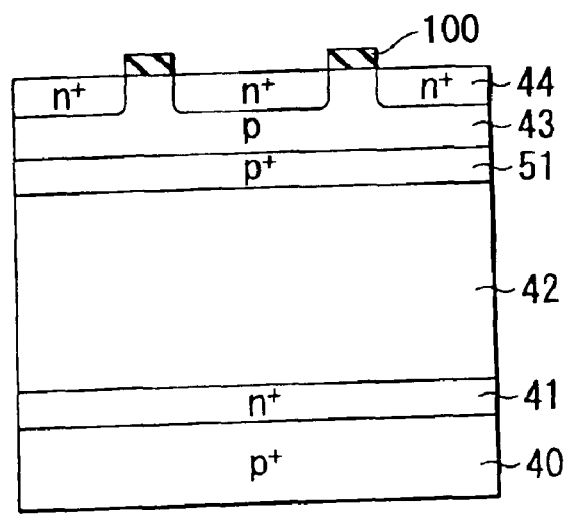

In the next step, a resist layer is laminated on the surface of the p-type base layer 43, followed by forming a resist pattern 100 consisting of a plurality of band-like openings arranged in parallel by the photolithography, as shown in FIG. 13F. Then, $n^+$-type emitter layers 44 are formed by implanting an n-type impurity into the surface region of the p-type base layer 43, with the resist pattern 100 used as a mask, followed by thermally diffusing the implanted n-type impurity.

Figure 13G:
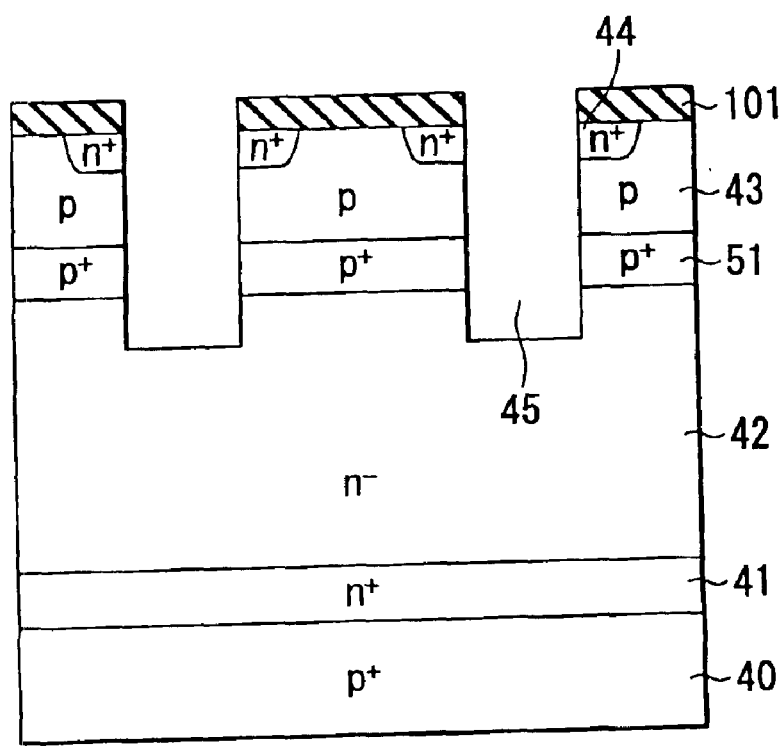

After formation of the emitter layers 44, the resist pattern 100 is removed, followed by forming, for example, an oxide film 101 as a shielding film on the surfaces of the p-type base layer 43 and the emitter layers 44, as shown in FIG. 13G. Then, a mask for the silicon etching having band-like openings narrower than the emitter regions 44 are formed on the surfaces of the n⁺-type emitter layers 44 by using the oxide film 101 thus formed, followed by applying a RIE (Reactive Ion Etching) by using the patterned oxide film 101 as a mask so as to form a trench 45 extending from the surface of the n⁺-type emitter region 44 to reach the n⁻-type base layer 42. After formation of the trench 45, the oxide film 101 is removed by etching.

Figure 13H:
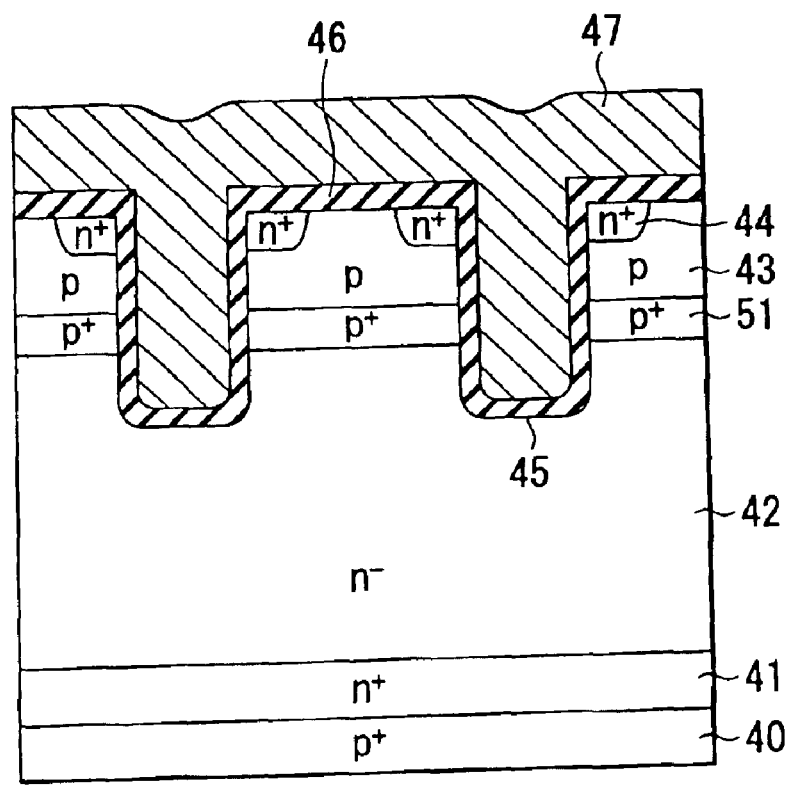
Figure 13I:
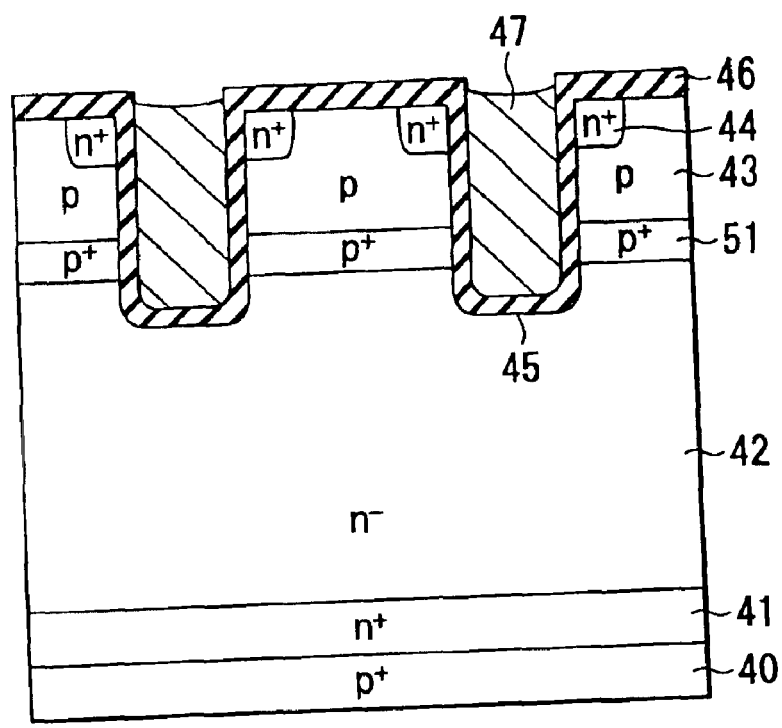

In the next step, a thermal oxide film (gate insulating film) 46 is formed to cover the surfaces of the p-type base layer 43, the emitter regions 44 and the trench 45, as shown in FIG. 13H. Further, a polysilicon layer (gate electrode) 47 doped with an n-type impurity is formed on the oxide film 46 such that the trench 45 is filled with the polysilicon layer 47.

In the next step, a patterning for forming a lead of the trench-gate electrode is applied to the polysilicon layer 47 based a trench-gate lead pattern so as to form a pad (not shown) for the gate electrode contact. Also, the polysilicon layer 47 is etched back to reach an opening portion of the trench 45.

Figure 13J:
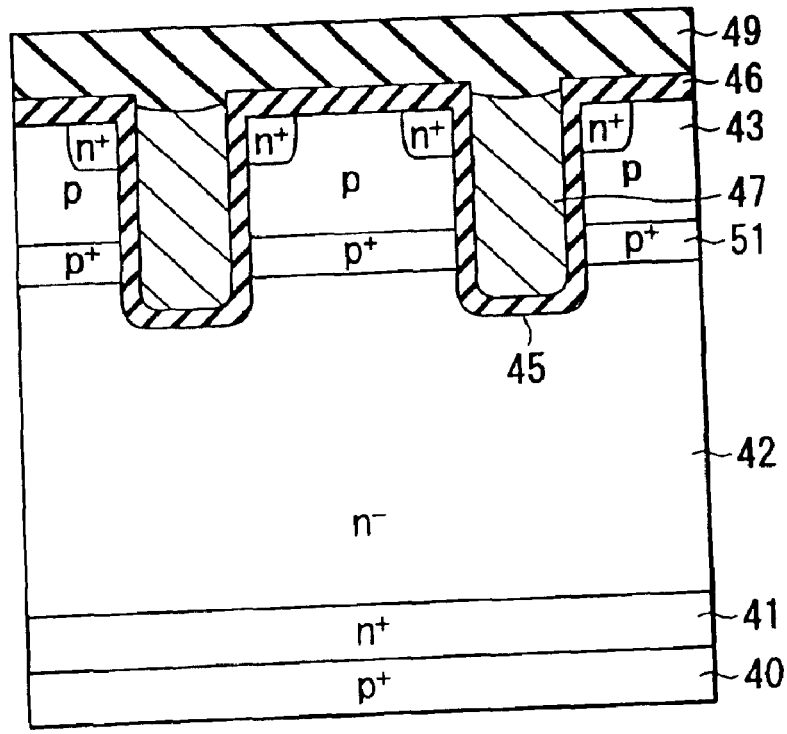
Figure 13K:
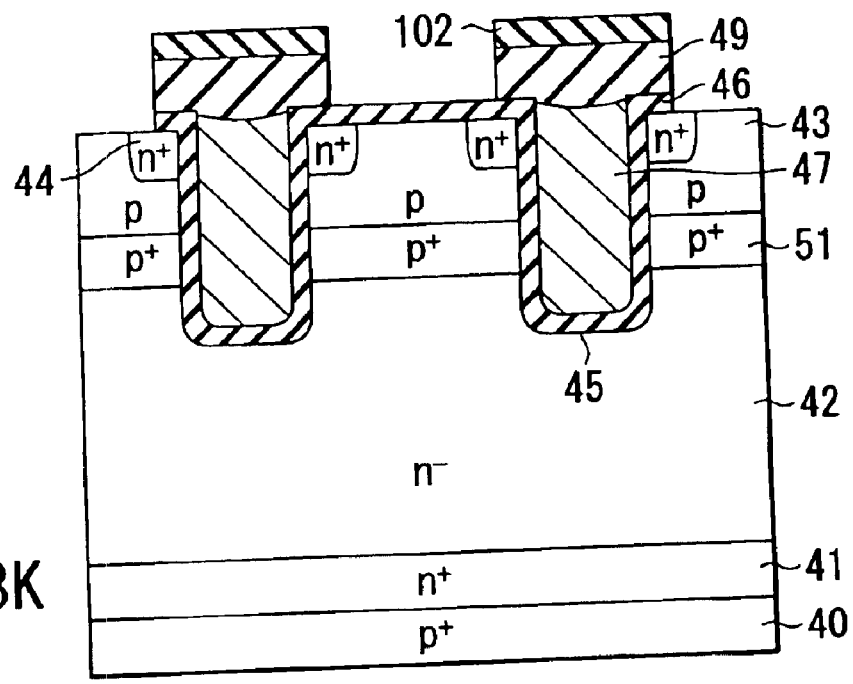

In the next step, an insulating film 49 is formed on the surface of the oxide film 46 covering the p-type base layer 43 and the emitter region 44 and on the surface of the polysilicon layer 47 buried in the trench 45, as shown in FIG. 13J. Then, a resist film is laminated on the surface of the insulating film 49, followed by forming a resist pattern 102 by the photolithography. The resist pattern 102 thus formed covers some portions of the surface of the p-type base layer 43 and the emitter region 44, which are positioned between the adjacent trenches 45, and is provided with band-like openings arranged in parallel to the trenches 45, as shown in FIG. 13K. Then, the insulating film 49 and the oxide film 46 are etched with the resist pattern 102 used as a mask so as to expose the p-type base layer 43 and a part of the emitter region 44 to the outside. At the same time, a pad (not shown) for the gate electrode contact is also exposed to the outside.

Figure 13L:
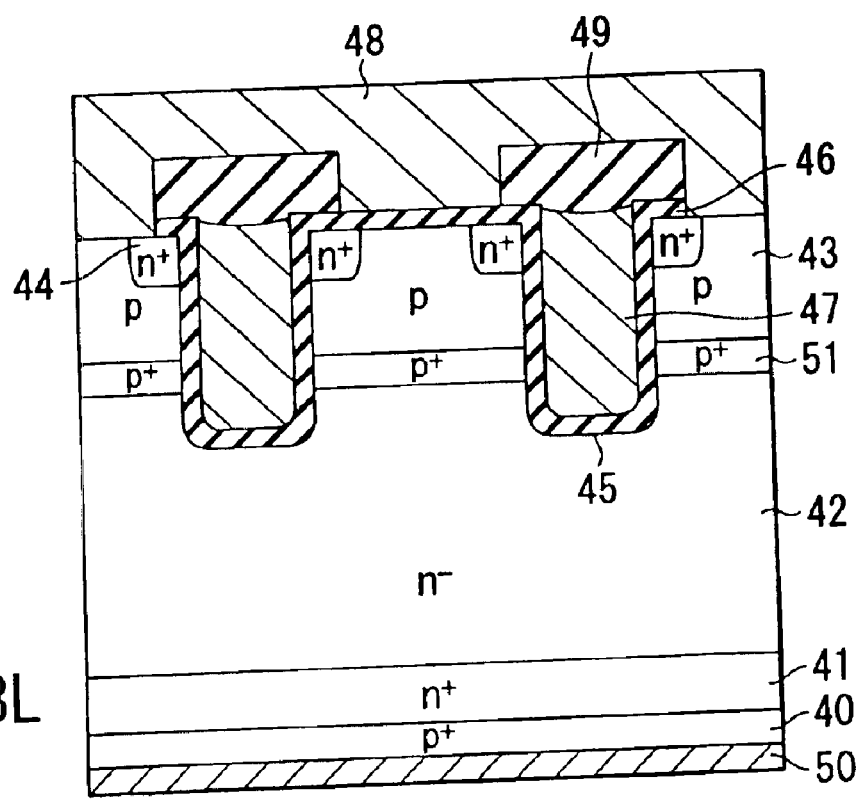

In the next step, an Al—Si (aluminum-silicon) film is formed on the entire surface, followed by patterning the Al—Si film so as to form an emitter electrode 48 in contact with both the p-type base layer 43 and the emitter region 44, which are exposed to the outside in the preceding etching treatment, and a gate electrode wiring (not shown) that is brought into contact with the pad for the gate electrode contact, as shown in FIG. 13L. Further, a collector electrode 50 is formed on the back surface of the p⁺-type silicon substrate 40.

The trench IGBT constructed as shown in FIG. 3A described previously can be formed by the manufacturing method described above.

Figure 14A:
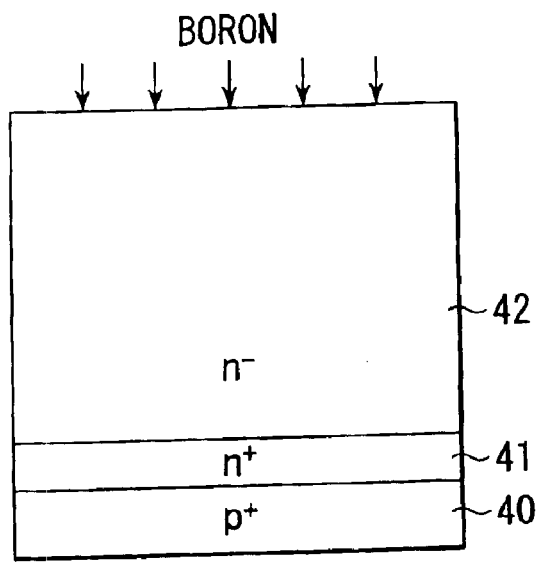
FIGS. 14A, 14B, and 14D are cross sectional views collectively showing the fabricating process of a trench IGBT according to the second embodiment of the present invention.
Figure 14B:
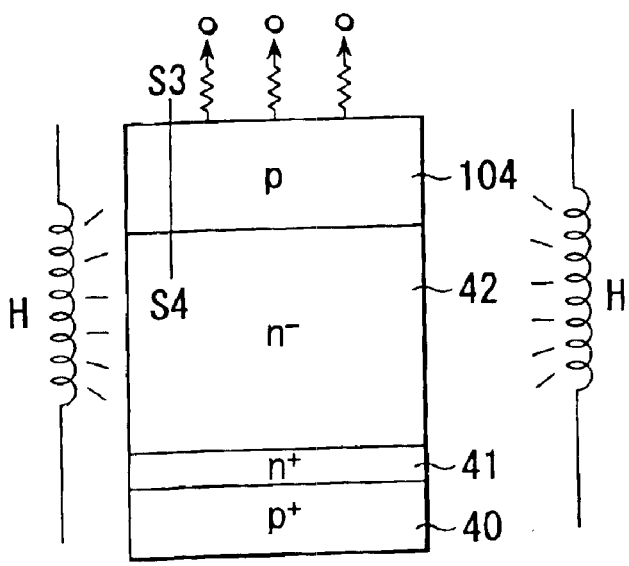
Figure 14C:
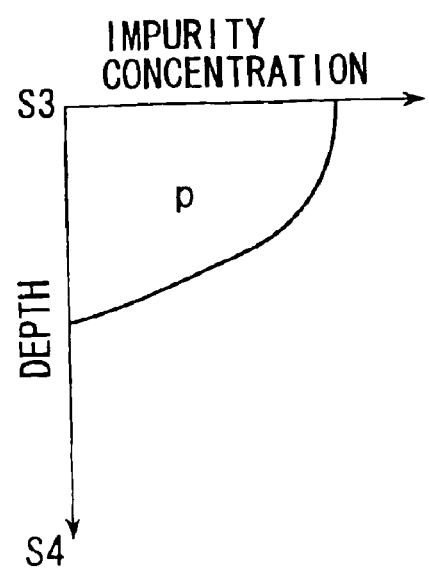
FIGS. 14C and 14E are diagrams showing the impurity concentration profiles in the depth direction along the lines S3–S4 shown in FIGS. 14B and 14D, respectively.
Figure 14D:
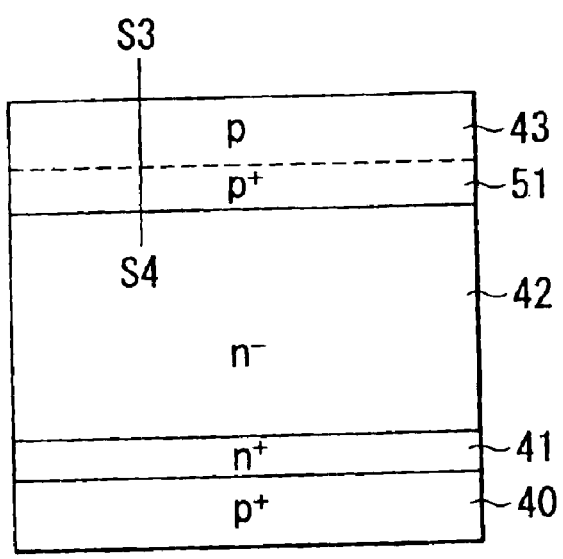
Figure 14E:
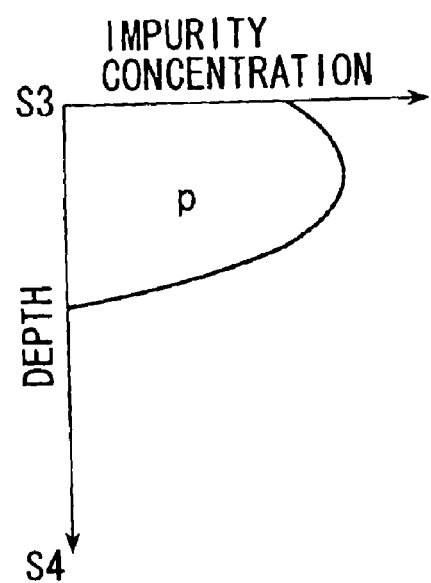

The method of manufacturing a power semiconductor element according to the second embodiment of the present invention will now be described with reference to FIGS. 14A to 14E. FIGS. 14A, 14B and 14D are cross sectional views collectively showing the manufacturing process of the trench IGBT. On the other hand, FIGS. 14C and 14E are graphs showing the impurity concentration profiles in the depth direction along the lines S3–S4 shown in FIGS. 14B and 14D, respectively.

In the first step, an n⁺-type buffer layer 41 and an n⁻-type base layer 42 are formed by the epitaxial growth on a p⁺-type silicon substrate 40, as shown in FIG. 14A. Then, a p-type impurity, e.g., boron, is implanted into a surface region of the n⁻-type base layer 42, followed by thermally diffusing the implanted born impurity so as to form a p-type base layer 104, as shown in FIG. 14B. FIG. 14C shows the impurity concentration profile in the p-type base layer 104.

If a thermal diffusion is applied by using a heat source H under, for example, an $N_2$ or $O_2$ atmosphere, an out-diffusion of the p-type impurity is generated within the p-type base layer 104. As a result, the p-type impurity concentration is lowered in the vicinity of the surface of the p-type base layer 104, and the p-type impurity is distributed to have a peak concentration on the side of the n⁻-type base layer 42, thereby forming a p-type base layer 43 and a p⁺-type base layer 51, as shown in FIG. 14D. FIG. 14E shows the impurity concentration profile in the p-type base layer 43 and the p⁺-type base layer 51.

The manufacturing steps as in the first embodiment are followed in the subsequent steps so as to manufacture the trench IGBT as shown in FIG. 3A.

The manufacturing method of the power semiconductor element according to the third embodiment of the present invention will now be described with reference to FIGS. 15A to 15F, which are cross sectional views collectively showing the manufacturing process of a trench IGBT having a trench contact structure.

Figure 15A:
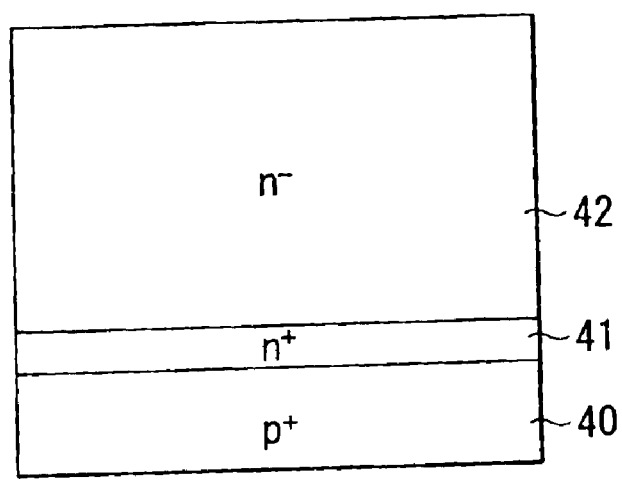
FIGS. 15A to 15F are cross sectional views collectively showing the fabricating process of a trench IGBT according to the third embodiment of the present invention.
Figure 15B:
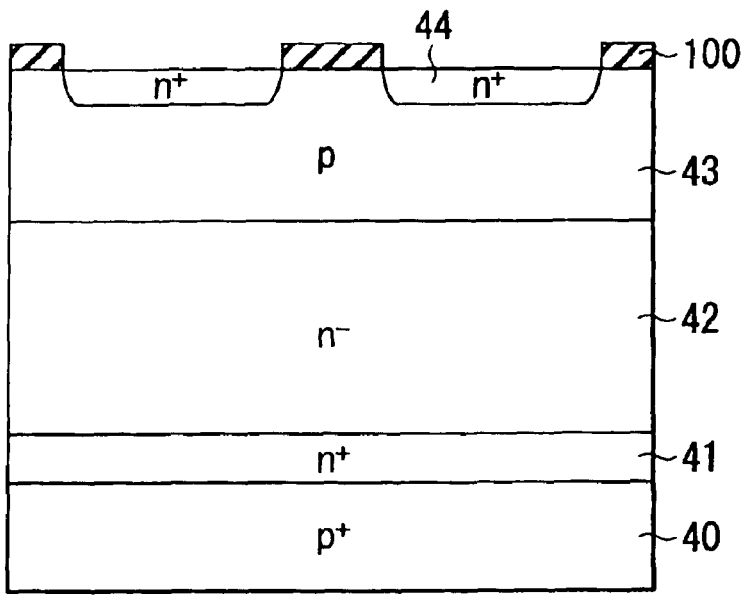

In the first step, an n⁺-type buffer layer 41 and an n⁻-type base layer 42 are formed by the epitaxial growth on a p⁺-type silicon substrate 40, as shown in FIG. 15A. Then, a p-type impurity, e.g., boron, is implanted into a surface region of the n⁻-type base layer 42, followed by thermally diffusing the implanted born impurity so as to form a p-type base layer 43, as shown in FIG. 15B.

Figure 15C:
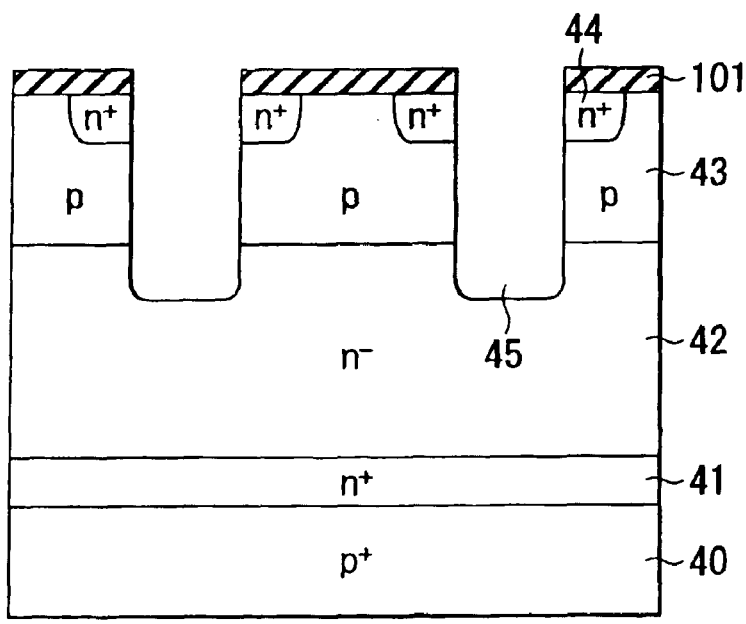
Figure 15D:
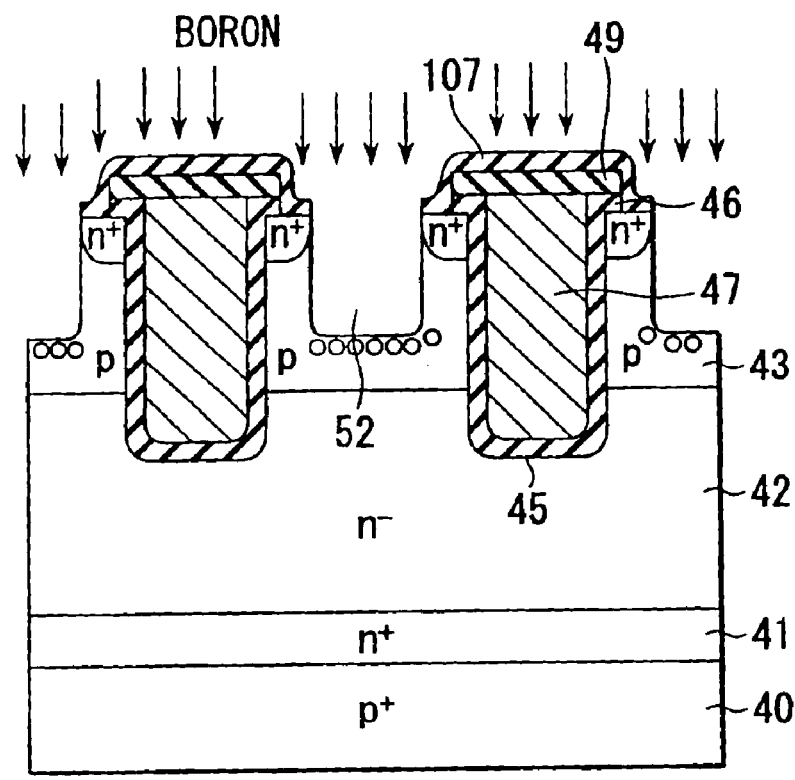

In the next step, the manufacturing steps described previously in conjunction with FIGS. 13F to 13K are carried out. Specifically, as shown in FIGS. 15B to 15D, an n⁺-type emitter layer 44 is formed by using a mask 100 and, then, a trench 45 is formed by using a mask 101. Further, a thermal oxide film 46 is formed, and a polysilicon layer 47 doped with an n-type impurity is buried in the trench 45. Still further, the deposited polysilicon layer 47 is etched back to reach an opening portion of the trench 45, and a pad (not shown) for the gate electrode contact is formed, followed by laminating an insulating film 49. Then, the insulating film 49 and the oxide film 46 are patterned by etching, followed by forming an oxide film pattern 107 on the surface.

Figure 15E:
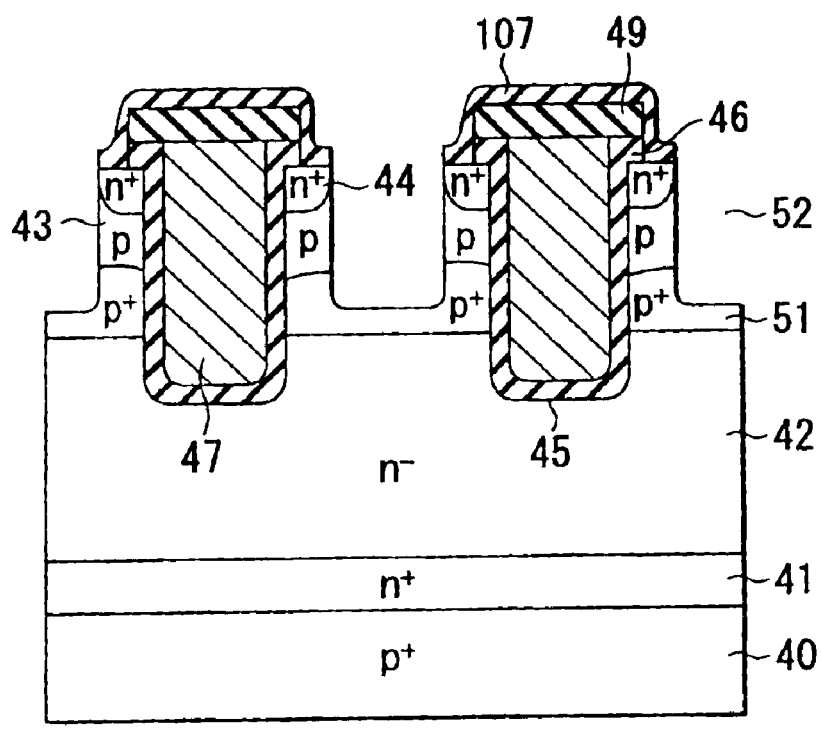

In the next step, a trench 52 having the bottom portion positioned in the intermediate portion of the p-type base layer 43 is formed by using the oxide film pattern 107 as a mask, and ions of a p-type impurity such as boron are implanted through the trench 52, followed by applying a thermal diffusion treatment so as to form a p⁺-type base layer 51, as shown in FIG. 15E. In this case, the time, temperature, etc. are controlled so as to form the p⁺-type base layer 51 in a manner to extend to reach the channel region CH.

Figure 15F:
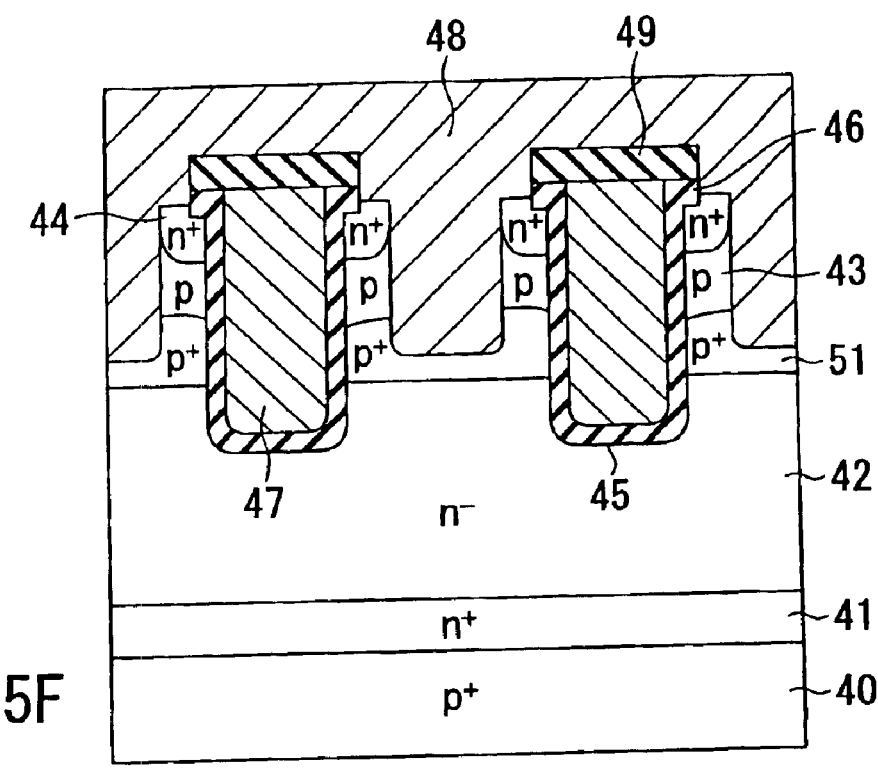

In the next step, the oxide film pattern 107 is removed, followed by forming an Al—Si film on the entire surface and subsequently patterning the Al—Si film so as to form an emitter electrode 48 and a gate electrode wiring (not shown), as shown in FIG. 15F. The emitter electrode 48 is in contact with the upper surface of the emitter region 44 and with the p-type base layer 43 and the p⁺-type base layer 51 within the trench 52. Further, a collector electrode (not shown) is formed on the back surface of the p⁺-type silicon substrate 40.

In forming the trench 52 for the trench contact, it was customary to form a trench only slightly deeper than the emitter layer 44. In this embodiment, however, formed is a trench considerably deeper than that in the prior art. In the trench contact, the degree of improvement in the short circuit withstand capability is increased with increase in the depth of the trench.

The trench IGBT as shown in FIG. 6 can be manufactured by the manufacturing method described above.

The manufacturing method of the power semiconductor element according to the fourth embodiment of the present invention will now be described with reference to FIGS. 16A to 16F, which are cross sectional views collectively showing the manufacturing process of a trench IGBT having a trench contact.

Figure 16A:
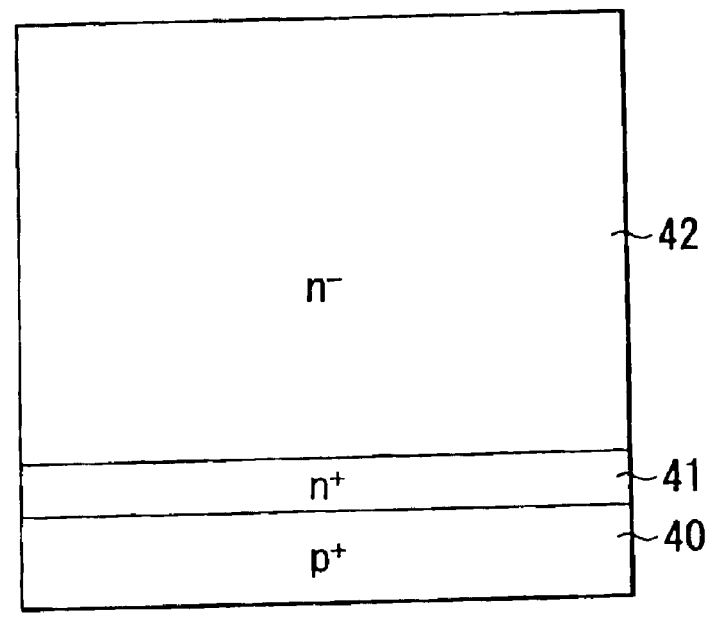
FIGS. 16A to 16F are cross sectional views collectively showing the fabricating process of a trench IGBT according to the fourth embodiment of the present invention.

In the first step, an $n^+$-type buffer layer 41 and an n-type base layer 42 are formed on a $p^+$-type silicon substrate 40 by epitaxial growth as shown in FIG. 16A.

Figure 16B:
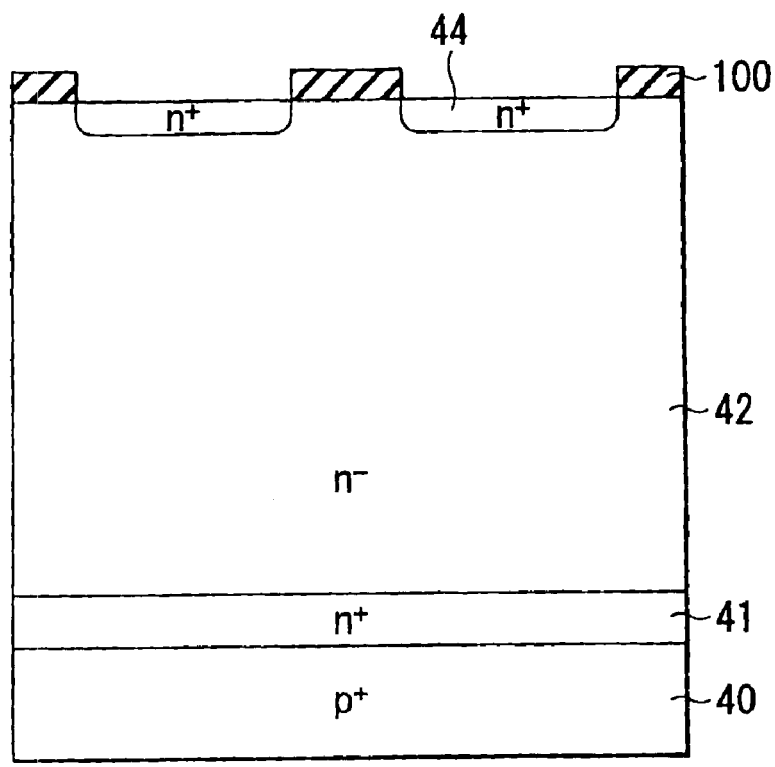
Figure 16C:
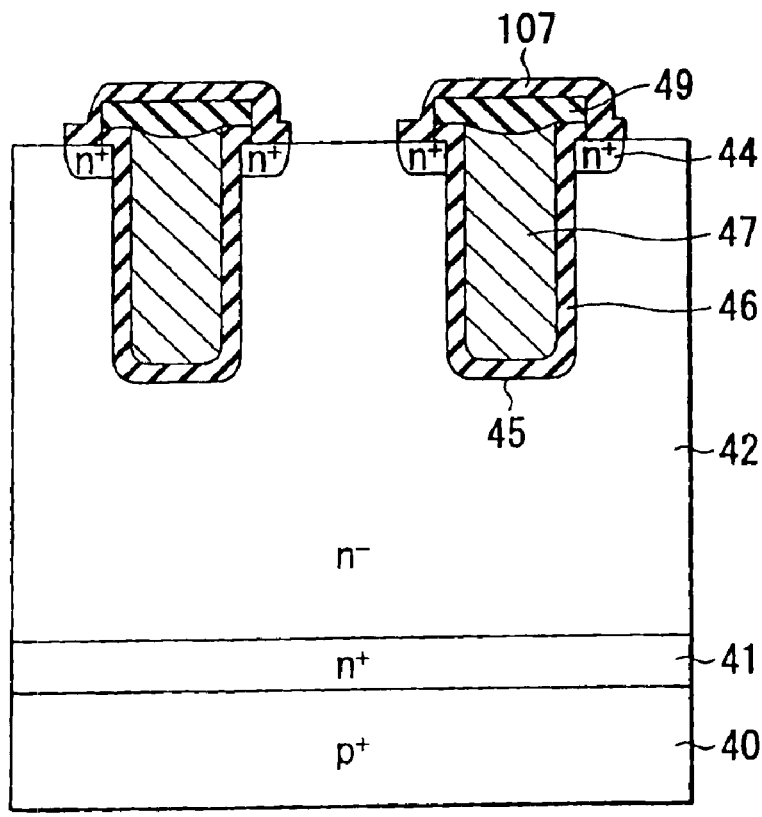

In the next step, the steps described previously in conjunction with FIGS. 15B and 15C relating to the third embodiment of the present invention are carried out. To be more specific, an $n^+$-type emitter layer 44 and a trench 45 extending through the $n^+$-type emitter layer 44 are formed, as shown in FIGS. 16B to 16C. Then, a thermal oxide film 46 is formed to cover the side wall of the trench 45 and the upper surfaces of the $n^+$-type emitter layer 44 and the $n^-$-type base layer 42, followed by burying a polysilicon layer 47 doped with an n-type impurity in the trench 45. Further, the polysilicon layer 47 is etched back to reach the open portion of the trench 45, and forms a pad (not shown) for the gate electrode contact, followed by forming an insulating film 49. Still further, the insulating film 49 and the oxide film 46 are patterned by etching, followed by forming an oxide pattern 107 on the surface.

Figure 16D:
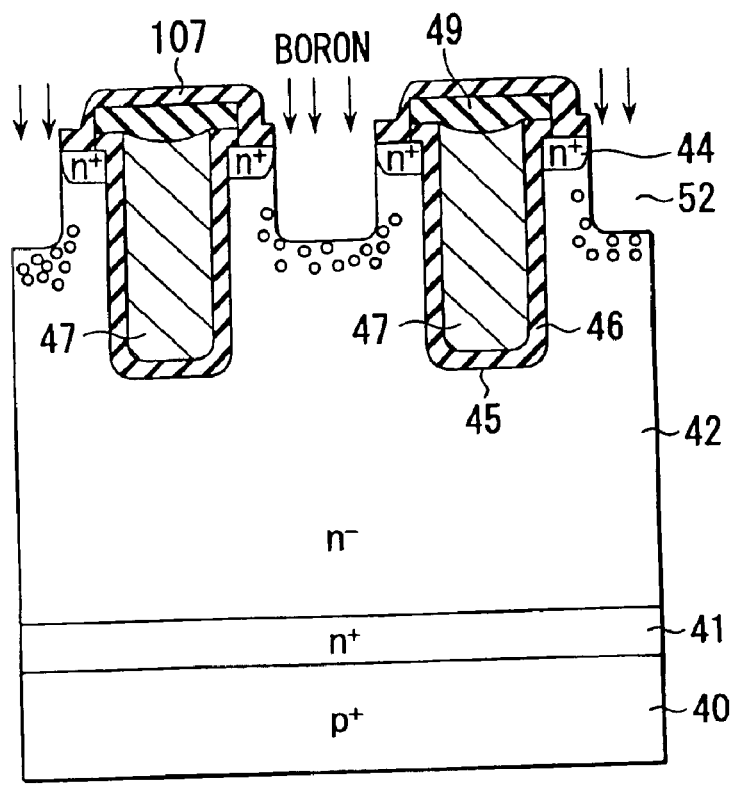

In the next step, a trench 42 having the bottom positioned within the $n^-$-type base layer 42 is formed by using the oxide pattern as a mask and, then, ions of a p-type impurity such as boron are implanted into the $n^-$-type base layer 42 through the trench 52, as shown in FIG. 16D.

Figure 16E:
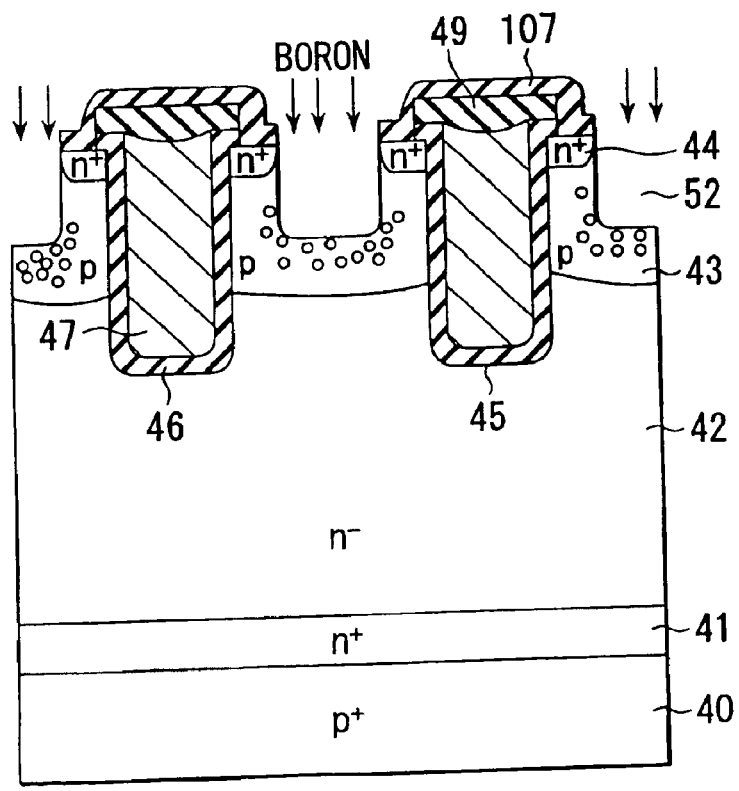
Figure 16F:
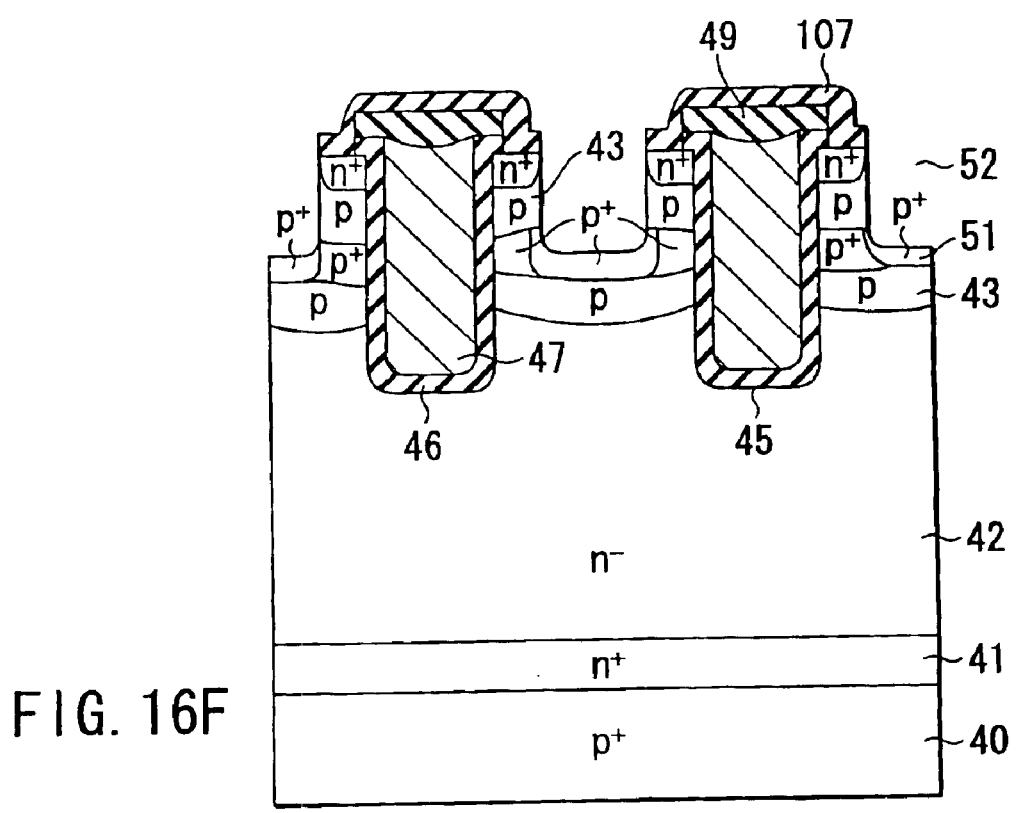

Further, a p-type base layer 43 is formed in the $n^-$-type base layer 42 by thermal diffusion, as shown in FIG. 16E. Then, a $p^+$-type base layer 51 is formed as shown in FIG. 16F by implanting ions of a p-type impurity such as boron into the p-type base layer 43 through the trench 52.

In the next step, the oxide pattern 107 is removed, followed by forming an Al—Si layer and subsequently patterning the Al—Si layer so as to form an emitter electrode and a gate electrode wiring (not shown), which are in contact with the p-type base layer 43, the $p^+$-type base layer 51 and the $n^+$-type emitter region 44. Further, a collector electrode (not shown) is formed on the back surface of the $p^+$-type silicon substrate 40.

The trench IGBT constructed as shown in FIG. 7 can be manufactured by the manufacturing process described above.

The method of manufacturing the power semiconductor element according to the fifth embodiment of the present invention will now be described with reference to FIGS. 17A to 17D, which are cross sectional views collectively showing the process of manufacturing the trench IGBT.

Figure 17A:
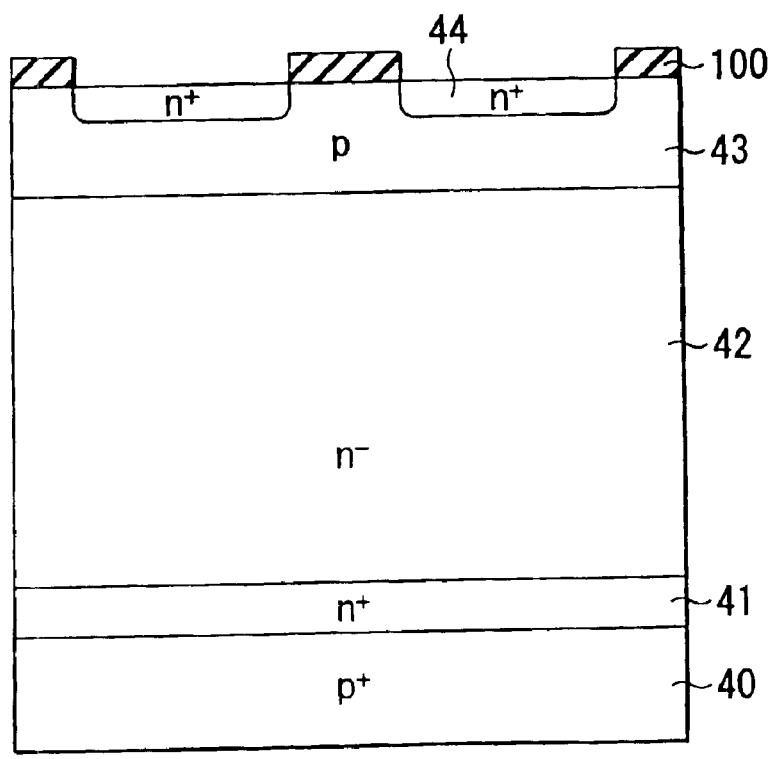
FIGS. 17A to 17D are cross sectional views collectively showing the fabricating process of a trench IGBT according to the fifth embodiment of the present invention.

First of all, the structure shown in FIG. 17A is prepared by the steps shown in FIGS. 15A and 15B relating to the manufacturing method according to the third embodiment of the present invention.

Figure 17B:
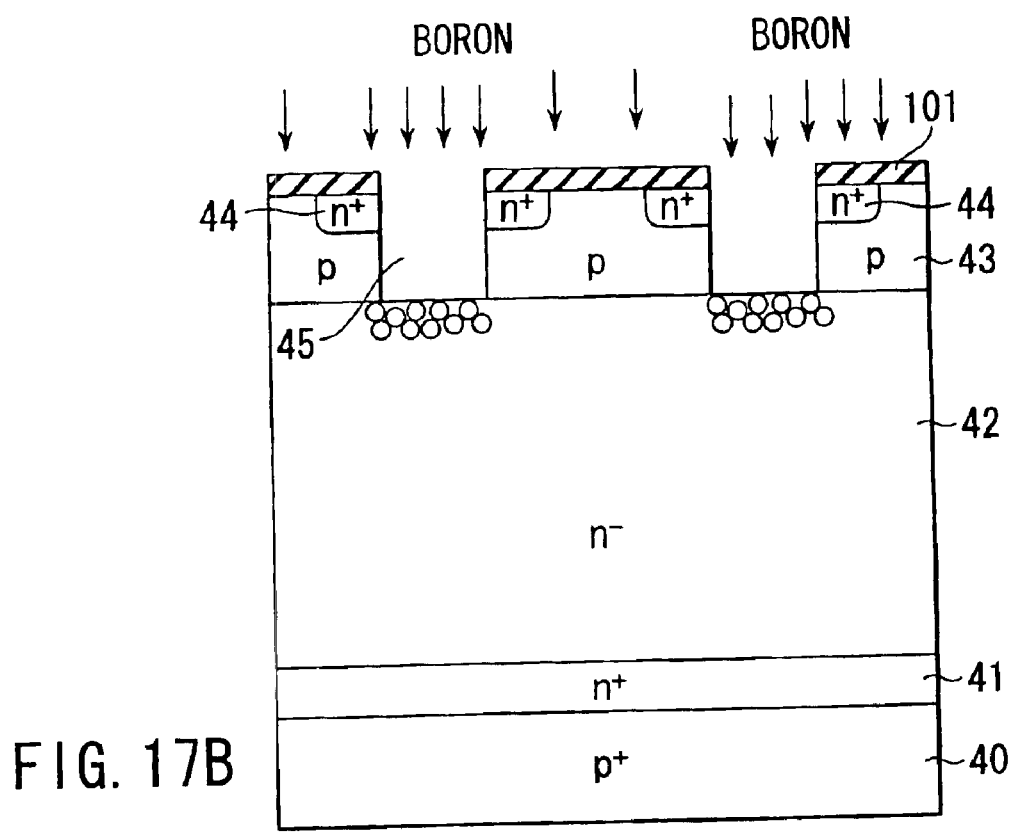
Figure 17C:
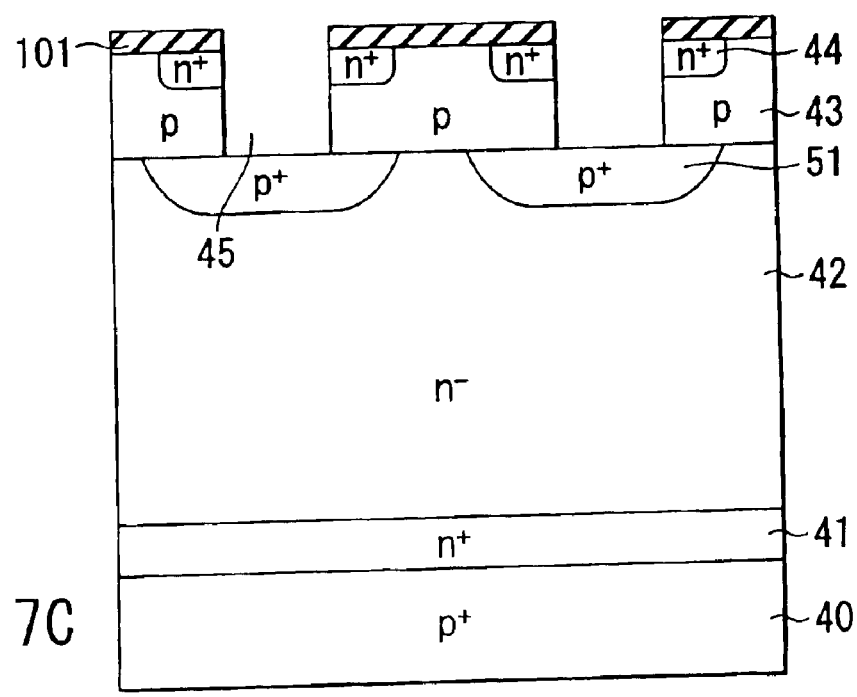
Figure 17D:
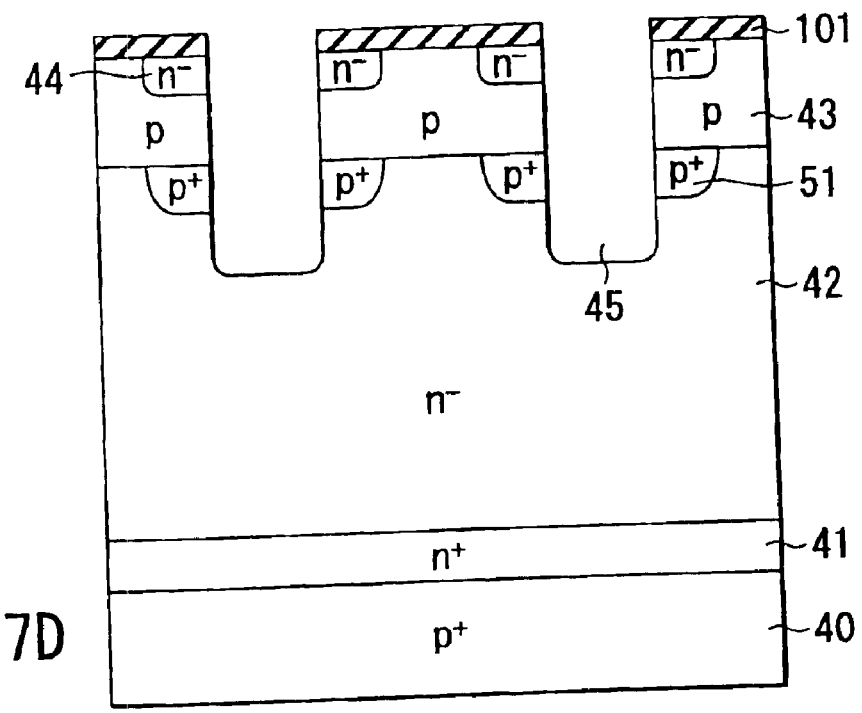

Then, a pattern of an oxide film 101 is formed, followed by forming a trench 45 extending to reach an $n^-$-type base layer 42 by using the pattern of the oxide film 101 as a mask and subsequently implanting ions of a p-type impurity such as boron into a bottom region of the trench 45, as shown in FIG. 17B. Then, a $p^+$-type base layer 51 is selectively formed in the surface region of the $n^-$-type base layer 42 by thermal diffusion, as shown in FIG. 17C.

In the next step, the trench 45 is further deepened to extend through the $p^+$-type base layer 51 so as to have the bottom of the trench 45 positioned within the $n^-$-type base layer 42.

Further, the manufacture of the trench IGBT is completed by the steps shown in FIGS. 13H to 13L relating to the manufacturing process according to the first embodiment of the present invention.

It is possible to manufacture the trench IGBT as shown in FIG. 5 by the manufacturing method described above.

The method of manufacturing the power semiconductor element according to the sixth embodiment of the present invention will now be described with reference to FIGS. 18A to 18D, which are cross sectional views collectively showing the manufacturing process of the trench IGBT.

Figure 18A:
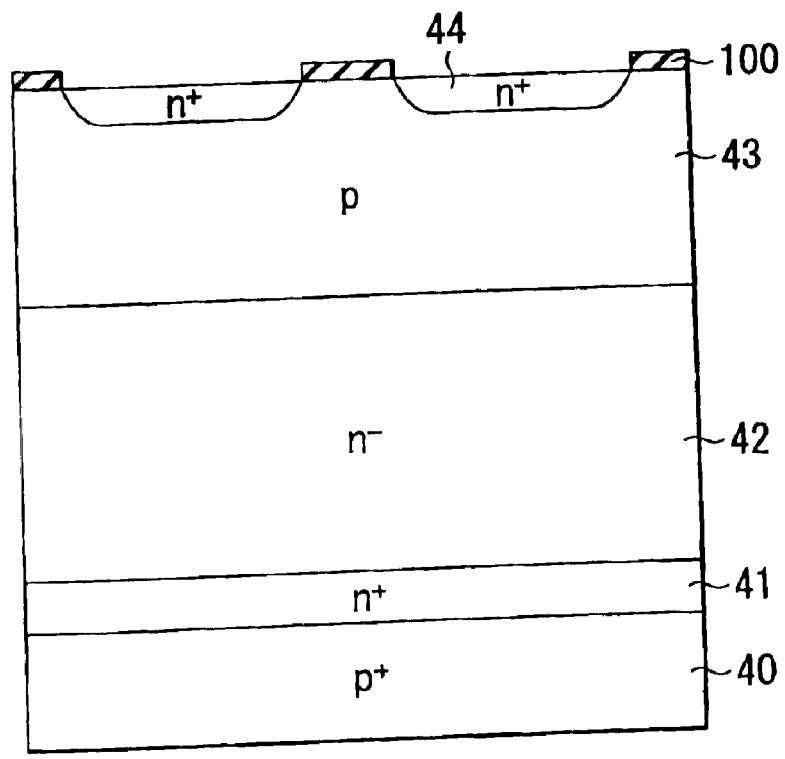
FIGS. 18A to 18D are cross sectional views collectively showing the fabricating process of a trench IGBT according to the sixth embodiment of the present invention.

First of all, the structure shown in FIG. 18A is prepared by the steps shown in FIGS. 15A and 15B relating to the manufacturing method according to the third embodiment of the present invention.

Figure 18B:
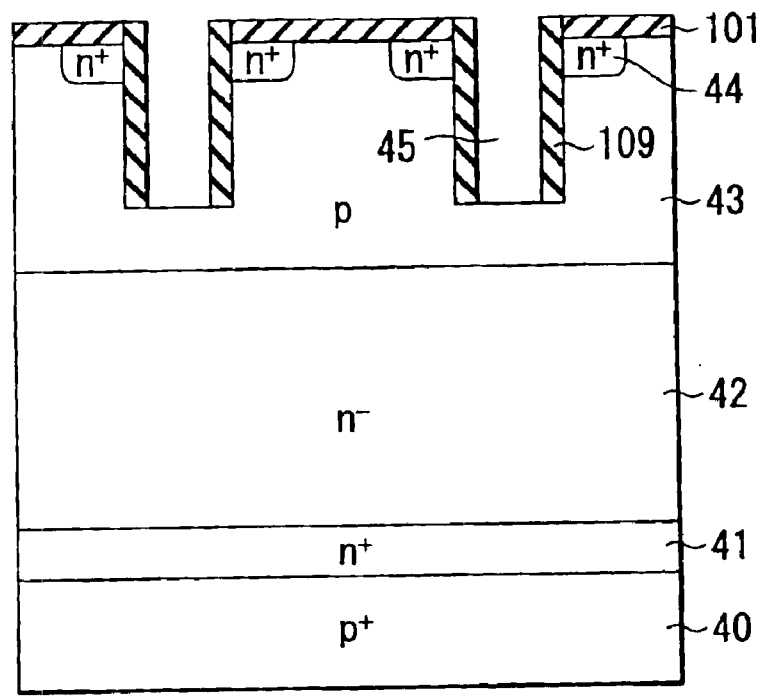

In the next step, an oxide film pattern 101 is formed on an emitter layer 44 and a p-type base layer 43, followed by forming a trench 45 in a manner to have the bottom thereof positioned within the p-type base layer 43 by using the oxide film pattern 101 as a mask, as shown in FIG. 18B. Then, an oxide film 109 is formed by oxidizing the side wall of the trench 45, followed by selectively removing the oxide film 109 positioned on the bottom of the trench 45 by, for example, RIE.

Figure 18C:
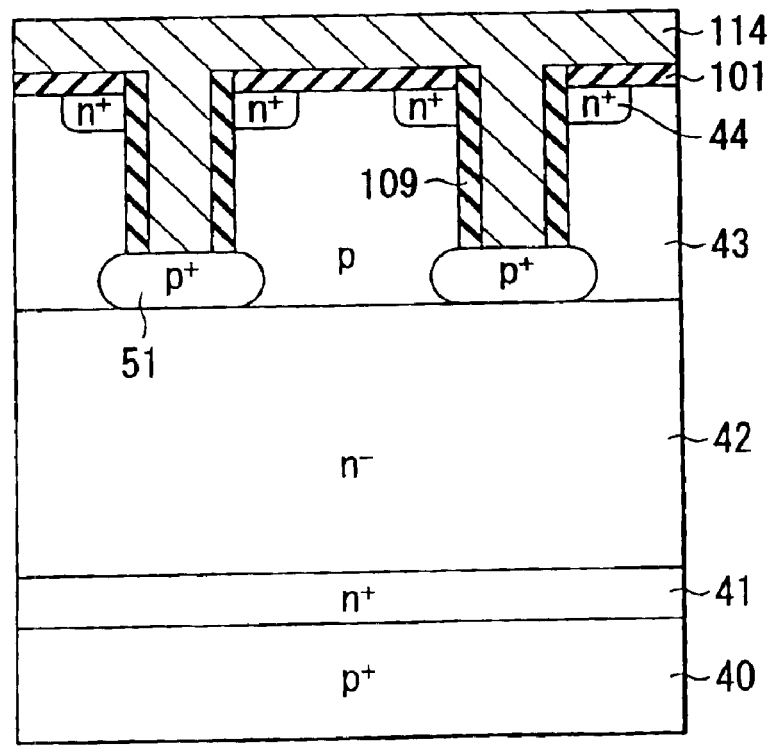

In the next step, a polysilicon layer 114 doped with a p-type impurity in a high concentration is buried in the trench 45, as shown in FIG. 18C, followed by applying a heat treatment. As a result, the p-type impurity is diffused from the polysilicon layer 114 into the p-type base layer 43 so as to form a $p^+$-type base layer 51 having a high impurity concentration.

Figure 18D:
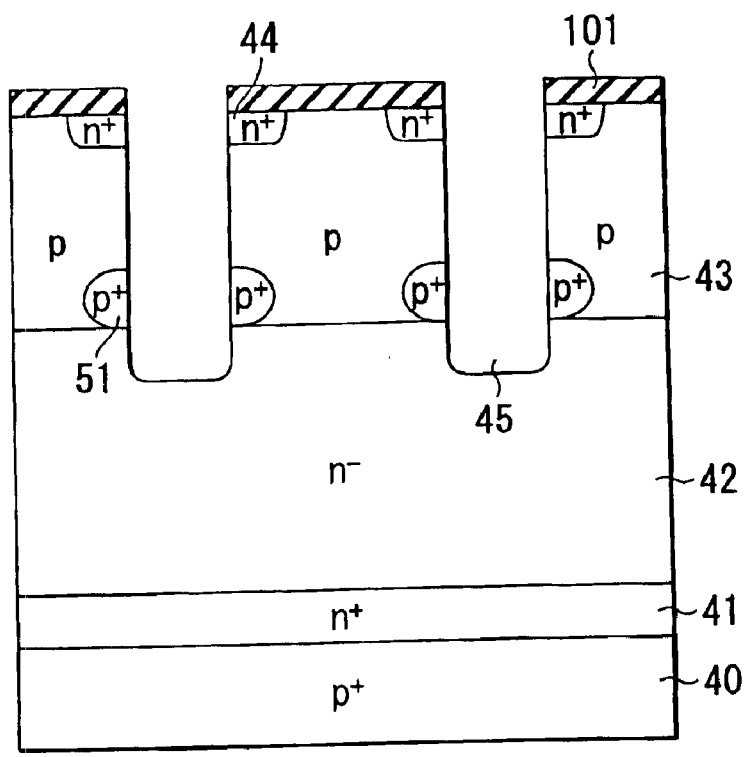

Then, the polysilicon layer 114 is removed by RIE, as shown in FIG. 18D. Then, the trench 45 having the bottom positioned within the p-type base layer 43 is deepened by RIE such that the bottom of the trench 45 is positioned within the $n^-$-type base layer 42.

Further, the manufacture of the trench IGBT is completed by the steps shown in FIGS. 13H to 13L relating to the manufacturing process according to the first embodiment of the present invention.

The trench IGBT as shown in FIG. 5 can be manufactured by the manufacturing method described above.

The method of manufacturing the power semiconductor element according to the seventh embodiment of the present invention will now be described with reference to FIGS. 19A to 19D, which are cross sectional views collectively showing the manufacturing process of the trench IGBT.

Figure 19A:
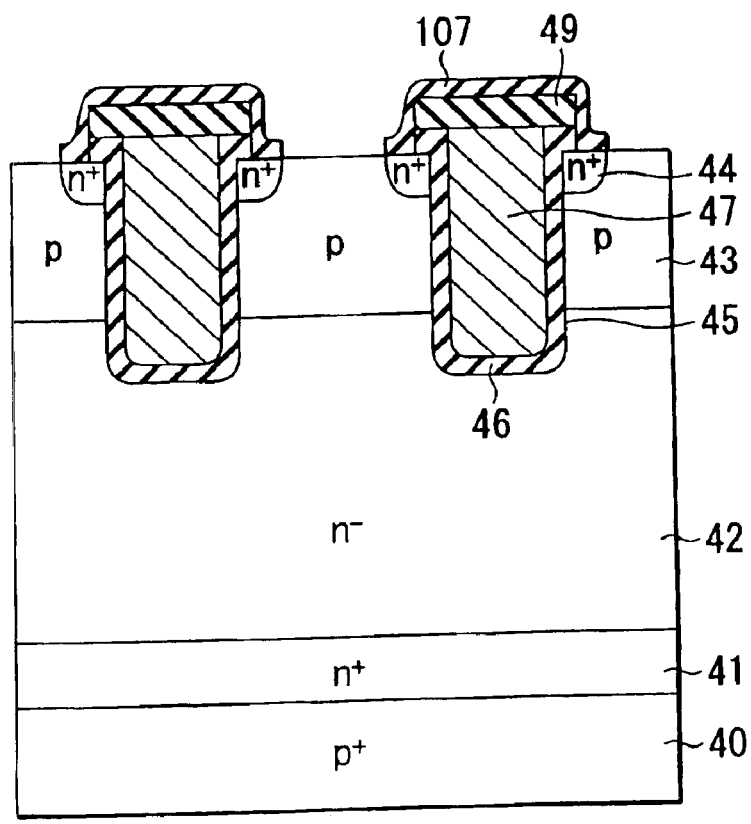
FIGS. 19A to 19D are cross sectional views collectively showing the fabricating process of a trench IGBT according to the seventh embodiment of the present invention.

First of all, the structure shown in FIG. 19A is prepared by the steps shown in FIGS. 16A and 16C relating to the manufacturing method according to the fourth embodiment of the present invention.

Figure 19B:
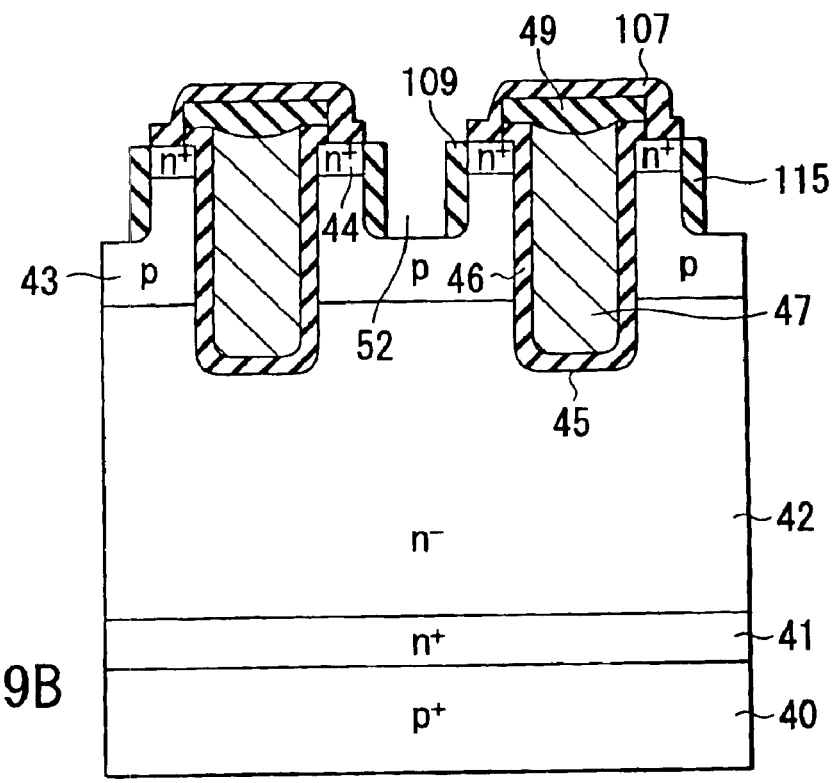
Figure 19C:
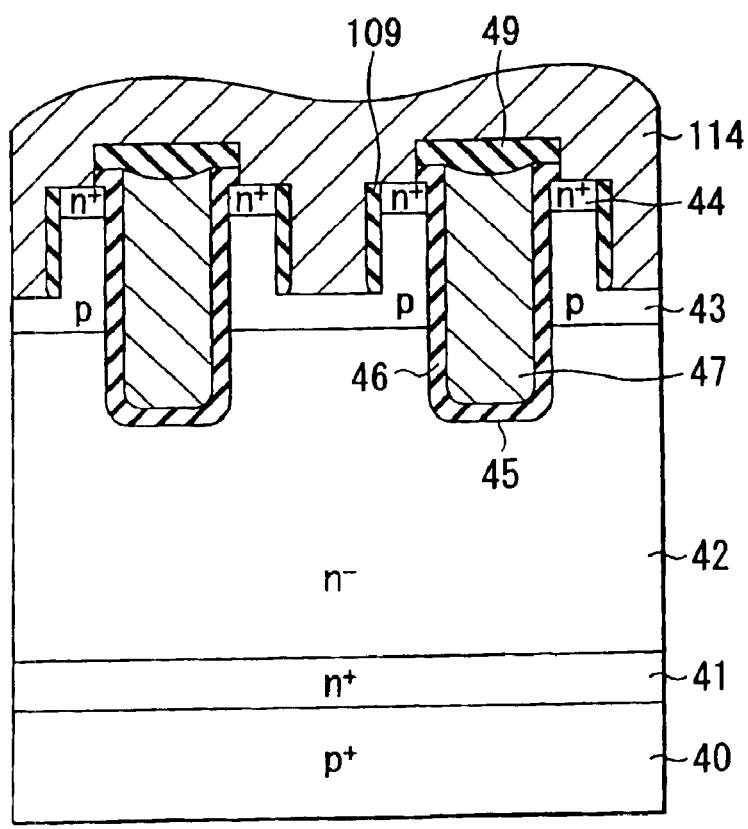

In the next step, a trench 45 is formed within a p-type base layer 52, followed by oxidizing the inner wall of the trench 52 so as to form an oxide film 109 and subsequently removing the oxide film 109 positioned on the bottom of the trench 52, as shown in FIG. 19B. Further, the oxide film pattern 107 is removed, followed by depositing a polysilicon layer 114 doped with a p-type impurity in a high concentration on the trench 52, the insulating film 49 and the emitter layer 44, as shown in FIG. 19C.

Figure 19D:
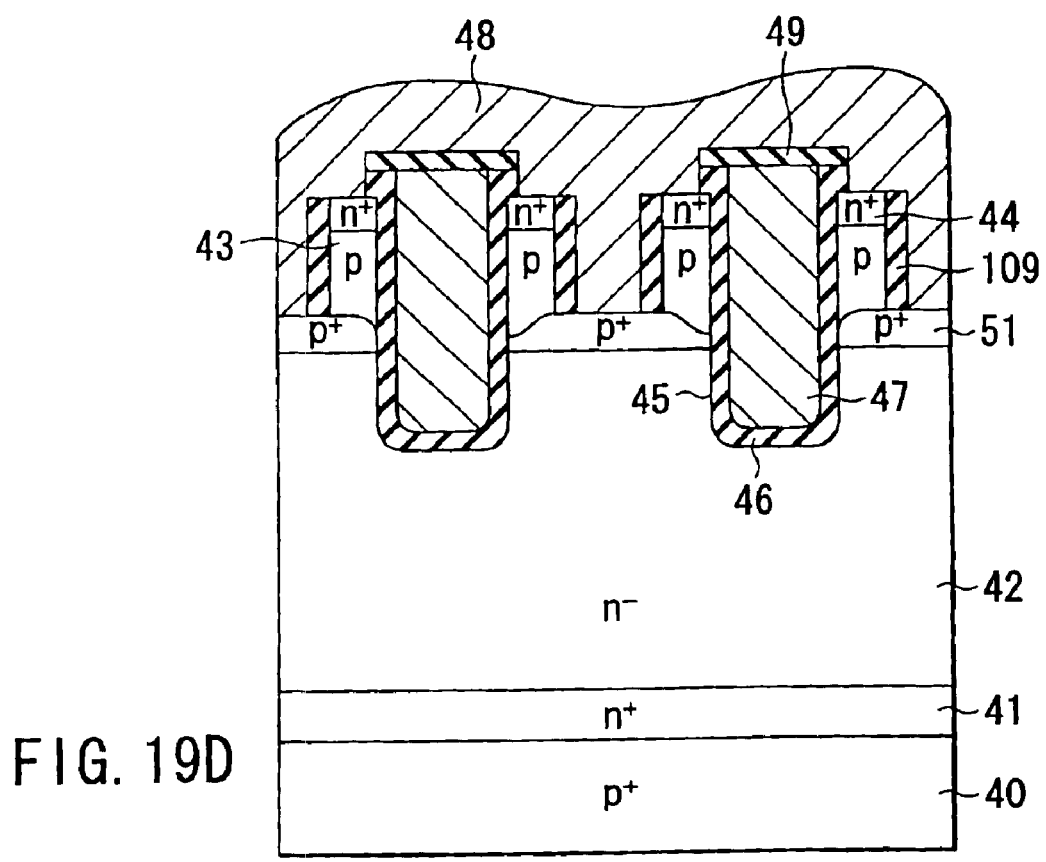

Then, a heat treatment is applied to diffuse the p-type impurity contained in the polysilicon layer 114 so as to form a $p^+$-type base layer 51 within the p-type base layer 43, as shown in FIG. 19D.

Further, the polysilicon layer 114 is removed by a dry etching method or a wet etching method, followed by forming simultaneously an emitter electrode 48 in contact with the p-type base layer 43, the $p^+$-type base layer 51 and the $n^+$-type emitter region 44 and a gate electrode wiring (not shown) in contact with the gate electrode 47. Also, a collector electrode is formed on the back surface of the $p^+$-type silicon substrate 40 so as to finish manufacturing the trench IGBT.

It is possible to manufacture the trench IGBT as shown in FIG. 7 by the manufacturing method described above.

The method of manufacturing the power semiconductor element according to the eighth embodiment of the present invention will now be described with reference to FIGS. 20A to 20D, which are cross sectional views collectively showing the manufacturing process of the trench IGBT.

Figure 20A:
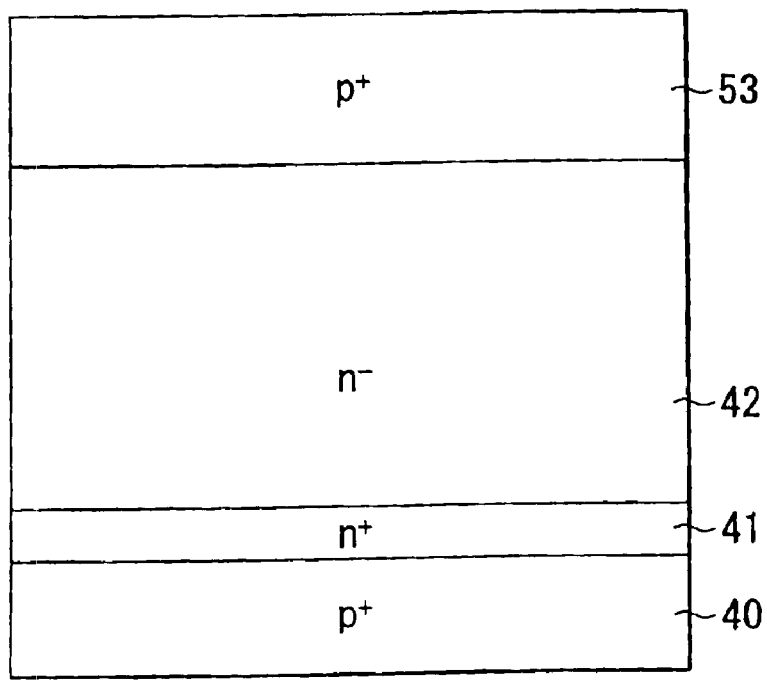
FIGS. 20A to 20D are cross sectional views collectively showing the fabricating process of a trench IGBT according to the eighth embodiment of the present invention.

In the first step, an $n^+$-type buffer layer 41 and an $n^-$-type base layer 42 are formed on a $p^+$-type silicon substrate 40 by the epitaxial growth, as shown in FIG. 20A. Then, a $p^+$-type base layer 53 having a high impurity concentration and a uniform impurity concentration distribution, i.e., the distribution of the impurity concentration being substantially free from dependence on the location, is formed by the epitaxial growth on the $n^-$-type base layer 42.

Figure 20B:
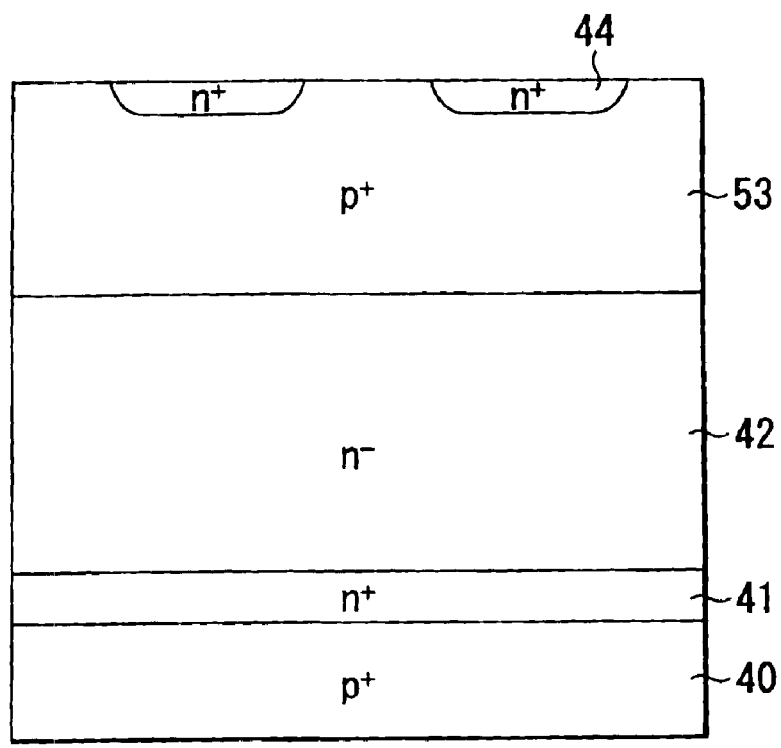

In the next step, ions of an n-type impurity such as phosphorus are implanted into the surface region of the $p^+$-type base layer 53, followed by applying a heat treatment so as to diffuse the n-type impurity, thereby forming an $n^+$-type emitter layer 44 in the surface region of the $p^+$-type base layer 53, as shown in FIG. 20B.

Figure 20C:
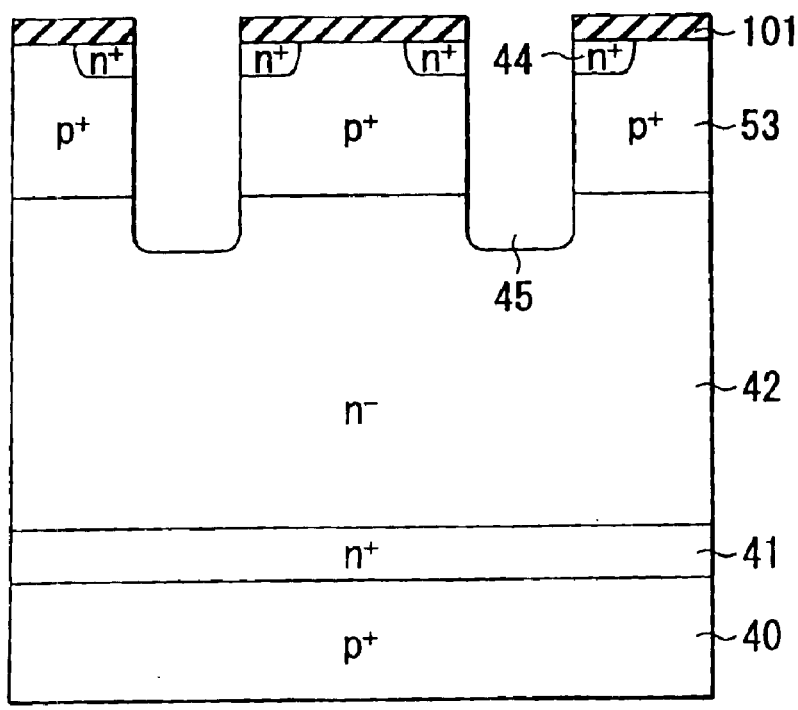
Figure 20D:
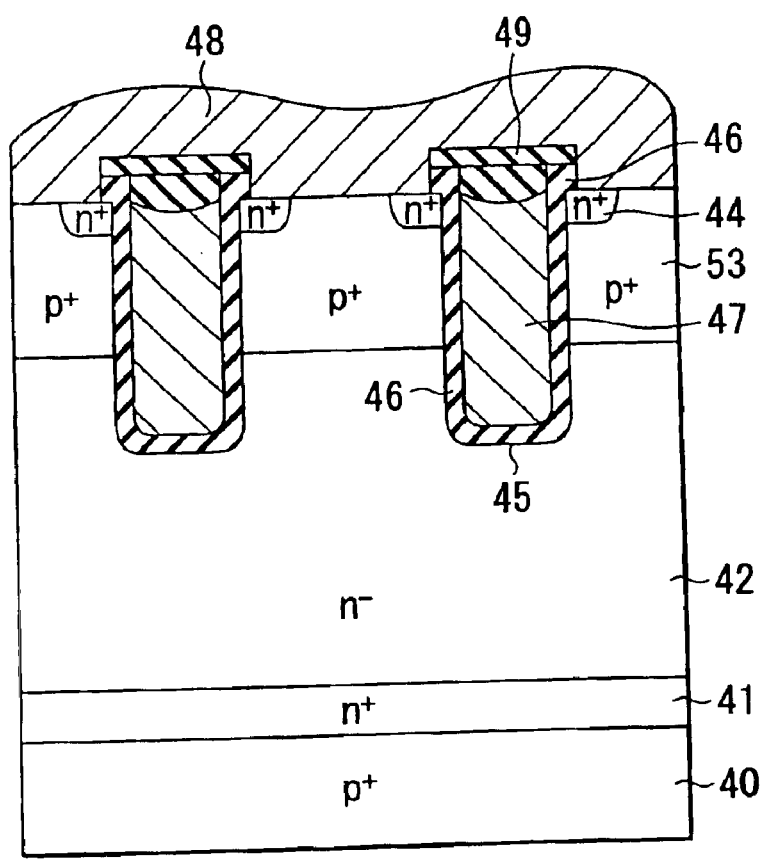

After formation of the $n^+$-type emitter layer 44, an oxide film 101 is formed as a shielding film on the $n^+$-type emitter layer 44, followed by forming a trench 45 extending from the surface of the emitter layer 44 to reach the $n^-$-type base layer 42 through the $p^+$-type base layer 53, as shown in FIG. 20C. Then, the oxide film 101 is removed by etching.

In the subsequent steps, a gate insulating film 46, a trench-gate electrode 47, an insulating film 49, and an emitter electrode 48 are formed by the steps shown in FIGS. 13H to 13L, which are included in the manufacturing method according to the first embodiment of the present invention, followed by forming a collector electrode on the back surface of the $p^+$-type silicon substrate 40, thereby completing the manufacture of a trench IGBT.

The trench IGBT constructed as shown in FIG. 8A can be manufactured by the manufacturing method described above.

The method of manufacturing the power semiconductor element according to the ninth embodiment of the present invention will now be described with reference to FIGS. 21A to 21D, which are cross sectional views collectively showing the manufacturing process of the trench IGBT.

Figure 21A:
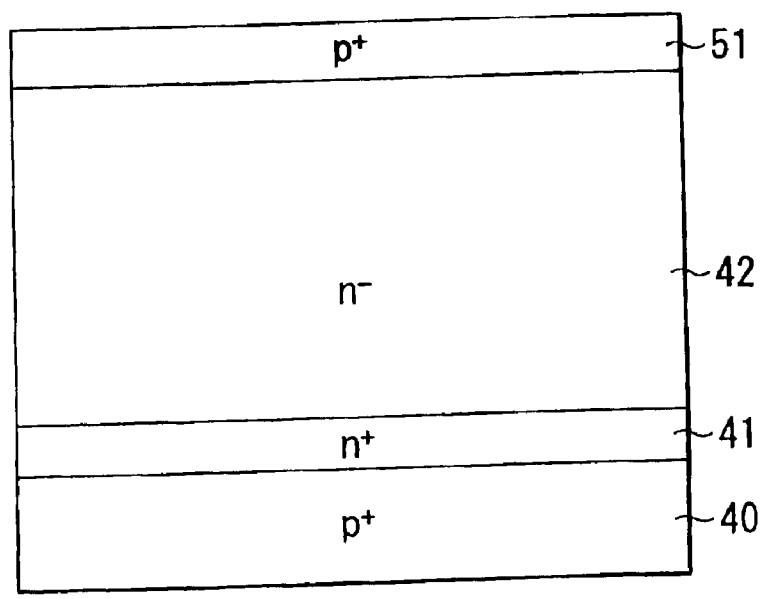
FIGS. 21A to 21D are cross sectional views collectively showing the fabricating process of a trench IGBT according to the ninth embodiment of the present invention.

In the first step, an $n^+$-type buffer layer 41 and an $n^-$-type base layer 42 are formed on a $p^+$-type silicon substrate 40 by the epitaxial growth, as shown in FIG. 21A. Then, a $p^+$-type base layer 51 having a high impurity concentration and a uniform impurity concentration distribution, i.e., the distribution of the impurity concentration being substantially free from dependence on the location, is formed by the epitaxial growth on the $n^-$-type base layer 42.

Figure 21B:
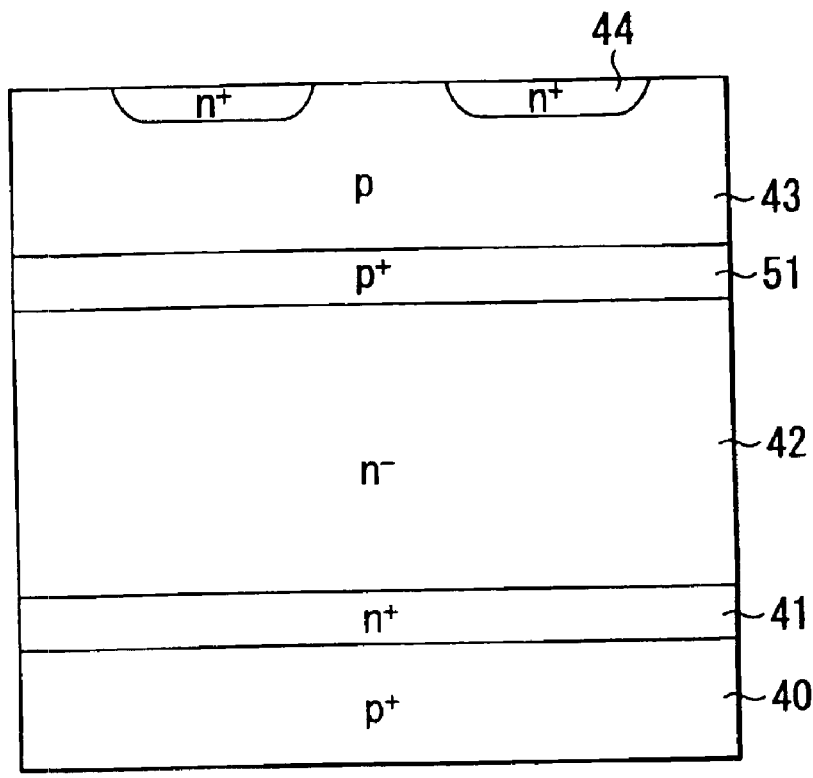

Further, a p-type base layer 43 is formed on the $p^+$-type base layer by the epitaxial growth method as shown in FIG. 21B. Ions of an n-type impurity such as phosphorus are implanted into the surface region of the p-type base layer 43, followed by applying a heat treatment so as to diffuse the n-type impurity and, thus, to form an $n^+$-type emitter layer 44 in the surface region of the p-type base layer 43.

Figure 21C:
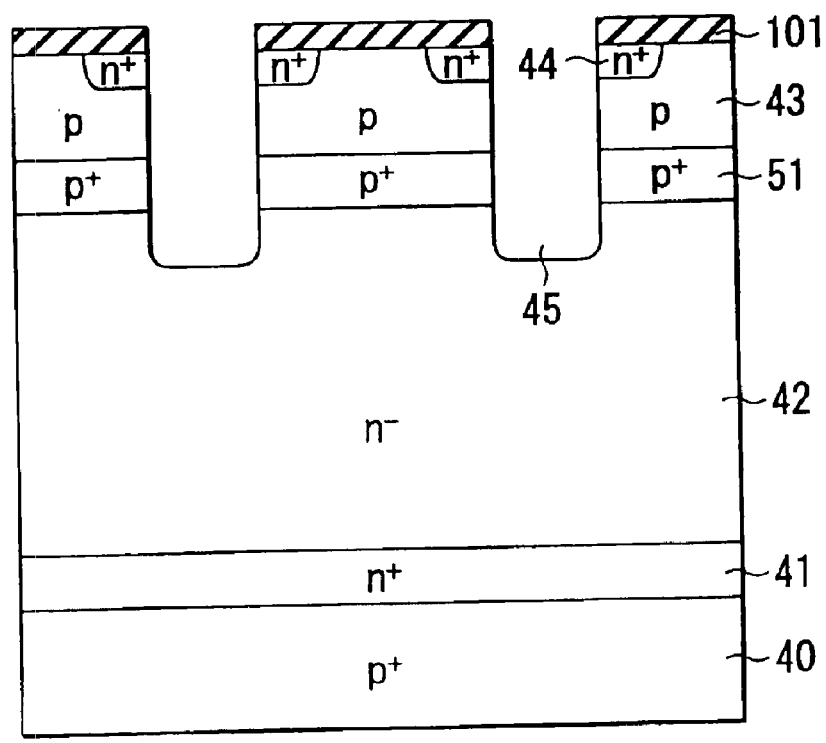
Figure 21D:
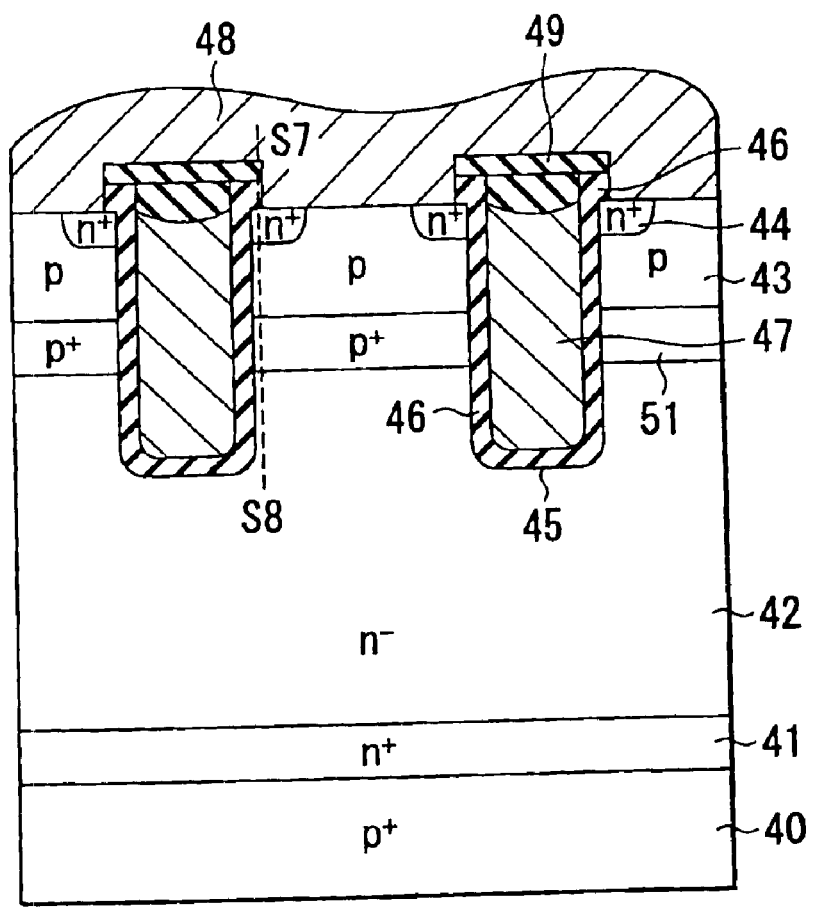

In the next step, an oxide film 101 acting as a shielding film is formed on the $n^+$-type emitter layer 44, followed by forming a trench 45 extending from the surface of the emitter layer 44 to reach the $n^-$-type base layer 42 through the p-type and $p^+$-type base layers 43 and 51, as shown in FIG. 21C, and subsequently removing the oxide film 101 by etching.

In the subsequent steps, a gate insulating film 46, a trench-gate electrode 47, an insulating film 49, and an emitter electrode 48 are formed by the steps shown in FIGS. 13H to 13L, which are included in the manufacturing method according to the first embodiment of the present invention, followed by forming a collector electrode on the back surface of the $p^+$-type silicon substrate 40, thereby completing the manufacture of a trench IGBT.

Figure 21E:
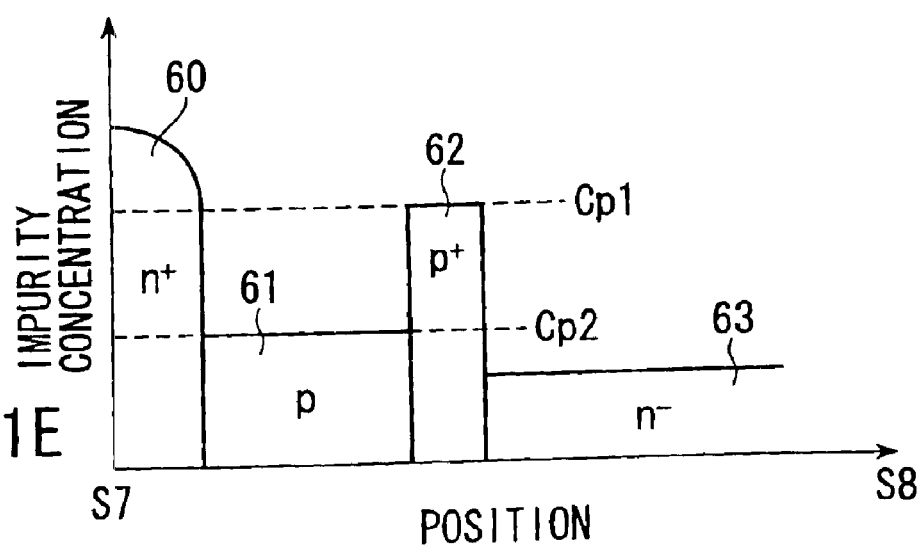
FIG. 21E is a diagram showing the impurity concentration profile in the depth direction along the line S7–S8 shown in FIG. 21D.

FIG. 21E is a graph showing the impurity concentration profile along the line S7–S8 shown in FIG. 21, which covers the region ranging between the $n^+$-type base region 44 and the $n^-$-type base layer 42. As apparent from the graph of FIG. 21E, it is possible to form the impurity concentration distribution in the p-type base layer such that the highest impurity concentration is formed in the junction with the $n^-$-type base layer in the manufacturing method according to the ninth embodiment of the present invention.

The manufacturing method of the power semiconductor element according to the tenth embodiment of the present invention will now be described with reference to FIGS. 22A to 22F. FIGS. 22A, 22B, 22D and 22E are cross sectional views collectively showing the manufacturing process of the trench IGBT. On the other hand, FIGS. 22C and 22F are graphs showing the impurity concentration profiles in the depth direction along the lines S5–S6 shown in FIGS. 22B and 22E, respectively.

Figure 22A:
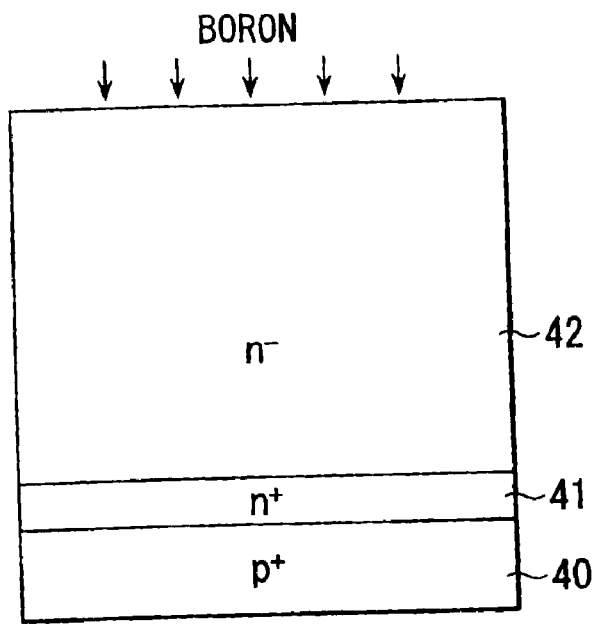
FIGS. 22A, 22B, 22D and 22E are cross sectional views collectively showing the fabricating process of a trench IGBT according to the tenth embodiment of the present invention.

In the first step, an $n^+$-type buffer layer 41 and an $n^-$-type base layer 42 are formed on a $p^+$-type silicon substrate 40 by the epitaxial growth, as shown in FIG. 22A. Then, ions of a p-type impurity such as boron are implanted with a low dose into the surface region of the $n^-$-type base layer 42, followed by performing a thermal diffusion so as to form a p-type base layer 43 in the surface region of the $n^-$-type base layer 42, as shown FIG. 22B.

Figure 22B:
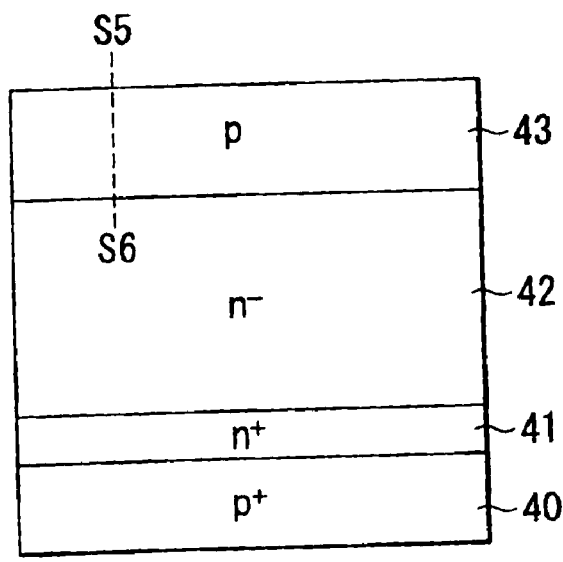
Figure 22C:
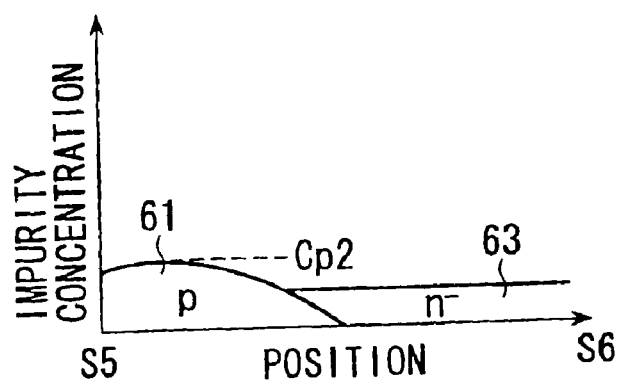
FIGS. 22C and 22F are diagrams showing the impurity concentration profiles in the depth direction along the lines S5–S6 shown in FIGS. 22B and 22E, respectively.

FIG. 22C shows an impurity concentration profile along the line S5–S6 shown in FIG. 22B, which covers the region ranging between the p-type base region 43 and the $n^-$-type base layer 42. The impurity concentration profile shown in FIG. 22C includes the p-type impurity concentration distribution 61 in the p-type base layer 43, and the n-type impurity concentration distribution 63 in the $n^-$-type base layer 42. The mark "Cp2" shown in FIG. 22C represents the highest p-type impurity concentration in the p-type base layer 43.

Figure 22D:
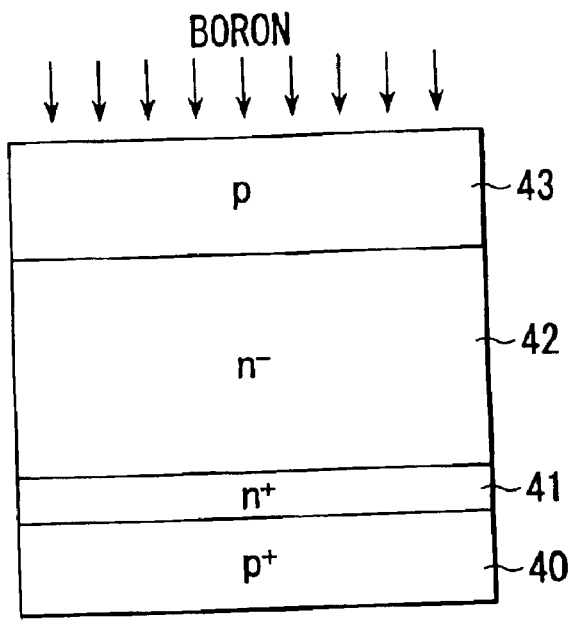

In the next step, ions of a p-type impurity such as boron are implanted into the surface region of the p-type base layer 43 at a dose that permits the MOSFET to exhibit a desired threshold value, as shown in FIG. 22D, followed by performing a thermal diffusion. As a result, a $p^+$-type base layer 51 is formed within the p-type base layer 43, as shown in FIG. 22F.

Figure 22E:
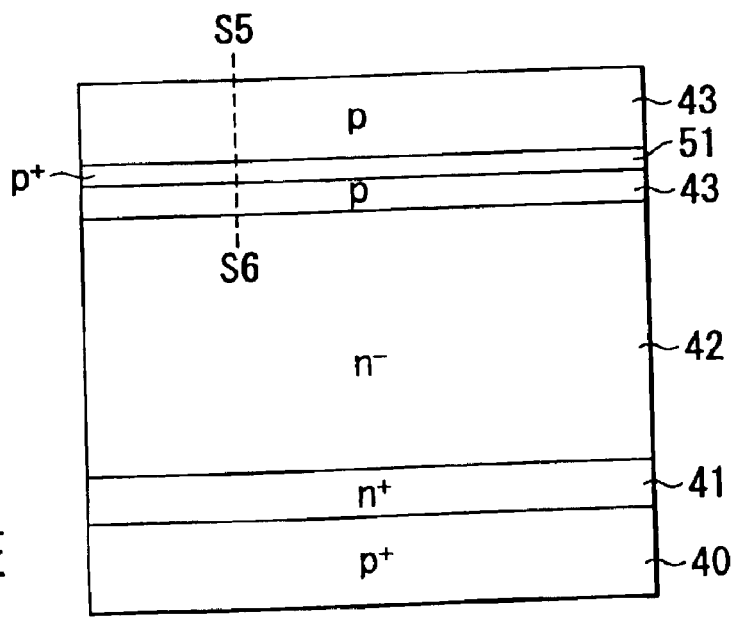
Figure 22F:
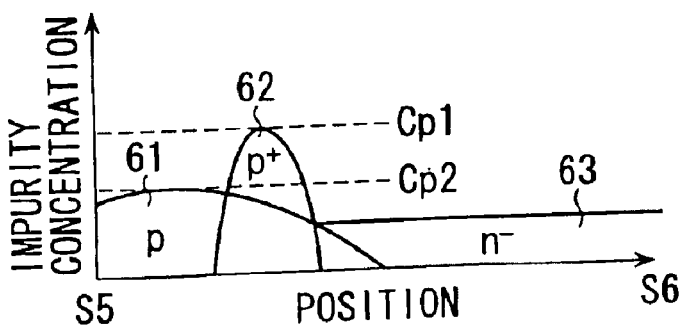

FIG. 22F shows an impurity concentration profile along the line S5–S6 shown in FIG. 22E, which covers the region ranging between the p-type base region 43 and the n⁻-type base layer 42. The impurity concentration profile shown in FIG. 22F includes the p-type impurity concentration distribution 61 in the p-type base layer 43, the p-type impurity concentration distribution 62 in the p⁺-type base layer 51, and the n-type impurity concentration distribution 63 in the n⁻-type base layer 42. The marks "Cp1" and "Cp2" shown in FIG. 22F represent the highest p-type impurity concentrations in the p-type base layer 43 and the p⁺-type base layer 51, respectively. As shown in the drawing, the highest concentration Cp1 of the p-type impurity in the p-type base regions (43, 51) is formed in the vicinity of the junction between the p⁺-type base layer 43 and the n⁻-type base region.

The accelerating energy in the second ion implantation is determined to permit the conductance g1 between the point Cp1 and the surface of the p-type base layer 43 to be not larger than the conductance g2 between the junction between the p-type base layer 43 and the n⁻-type base layer 42 and the point Cp1.

As apparent from Table 1 referred to previously in describing the power semiconductor element according to the second embodiment of the present invention, the present inventors have found that it is possible to obtain a desired short circuit withstand capability by setting the peak Cp1 of the impurity concentration distribution in the p⁺-type base layer 51 in a depth of at least 1 μm from the surface of the p-type base layer 43. In order to form the p⁺-type base layer 51 in this embodiment of the present invention in a depth of at least 1 μm, ions of a p-type impurity such as boron should be implanted under an accelerating energy of at least 500 keV.

In the subsequent steps, an n⁺-type emitter layer, a trench, a gate insulating film, a trench-gate electrode, an insulating film, and an emitter electrode are formed by the steps shown in FIGS. 13F to 13K, which are included in the manufacturing method according to the first embodiment of the present invention, followed by forming a collector electrode on the back surface of the p⁺-type silicon substrate 40, thereby completing the manufacture of a trench IGBT.

Needless to say, the manufacturing method of an IGBT according to any of the first to tenth embodiments described above can also be applied to the manufacture of a power MOSFET.

As described above, the saturation current value can be decreased in the embodiment of the present invention by controlling the pinch-off point in the channel region, making it possible to improve the short circuit withstand capability of the power semiconductor element.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor element, comprising:
   a first base layer of a first conductivity type;
   a second base layer of a second conductivity type formed selectively in one surface region of said first base layer;
   an emitter layer or a source layer of the first conductivity type formed selectively in a surface region of said second base layer;
   a gate electrode formed on said second base layer positioned between said emitter layer or source layer and said first base layer with a gate insulating film interposed between said gate electrode and said second base layer;
   a collector layer or a drain layer formed on the other surface region of said first base layer or formed selectively on one surface region of the first base layer;
   a first main electrode formed on said collector layer or on said drain layer;
   a second main electrode formed on said emitter layer or source layer and on said second base layer; and
   a channel region formed in contact with said gate insulating film to permit the carrier to migrate between said emitter layer or source layer and said first base layer, said channel region having an impurity concentration profile along the gate insulating film which is constant substantially between said emitter layer or source layer and said first base layer.

2. The semiconductor element according to claim 1, wherein said gate electrode is buried in a trench with a gate insulating film interposed between said gate electrode and said trench, said trench being formed to extend from the surface of said emitter layer or source layer to reach an intermediate portion of said first base layer through said second base layer.

3. The semiconductor element according to claim 1, wherein said gate electrode is formed on said gate insulating film formed on the surface of said second base layer.

4. The semiconductor element according to claim 1, wherein the impurity concentration of the channel region is higher than that of the second base layer.

5. The semiconductor element according to claim 1, wherein the impurity concentration of the channel region is higher than that of the second base layer.

6. A semiconductor element comprising;
   a first base layer of a first conductivity type;
   a second base layer of a second conductivity type formed selectively in one surface region of said first base layer;
   an emitter layer or a source layer of the first conductivity type formed selectively in a surface region of said second base layer;
   a gate electrode formed on said second base layer positioned between said emitter layer or source layer and said first base layer with a gate insulating film interposed between said gate electrode and said second base layer;
   a collector layer or a drain layer formed on the other surface region of said first base layer or formed selectively on one surface region of the first base layer;
   a first main electrode formed on said collector layer or on said drain layer;
   a second main electrode formed on said emitter layer or source layer and on said second base layer; and
   a channel region formed in contact with said gate insulating film to permit the carrier to migrate between said emitter layer or source layer and said first base layer, said channel region having an impurity concentration profile which is substantially constant in every region along the gate insulating film.

7. The semiconductor element according to claim 6, wherein said gate electrode is buried in a trench with a gate insulating film interposed between said gate electrode and said trench, said trench being formed to extend from the surface of said emitter layer or source layer to reach an intermediate portion of said first base layer through said second base layer.

8. The semiconductor element according to claim 6, wherein said gate electrode is formed on said gate insulating film formed on the surface of said second base layer.

9. A semiconductor element comprising:

a first base layer of a first conductivity type;

a second base layer of a second conductivity type formed selectively in one surface region of said first base layer;

an emitter layer or a source layer of the first conductivity type formed selectively in a surface region of said second base layer;

a gate electrode formed on said second base layer positioned between said emitter layer or source layer and said first base layer with a gate insulating film interposed between said gate electrode and said second base layer;

a collector layer or a drain layer formed on the other surface region of said first base layer or formed selectively on one surface region of the first base layer;

a first main electrode formed on said collector layer or on said drain layer;

a second main electrode formed on said emitter layer or source layer and on said second base layer; and a channel region formed in contact with said gate insulating film to permit the carrier to migrate between said emitter layer or source layer and said first base layer, said channel region having an impurity concentration along the gate insulating film which is constant substantially between a region adjacent to said second base layer and a region adjacent to said emitter layer or source layer.

10. The semiconductor element according to claim 9, wherein said gate electrode is buried in a trench with a gate insulating film interposed between said gate electrode and said trench, said trench being formed to extend from the surface of said emitter layer or source layer to reach an intermediate portion of said first base layer through said second base layer.

11. The semiconductor element according to claim 9, wherein said gate electrode is formed on said gate insulating film formed on the surface of said second base layer.

12. The semiconductor element according to claim 9, wherein the impurity concentration of the channel region is higher than that of the second base layer.

* * * * *